(12) United States Patent
Kim et al.

(10) Patent No.: US 7,881,408 B2
(45) Date of Patent: Feb. 1, 2011

(54) DIGITAL BROADCASTING SYSTEM AND METHOD OF PROCESSING DATA

(75) Inventors: Jong Moon Kim, Gyeonggi-do (KR); In Hwan Choi, Gyeonggi-do (KR); Kook Yeon Kwak, Gyeonggi-do (KR); Byoung Gill Kim, Seoul (KR); Won Gyu Song, Seoul (KR); Jin Woo Kim, Seoul (KR); Hyoung Gon Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 701 days.

(21) Appl. No.: 11/774,538

(22) Filed: Jul. 6, 2007

(65) Prior Publication Data

US 2008/0240297 A1 Oct. 2, 2008

Related U.S. Application Data

(60) Provisional application No. 60/908,630, filed on Mar. 28, 2007.

(30) Foreign Application Priority Data

Mar. 26, 2007 (KR) ...................... 10-2007-0029485

(51) Int. Cl.
- *H04L 27/00* (2006.01)
- *H04L 7/00* (2006.01)
- *H04N 5/455* (2006.01)
- *H04N 5/40* (2006.01)

(52) U.S. Cl. ........................ 375/326; 375/355; 348/724; 348/726

(58) Field of Classification Search ................. 375/240, 375/240.01, 240.18, 240.24, 260, 265, 321, 375/340, 341, 350, 229, 270, 295, 316, 326, 375/346, 371, 219, 355; 370/485, 486, 487; 348/14.02, 21, 607, 729, E5.077, 495, E5.108, 348/723–726; 386/46, 65–66, 71, 84–85, 386/88, 98; 714/755, 776, E11.001
See application file for complete search history.

(56) References Cited

U.S. PATENT DOCUMENTS 4,642,755 A 2/1987 Hinch (Continued)

FOREIGN PATENT DOCUMENTS

CA 2404404 3/2003

(Continued)

OTHER PUBLICATIONS

Yao, J.,"IP Datacasting and Channel Error Handling With DVB-H";Proceedings of the 2005 Emerging Information Technology Conference; XP-010856441; Aug. 15, 2005.

(Continued)

*Primary Examiner*—Tesfaldet Bocure
*Assistant Examiner*—Lawrence B Williams
(74) *Attorney, Agent, or Firm*—Lee, Hong, Degerman, Kang & Waimey

(57) ABSTRACT

A digital broadcast system is disclosed. The digital broadcast system including a transmitter, a receiver, and a method for transmitting and receiving a DTV signal comprising main service data and mobile service data multiplexed with the main service data. The DTV signal results from generating a second data by de-interleaving a first data group by a DTV transmitter.

14 Claims, 29 Drawing Sheets

U.S. PATENT DOCUMENTS

| | | | |
|---|---|---|---|
| 5,177,796 A | 1/1993 | Feig et al. | |
| 5,208,816 A | 5/1993 | Seshardi et al. | |
| 5,258,987 A | 11/1993 | Wei | |
| 5,301,167 A | 4/1994 | Proakis et al. | |
| 5,488,635 A | 1/1996 | Chennakeshu et al. | |
| 5,502,506 A | 3/1996 | Choi | |
| 5,508,752 A | 4/1996 | Kim et al. | |
| 5,511,096 A | 4/1996 | Huang et al. | |
| 5,602,593 A | 2/1997 | Katto | |
| 5,606,569 A | 2/1997 | Macdonald et al. | |
| 5,619,269 A | 4/1997 | Lee et al. | |
| 5,636,251 A | 6/1997 | Citta et al. | |
| 5,691,993 A | 11/1997 | Fredrickson | |
| 5,754,651 A | 5/1998 | Blatter et al. | |
| 5,757,416 A | 5/1998 | Birch et al. | |
| 5,771,239 A | 6/1998 | Moroney et al. | |
| 5,867,503 A | 2/1999 | Ohsuga et al. | |
| 5,903,324 A * | 5/1999 | Lyons et al. | 375/240.26 |
| 5,956,373 A | 9/1999 | Goldsten et al. | |
| 5,978,424 A | 11/1999 | Turner | |
| 6,005,894 A | 12/1999 | Kumar | |
| 6,021,421 A | 2/2000 | Retter et al. | |
| 6,049,651 A | 4/2000 | Oshima | |
| 6,075,569 A | 6/2000 | Lee et al. | |
| 6,124,898 A | 9/2000 | Patel et al. | |
| 6,212,659 B1 | 4/2001 | Zehavi | |
| 6,219,386 B1 | 4/2001 | Amrany et al. | |
| 6,226,380 B1 * | 5/2001 | Ding | 379/413.01 |
| 6,233,295 B1 | 5/2001 | Wang | |
| 6,243,469 B1 | 6/2001 | Kataoka et al. | |
| 6,272,660 B1 | 8/2001 | Chen et al. | |
| 6,289,485 B1 | 9/2001 | Shiomoto | |
| 6,334,187 B1 | 12/2001 | Kadono | |
| 6,339,618 B1 | 1/2002 | Puri et al. | |
| 6,356,598 B1 * | 3/2002 | Wang | 375/321 |
| 6,405,338 B1 | 6/2002 | Sinha et al. | |
| 6,411,253 B1 | 6/2002 | Cox et al. | |
| 6,446,234 B1 | 9/2002 | Cox et al. | |
| 6,456,611 B1 | 9/2002 | Hu et al. | |
| 6,459,741 B1 | 10/2002 | Grabb et al. | |
| 6,470,047 B1 | 10/2002 | Kleinerman et al. | |
| 6,490,007 B1 | 12/2002 | Bouillet et al. | |
| 6,498,936 B1 | 12/2002 | Raith | |
| 6,512,759 B1 | 1/2003 | Hashimoto et al. | |
| 6,515,713 B1 | 2/2003 | Nam | |
| 6,553,538 B2 | 4/2003 | Zehavi | |
| 6,573,947 B1 | 6/2003 | Oh | |
| 6,577,685 B1 * | 6/2003 | Bao et al. | 375/327 |
| 6,650,880 B1 | 11/2003 | Lee et al. | |
| 6,651,250 B1 | 11/2003 | Takai | |
| 6,665,308 B1 | 12/2003 | Rakib et al. | |
| 6,665,343 B1 | 12/2003 | Jahanghir et al. | |
| 6,671,002 B1 | 12/2003 | Konishi et al. | |
| 6,686,880 B1 | 2/2004 | Marko et al. | |
| 6,687,310 B1 | 2/2004 | Fimoff et al. | |
| 6,694,518 B1 | 2/2004 | Dulac | |
| 6,704,358 B1 | 3/2004 | Li et al. | |
| 6,731,700 B1 | 5/2004 | Yaknich et al. | |
| 6,734,920 B2 | 5/2004 | Ghosh et al. | |
| 6,738,949 B2 | 5/2004 | Senda et al. | |
| 6,744,474 B2 | 6/2004 | Markman | |
| 6,744,822 B1 | 6/2004 | Gaddam et al. | |
| 6,744,926 B1 | 6/2004 | Nishigaki | |
| 6,760,077 B2 | 7/2004 | Choi et al. | |
| 6,768,517 B2 | 7/2004 | Limberg et al. | |
| 6,775,334 B1 | 8/2004 | Liu et al. | |
| 6,803,970 B1 | 10/2004 | Limberg et al. | |
| 6,810,084 B1 | 10/2004 | Jun et al. | |
| 6,810,090 B1 | 10/2004 | Perlow | |
| 6,816,204 B2 | 11/2004 | Limberg | |
| 6,827,941 B1 | 12/2004 | Lüddecke et al. | |
| 6,842,875 B2 | 1/2005 | Kondo et al. | |
| 6,904,110 B2 | 6/2005 | Trans et al. | |
| 6,909,743 B1 | 6/2005 | Ward et al. | |
| 6,917,655 B2 | 7/2005 | Fimoff et al. | |
| 6,922,215 B2 | 7/2005 | Choi et al. | |
| 6,924,753 B2 | 8/2005 | Bretl et al. | |
| 6,925,126 B2 | 8/2005 | Lan et al. | |
| 6,927,708 B2 | 8/2005 | Fimoff | |
| 6,934,331 B2 | 8/2005 | Kamikura et al. | |
| 6,944,242 B2 | 9/2005 | Yaknich et al. | |
| 6,947,487 B2 | 9/2005 | Choi et al. | |
| 6,952,595 B2 | 10/2005 | Ikedo et al. | |
| 6,956,619 B2 | 10/2005 | Choi et al. | |
| 6,973,137 B2 | 12/2005 | Birru et al. | |
| 6,975,689 B1 | 12/2005 | McDonald et al. | |
| 6,977,914 B2 | 12/2005 | Paila et al. | |
| 6,977,977 B1 | 12/2005 | Dubrovin et al. | |
| 6,980,603 B2 | 12/2005 | Choi et al. | |
| 6,985,420 B2 | 1/2006 | Shishido | |
| 6,985,537 B1 | 1/2006 | Milbar | |
| 6,993,021 B1 | 1/2006 | Chuah et al. | |
| 6,993,062 B1 | 1/2006 | Kong et al. | |
| 6,996,133 B2 | 2/2006 | Bretl et al. | |
| 7,010,038 B2 | 3/2006 | Choi et al. | |
| 7,016,446 B1 | 3/2006 | Spalink | |
| 7,020,481 B2 | 3/2006 | Kivijarvi | |
| 7,030,935 B2 | 4/2006 | Choi et al. | |
| 7,038,732 B1 | 5/2006 | Limberg et al. | |
| 7,042,949 B1 | 5/2006 | Omura et al. | |
| 7,085,324 B2 | 8/2006 | Choi et al. | |
| 7,092,447 B2 | 8/2006 | Choi et al. | |
| 7,092,455 B2 | 8/2006 | Choi et al. | |
| 7,096,484 B2 | 8/2006 | Mao et al. | |
| 7,102,692 B1 | 9/2006 | Carlsgaard et al. | |
| 7,110,449 B2 | 9/2006 | Heo et al. | |
| 7,111,221 B2 | 9/2006 | Birru et al. | |
| 7,130,313 B2 | 10/2006 | Pekonen | |
| 7,148,932 B2 | 12/2006 | Choi et al. | |
| 7,151,575 B1 | 12/2006 | Landry et al. | |
| 7,170,849 B1 | 1/2007 | Arivoli et al. | |
| 7,194,047 B2 | 3/2007 | Strolle et al. | |
| 7,209,459 B2 | 4/2007 | Kangas | |
| 7,221,358 B2 | 5/2007 | Sasaki | |
| 7,343,487 B2 | 3/2008 | Lindqvist et al. | |
| 7,356,549 B1 | 4/2008 | Bruso et al. | |
| 7,376,186 B2 | 5/2008 | Boyce et al. | |
| 7,400,820 B2 | 7/2008 | Uchida et al. | |
| 7,440,516 B2 | 10/2008 | Kim et al. | |
| 7,450,613 B2 | 11/2008 | Choi et al. | |
| 7,454,683 B2 | 11/2008 | Vesma et al. | |
| 7,460,606 B2 | 12/2008 | Choi et al. | |
| 7,590,187 B2 | 9/2009 | Jeong et al. | |
| 7,593,474 B2 | 9/2009 | Jeong et al. | |
| 7,620,118 B2 * | 11/2009 | Choi | 375/301 |
| 7,634,006 B2 * | 12/2009 | Choi et al. | 375/240.1 |
| 7,653,143 B2 | 1/2010 | Kim et al. | |
| 7,675,994 B2 | 3/2010 | Gaddam et al. | |
| 7,698,621 B2 | 4/2010 | Choi et al. | |
| 7,705,920 B2 | 4/2010 | Lee et al. | |
| 7,733,426 B2 | 6/2010 | Lee et al. | |
| 7,733,819 B2 | 6/2010 | Lee et al. | |
| 7,733,820 B2 | 6/2010 | Choi et al. | |
| 7,779,337 B2 | 8/2010 | Song et al. | |
| 2001/0011213 A1 | 8/2001 | Hindie et al. | |
| 2001/0034867 A1 | 10/2001 | Jaffe et al. | |
| 2002/0046406 A1 | 4/2002 | Chelehmal et al. | |
| 2002/0051087 A1 * | 5/2002 | Limberg et al. | 348/611 |
| 2002/0080992 A1 | 6/2002 | Decker et al. | |
| 2002/0085632 A1 | 7/2002 | Choi et al. | |
| 2002/0089078 A1 | 7/2002 | Suzuki et al. | |
| 2002/0126222 A1 | 9/2002 | Choi et al. | |
| 2002/0136197 A1 | 9/2002 | Owen et al. | |
| 2002/0141440 A1 | 10/2002 | Stanley et al. | |

| Publication No. | Date | Inventor |
|---|---|---|
| 2002/0150167 A1 | 10/2002 | Demjanenko et al. |
| 2002/0150246 A1 | 10/2002 | Ogina |
| 2002/0154709 A1 | 10/2002 | Choi et al. |
| 2002/0159520 A1 | 10/2002 | Choi et al. |
| 2002/0172154 A1 | 11/2002 | Uchida et al. |
| 2002/0186780 A1 | 12/2002 | Choi et al. |
| 2002/0186790 A1 | 12/2002 | Choi et al. |
| 2002/0187767 A1 | 12/2002 | Meehan |
| 2002/0191716 A1 | 12/2002 | Xia et al. |
| 2002/0194570 A1 | 12/2002 | Birru et al. |
| 2003/0046431 A1 | 3/2003 | Belleguie |
| 2003/0067899 A9 | 4/2003 | Chen et al. |
| 2003/0093798 A1 | 5/2003 | Rogerson |
| 2003/0099303 A1 | 5/2003 | Birru et al. |
| 2003/0152107 A1 | 8/2003 | Pekonen |
| 2003/0206053 A1 | 11/2003 | Xia et al. |
| 2003/0223519 A1 | 12/2003 | Jeong et al. |
| 2003/0234890 A1 | 12/2003 | Bae et al. |
| 2004/0022278 A1 | 2/2004 | Thomas et al. |
| 2004/0028076 A1 | 2/2004 | Strolle et al. |
| 2004/0034491 A1 | 2/2004 | Kim |
| 2004/0061645 A1 | 4/2004 | Seo et al. |
| 2004/0071241 A1 | 4/2004 | Bouillet et al. |
| 2004/0090997 A1 | 5/2004 | Choi et al. |
| 2004/0100588 A1 | 5/2004 | Hartson et al. |
| 2004/0101046 A1 | 5/2004 | Yang et al. |
| 2004/0105507 A1 | 6/2004 | Chang et al. |
| 2004/0110522 A1 | 6/2004 | Howard et al. |
| 2004/0125235 A1 | 7/2004 | Kim et al. |
| 2004/0148642 A1 | 7/2004 | Park et al. |
| 2004/0156460 A1 | 8/2004 | Kim et al. |
| 2004/0181800 A1 | 9/2004 | Rakib et al. |
| 2004/0184547 A1 | 9/2004 | Choi et al. |
| 2004/0246373 A1 | 12/2004 | Kadono et al. |
| 2004/0260985 A1 | 12/2004 | Krieger |
| 2005/0013380 A1 | 1/2005 | Kim et al. |
| 2005/0024543 A1 | 2/2005 | Ramaswamy et al. |
| 2005/0031097 A1 | 2/2005 | Rabenko et al. |
| 2005/0049923 A1 | 3/2005 | Tanaka et al. |
| 2005/0090235 A1 | 4/2005 | Vermola et al. |
| 2005/0097428 A1 | 5/2005 | Chang et al. |
| 2005/0111586 A1 | 5/2005 | Kang et al. |
| 2005/0129132 A1 | 6/2005 | Choi et al. |
| 2005/0132413 A1 | 6/2005 | Barreyro et al. |
| 2005/0141606 A1 | 6/2005 | Choi et al. |
| 2005/0152446 A1* | 7/2005 | Choi et al. .................. 375/240 |
| 2005/0157758 A1 | 7/2005 | Yoo |
| 2005/0162886 A1 | 7/2005 | Jeong et al. |
| 2005/0172208 A1 | 8/2005 | Yoon |
| 2005/0175080 A1 | 8/2005 | Bouillett |
| 2005/0218237 A1 | 10/2005 | Laptstun et al. |
| 2005/0249300 A1 | 11/2005 | Jeong et al. |
| 2005/0271158 A1 | 12/2005 | Birru |
| 2006/0015914 A1 | 1/2006 | Lee |
| 2006/0029159 A1 | 2/2006 | Oh et al. |
| 2006/0039460 A1 | 2/2006 | Fimoff et al. |
| 2006/0039503 A1 | 2/2006 | Choi et al. |
| 2006/0052052 A1 | 3/2006 | Jung et al. |
| 2006/0053436 A1 | 3/2006 | Allwein et al. |
| 2006/0072623 A1 | 4/2006 | Park |
| 2006/0078003 A1 | 4/2006 | Watanabe et al. |
| 2006/0078071 A1* | 4/2006 | Lee .................. 375/326 |
| 2006/0078072 A1 | 4/2006 | Cheon et al. |
| 2006/0085726 A1 | 4/2006 | Rhee et al. |
| 2006/0104391 A1 | 5/2006 | Choi et al. |
| 2006/0126757 A1 | 6/2006 | Choi et al. |
| 2006/0130099 A1 | 6/2006 | Rooyen |
| 2006/0133429 A1 | 6/2006 | Seo et al. |
| 2006/0140301 A1 | 6/2006 | Choi et al. |
| 2006/0146797 A1 | 7/2006 | Lebizay |
| 2006/0146955 A1 | 7/2006 | Choi et al. |
| 2006/0159183 A1 | 7/2006 | Gaddam et al. |
| 2006/0203127 A1 | 9/2006 | Choi et al. |
| 2006/0203944 A1* | 9/2006 | Kwak et al. .................. 375/343 |
| 2006/0212910 A1 | 9/2006 | Endres et al. |
| 2006/0223461 A1 | 10/2006 | Laroia et al. |
| 2006/0245488 A1 | 11/2006 | Puputti et al. |
| 2006/0245505 A1 | 11/2006 | Limberg |
| 2006/0246836 A1 | 11/2006 | Simon |
| 2006/0248563 A1 | 11/2006 | Lee et al. |
| 2006/0253890 A9 | 11/2006 | Park et al. |
| 2006/0262227 A1 | 11/2006 | Jeong |
| 2006/0262744 A1 | 11/2006 | Xu et al. |
| 2006/0268673 A1 | 11/2006 | Roh et al. |
| 2006/0269012 A1 | 11/2006 | Kim et al. |
| 2006/0285608 A1 | 12/2006 | Kim et al. |
| 2007/0019579 A1 | 1/2007 | Xu et al. |
| 2007/0053606 A1 | 3/2007 | Ali |
| 2007/0071110 A1 | 3/2007 | Choi et al. |
| 2007/0092027 A1* | 4/2007 | Yu et al. .................. 375/295 |
| 2007/0092043 A1 | 4/2007 | Yu et al. |
| 2007/0094566 A1 | 4/2007 | Park et al. |
| 2007/0094567 A1 | 4/2007 | Park et al. |
| 2007/0113145 A1 | 5/2007 | Yu et al. |
| 2007/0121681 A1 | 5/2007 | Kang et al. |
| 2007/0127598 A1 | 6/2007 | Kang et al. |
| 2007/0130495 A1 | 6/2007 | Yoon et al. |
| 2007/0135166 A1 | 6/2007 | Ding et al. |
| 2007/0136643 A1 | 6/2007 | Kang et al. |
| 2007/0140368 A1 | 6/2007 | Kim et al. |
| 2007/0147432 A1* | 6/2007 | Kang et al. .................. 370/487 |
| 2007/0168844 A1 | 7/2007 | Jeong et al. |
| 2007/0172003 A1* | 7/2007 | Kim et al. .................. 375/326 |
| 2007/0195889 A1 | 8/2007 | Hong et al. |
| 2007/0201544 A1 | 8/2007 | Zhu et al. |
| 2007/0211769 A1 | 9/2007 | Lee et al. |
| 2007/0217499 A1* | 9/2007 | Limberg .................. 375/240 |
| 2007/0230607 A1 | 10/2007 | Yu et al. |
| 2007/0248055 A1 | 10/2007 | Jain et al. |
| 2007/0253502 A1 | 11/2007 | Park et al. |
| 2007/0268979 A1 | 11/2007 | Chang et al. |
| 2008/0008155 A1 | 1/2008 | Yoon et al. |
| 2008/0019466 A1 | 1/2008 | Limberg |
| 2008/0063089 A1 | 3/2008 | Chen |
| 2008/0069147 A1 | 3/2008 | Lee et al. |
| 2008/0095096 A1 | 4/2008 | Cho et al. |
| 2008/0112479 A1 | 5/2008 | Garmany et al. |
| 2008/0134007 A1 | 6/2008 | Lee et al. |
| 2008/0137525 A1 | 6/2008 | Liu |
| 2008/0151937 A1 | 6/2008 | Lee et al. |
| 2008/0152035 A1 | 6/2008 | Lee et al. |
| 2008/0159279 A1 | 7/2008 | Younis et al. |
| 2008/0170162 A1 | 7/2008 | Kim et al. |
| 2008/0239161 A1 | 10/2008 | Kim et al. |
| 2008/0240293 A1* | 10/2008 | Kim et al. .................. 375/316 |
| 2008/0267307 A1 | 10/2008 | Chang et al. |
| 2008/0273589 A1 | 11/2008 | Kim et al. |
| 2008/0279270 A1 | 11/2008 | Zeng |
| 2009/0028230 A1 | 1/2009 | Leitner |
| 2009/0034629 A1 | 2/2009 | Suh et al. |
| 2009/0037794 A1 | 2/2009 | Choi et al. |
| 2009/0059086 A1 | 3/2009 | Lee et al. |
| 2009/0060097 A1 | 3/2009 | Kim et al. |
| 2009/0077588 A1 | 3/2009 | Sugai |
| 2009/0111486 A1 | 4/2009 | Burstrom |
| 2009/0201997 A1 | 8/2009 | Kim et al. |
| 2009/0262799 A1 | 10/2009 | Limberg |
| 2010/0118206 A1 | 5/2010 | Gao et al. |
| 2010/0180294 A1 | 7/2010 | Yun et al. |

FOREIGN PATENT DOCUMENTS

| | | |
|---|---|---|
| CN | 1582580 | 2/2005 |
| EP | 0526833 | 2/1993 |
| EP | 1566905 | 8/2005 |
| EP | 1628420 | 2/2006 |

| | | |
|---|---|---|
| JP | 2000224136 | 8/2000 |
| JP | 2001274769 | 10/2001 |
| JP | 2002218339 | 8/2002 |
| JP | 2003032640 | 1/2003 |
| JP | 2003209525 | 7/2003 |
| JP | 2003284037 | 10/2003 |
| JP | 2004129126 | 4/2004 |
| JP | 2006148543 | 6/2006 |
| JP | 2007096403 | 4/2007 |
| KR | 1020000040481 | 7/2000 |
| KR | 1020030026236 | 3/2003 |
| KR | 1020030037138 | 5/2003 |
| KR | 1020050065898 | 12/2003 |
| KR | 20040032283 | 4/2004 |
| KR | 1020060095235 | 2/2005 |
| KR | 1020050093921 | 9/2005 |
| KR | 1020070034215 | 9/2005 |
| KR | 10-2005-0097438 | 10/2005 |
| KR | 1020070068960 | 12/2005 |
| KR | 1020060009737 | 2/2006 |
| KR | 1020060012510 | 2/2006 |
| KR | 1020060039728 | 5/2006 |
| KR | 20060068989 | 6/2006 |
| KR | 1020060063867 | 6/2006 |
| KR | 1020060065435 | 6/2006 |
| KR | 1020060070665 | 6/2006 |
| KR | 1020060072573 | 6/2006 |
| KR | 1020060095126 | 8/2006 |
| KR | 1020060102160 | 9/2006 |
| KR | 1020060117484 | 11/2006 |
| KR | 1020060133011 | 12/2006 |
| KR | 1020070007995 | 1/2007 |
| WO | 99/21323 | 4/1999 |
| WO | 02/37744 | 5/2002 |
| WO | WO03/092197 | 11/2003 |
| WO | WO2005/109878 | 11/2005 |
| WO | 2006003531 | 1/2006 |
| WO | 2006/093389 | 9/2006 |
| WO | WO2006/126805 | 11/2006 |
| WO | 2007/008028 | 1/2007 |
| WO | 2007/091779 | 8/2007 |
| WO | 2008105587 | 9/2008 |

OTHER PUBLICATIONS

Kim, Sung-Noon, et al.; "Enhanced-x VSB System Development for Improving ATSC Terrestrial DTV Transmission Standard"; IEEE Transactions on Broadcasting, vol. 52, No. 2, Jun. 2006.

Touzni, A, et al. "Enhanced 8-VSB Transmission for North-American HDTV Terrestrial Broadcast"; Proceedings of the 2003 IEEE International Conference on Acoustics, Speech and Signal Processing; vol. 2; pp. 437-440. XP010640975; Apr. 6, 2003.

Gaddam, V. R., et al., "A Newly Proposed ATSC DTV System for Transmitting a Robust Bit-Stream Along With the Standard Bit-Stream", IEEE Transactions on Consumer Electronics, XP001201224; vol. 49; Issue 4; Nov. 2003.

Chernock, Rich; "PSIP Generation and ATSC Stream Monitoring"; Triveni Digital, Oct. 8, 2004.

Advanced Television Systems Commitee; "Recommended practice: Guide to the Use of the ATSC Digital Television Standard, Including Corrigendum No. 1"; Doc A/54A; Dec. 4, 2003.

Digital Video Broadcasting (DVB); DVB-H Implementation Guidelines; ETSI TR 102 377 v1.2.1 (Nov. 2005).

ISO/IEC: "Information Technology—Generic Coding of Moving Pictures and Associated Audio Information Systems"; ISO/IEC 13818-1: International Standard; Second Edition; Dec. 1, 2000.

Federal Information Processing Standards Publication 197; Announcing the Advanced Encryption Standard (AES); Nov. 26, 2001.

Advanced Television Systems Committee; "ATSC Recommended Practice: E-VSB Implementation Guidelines"; Doc A/112, Apr. 18, 2006.

Graell, A. et al., "Analysis and Design of Rate Compatible Serial Concatenated Convolutional Codes"; Proceedings of the 2005 International Symposium on Information Theory; pp. 607-611; Sep. 4, 2005.

Digital Video Broadcasting; DVB-H Implementation Guidelines; DVB Document A092; Rev. 02; May 2007.

European Telecommunication Standard Series; Radio Broadcasting Systems; Digital Audio Broadcasting (DAB) to Mobile, Portable and Fixed Receivers; ETSI EN 300 401; V1.4.1; (Jun. 2006).

Fimoff, M., et al.; "E-VSB Map Signaling", IEEE Transactions on Consumer Electronics; vol. 49; Issue 3; pp. 515-518; Aug. 2003.

Uehara, M., et al.; "Transmission Scheme For The Terrestrial ISDB System"; IEEE Transactions on Consumer Electronics; vol. 45; Issue 1; Feb. 1999.

Advanced Television Systems Committee; "ATSC Standard: Digital Television Standard (A/53), Revision D, Including Amendment No. 1", DocA/53D; Jul. 19, 2005.

Meyers, et al.; "Joint Carrier Phase and Symbol Timing Recovery for PAM Systems"; IEEE Transactions on Communications; vol. COM-28; No. 8; pp. 1121-1129; Aug. 1, 1980; XP000758588.

Hopkins, R., "Digital Terrestrial HDTV for North America - The Grand Alliance HDTV System," European Broadcasting Union (EBU) Review Technical, XP-000438385, pp. 36-50, Aug. 1994.

* cited by examiner

Main Service Data

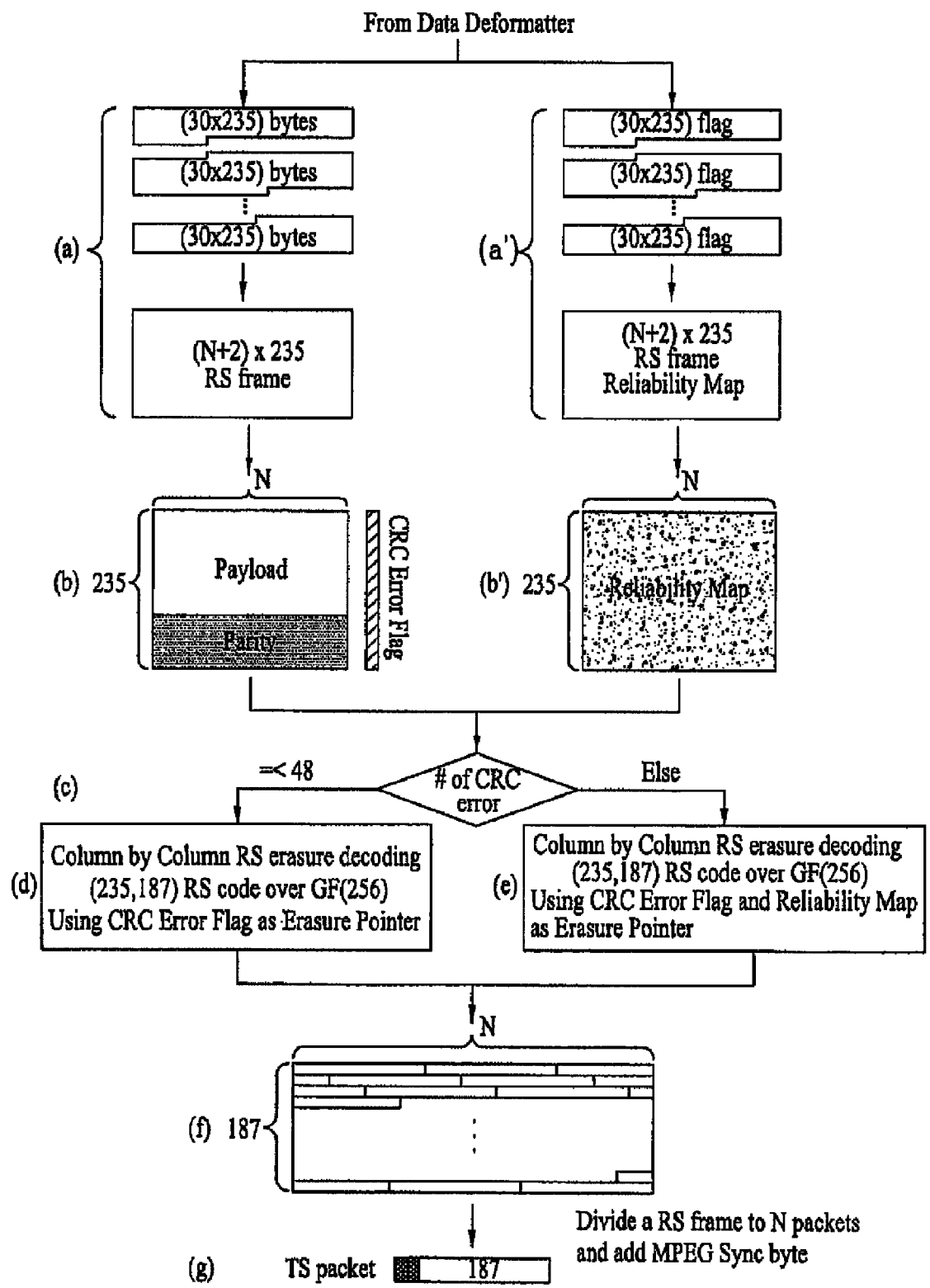

DIGITAL BROADCASTING SYSTEM AND METHOD OF PROCESSING DATA

This application claims the benefit of the Korean Patent Application No. 10-2007-0029485, filed on Mar. 26, 2007, which is hereby incorporated by reference as if fully set forth herein. Also, this application claims the benefit of U.S. Provisional Application No. 60/908,630, filed on Mar. 28, 2007, which is hereby incorporated by reference.

BACKGROUND OF THE INVENTION

1. Field of the Invention

The present invention relates to a digital broadcasting system and method of processing data.

2. Discussion of the Related Art

The Vestigial Sideband (VSB) transmission mode, which is adopted as the standard for digital broadcasting in North America and the Republic of Korea, is a system using a single carrier method. Therefore, the receiving performance of the digital broadcast receiving system may be deteriorated in a poor channel environment. Particularly, since resistance to changes in channels and noise is more highly required when using portable and/or mobile broadcast receivers, the receiving performance may be even more deteriorated when transmitting mobile service data by the VSB transmission mode.

SUMMARY OF THE INVENTION

Accordingly, the present invention is directed to a digital broadcasting system and a method of processing data that substantially obviate one or more problems due to limitations and disadvantages of the related art.

An object of the present invention is to provide a digital broadcasting system and a method of processing data that are highly resistant to channel changes and noise.

Another object of the present invention is to provide a digital broadcasting system and a method of processing data that can enhance the receiving performance of a digital broadcast receiving system by performing additional encoding on mobile service data and by transmitting the processed data to the receiving system.

A further object of the present invention is to provide a digital broadcasting system and a method of processing data that can also enhance the receiving performance of a digital broadcast receiving system by inserting known data already known in accordance with a pre-agreement between the receiving system and the transmitting system in a predetermined area within a data area.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital broadcast transmitting system includes a service multiplexer and a transmitter. The service multiplexer multiplexes mobile service data and main service data at pre-determined data rates and, then, transmits the multiplexed service data to the transmitter. The transmitter performs additional encoding on the mobile service data transmitted from the service multiplexer and, also, groups a plurality of mobile service data packets having encoding performed thereon so as to configure a data group.

Herein, the transmitter may multiplex a mobile service data packet including the mobile service data and a main service data packet including the main service data in packet units and may transmit the multiplexed data packets to a digital broadcast receiving system. Herein, the transmitter may multiplex the data group and the main service data packet in a burst structure, wherein the burst section may be divided in a burst-on section including the data group, and a burst-off section that does not include the data group. The data group may be divided into a plurality of regions based upon a degree of interference of the main service data. A long known data sequence may be periodically inserted in the region having no interference with the main service data.

In another aspect of the present invention, a digital broadcast receiving system may use the known data sequence for demodulating and channel equalizing processes. When receiving only the mobile service data, the digital broadcast receiving system turns power on only during the burst-on section so as to process the mobile service data. Herein, by detecting the position of the known data being transmitted from the transmitting system, the initial frequency offset may be compensated. The receiving system may use the detected known data (or sequence) position indicator in carrier recovery, timing recovery, and phase compensation processes.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 32 illustrates an example of an error correction decoding process according to the present invention.

DETAILED DESCRIPTION OF THE INVENTION

Figure 1:
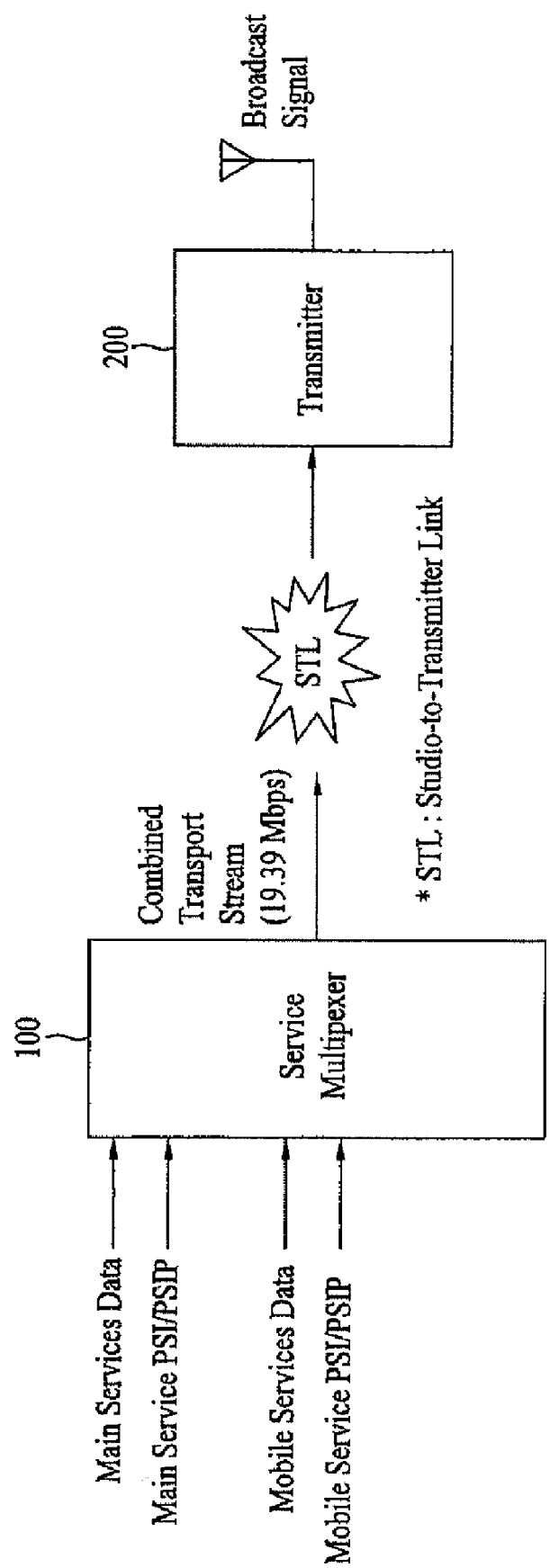
FIG. 1 illustrates a block diagram of a digital broadcast system according to an embodiment of the present invention.

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

Among the terms used in the description of the present invention, main service data correspond to data that can be received by a fixed receiving system and may include audio/video (A/V) data. More specifically, the main service data may include A/V data of high definition (HD) or standard definition (SD) levels and may also include diverse data types required for data broadcasting. Also, the known data correspond to data pre-known in accordance with a pre-arranged agreement between the receiving system and the transmitting system. Additionally, in the present invention, mobile service data may include at least one of mobile service data, pedestrian service data, and handheld service data, and are collectively referred to as mobile service data for simplicity. Herein, the mobile service data not only correspond to mobile/pedestrian/handheld service data (M/P/H service data) but may also include any type of service data with mobile or portable characteristics. Therefore, the mobile service data according to the present invention are not limited only to the M/P/H service data.

The above-described mobile service data may correspond to data having information, such as program execution files, stock information, and so on, and may also correspond to A/V data. Most particularly, the mobile service data may correspond to A/V data having lower resolution and lower data rate as compared to the main service data. For example, if an A/V codec that is used for a conventional main service corresponds to a MPEG-2 codec, a MPEG-4 advanced video coding (AVC) or scalable video coding (SVC) having better image compression efficiency may be used as the A/V codec for the mobile service. Furthermore, any type of data may be transmitted as the mobile service data. For example, transport protocol expert group (TPEG) data for broadcasting real-time transportation information may be serviced as the main service data.

Also, a data service using the mobile service data may include weather forecast services, traffic information services, stock information services, viewer participation quiz programs, real-time polls & surveys, interactive education broadcast programs, gaming services, services providing information on synopsis, character, background music, and filming sites of soap operas or series, services providing information on past match scores and player profiles and achievements, and services providing information on product information and programs classified by service, medium, time, and theme enabling purchase orders to be processed. Herein, the present invention is not limited only to the services mentioned above. In the present invention, the transmitting system provides backward compatibility in the main service data so as to be received by the conventional receiving system. Herein, the main service data and the mobile service data are multiplexed to the same physical channel and then transmitted.

The transmitting system according to the present invention performs additional encoding on the mobile service data and inserts the data already known by the receiving system and transmitting system (i.e., known data), thereby transmitting the processed data. Therefore, when using the transmitting system according to the present invention, the receiving system may receive the mobile service data during a mobile state and may also receive the mobile service data with stability despite various distortion and noise occurring within the channel.

General Description of a Transmitting System

FIG. 1 illustrates a block diagram showing a general structure of a digital broadcast transmitting system according to an embodiment of the present invention. Herein, the digital broadcast transmitting includes a service multiplexer 100 and a transmitter 200. Herein, the service multiplexer 100 is located in the studio of each broadcast station, and the transmitter 200 is located in a site placed at a predetermined distance from the studio. The transmitter 200 may be located in a plurality of different locations. Also, for example, the plurality of transmitters may share the same frequency. And, in this case, the plurality of transmitters receives the same signal. Accordingly, in the receiving system, a channel equalizer may compensate signal distortion, which is caused by a reflected wave, so as to recover the original signal. In another example, the plurality of transmitters may have different frequencies with respect to the same channel.

A variety of methods may be used for data communication each of the transmitters, which are located in remote positions, and the service multiplexer. For example, an interface standard such as a synchronous serial interface for transport of MPEG-2 data (SMPTE-310M). In the SMPTE-310M interface standard, a constant data rate is decided as an output data rate of the service multiplexer. For example, in case of the 8VSB mode, the output data rate is 19.39 Mbps, and, in case of the 16VSB mode, the output data rate is 38.78 Mbps. Furthermore, in the conventional 8VSB mode transmitting system, a transport stream (TS) packet having a data rate of approximately 19.39 Mbps may be transmitted through a single physical channel. Also, in the transmitting system according to the present invention provided with backward compatibility with the conventional transmitting system, additional encoding is performed on the mobile service data. Thereafter, the additionally encoded mobile service data are multiplexed with the main service data to a TS packet form, which is then transmitted. At this point, the data rate of the multiplexed TS packet is approximately 19.39 Mbps.

At this point, the service multiplexer 100 receives at least one type of mobile service data and program specific information (PSI)/program and system information protocol (PSIP) table data for each mobile service and encapsulates the received data to each transport stream (TS) packet. Also, the service multiplexer 100 receives at least one type of main service data and PSI/PSIP table data for each main service so as to encapsulate the received data to a TS packet. Subsequently, the TS packets are multiplexed according to a predetermined multiplexing rule and outputs the multiplexed packets to the transmitter 200.

Service Multiplexer

Figure 2:
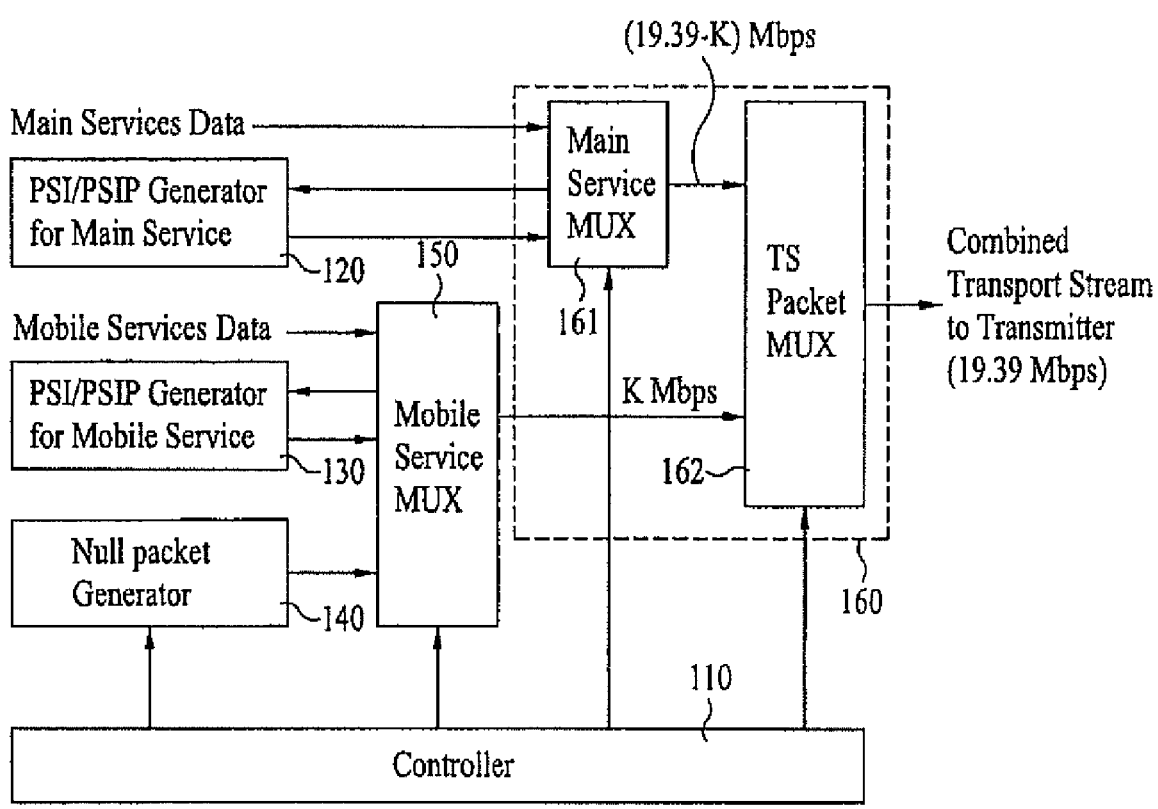
FIG. 2 illustrates a block diagram of a service multiplexer of FIG. 1 according to an embodiment of the present invention.

FIG. 2 illustrates a block diagram showing an example of the service multiplexer. The service multiplexer includes a controller 110 for controlling the overall operations of the service multiplexer, a PSI/PSIP generator 120 for the main service, a PSI/PSIP generator 130 for the mobile service, a null packet generator 140, a mobile service multiplexer 150, and a transport multiplexer 160. The transport multiplexer 160 may include a main service multiplexer 161 and a transport stream (TS) packet multiplexer 162. Referring to FIG. 2, at least one type of compression encoded main service data and the PSI/PSIP table data generated from the PSI/PSIP generator 120 for the main service are inputted to the main service multiplexer 161 of the transport multiplexer 160. The main service multiplexer 161 encapsulates each of the inputted main service data and PSI/PSIP table data to MPEG-2 TS packet forms. Then, the MPEG-2 TS packets are multiplexed and outputted to the TS packet multiplexer 162. Herein, the data packet being outputted from the main service multiplexer 161 will be referred to as a main service data packet for simplicity.

Thereafter, at least one type of the compression encoded mobile service data and the PSI/PSIP table data generated from the PSI/PSIP generator 130 for the mobile service are inputted to the mobile service multiplexer 150. The mobile service multiplexer 150 encapsulates each of the inputted mobile service data and PSI/PSIP table data to MPEG-2 TS packet forms. Then, the MPEG-2 TS packets are multiplexed and outputted to the TS packet multiplexer 162. Herein, the data packet being outputted from the mobile service multiplexer 150 will be referred to as a mobile service data packet for simplicity. At this point, the transmitter 200 requires identification information in order to identify and process the main service data packet and the mobile service data packet. Herein, the identification information may use values predecided in accordance with an agreement between the transmitting system and the receiving system, or may be configured of a separate set of data, or may modify predetermined location value with in the corresponding data packet. As an example of the present invention, a different packet identifier (PID) may be assigned to identify each of the main service data packet and the mobile service data packet.

In another example, by modifying a synchronization data byte within a header of the mobile service data, the service data packet may be identified by using the synchronization data byte value of the corresponding service data packet. For example, the synchronization byte of the main service data packet directly outputs the value decided by the ISO/IEC13818-1 standard (i.e., 0x47) without any modification. The synchronization byte of the mobile service data packet modifies and outputs the value, thereby identifying the main service data packet and the mobile service data packet. Conversely, the synchronization byte of the main service data packet is modified and outputted, whereas the synchronization byte of the mobile service data packet is directly outputted without being modified, thereby enabling the main service data packet and the mobile service data packet to be identified.

A plurality of methods may be applied in the method of modifying the synchronization byte. For example, each bit of the synchronization byte may be inversed, or only a portion of the synchronization byte may be inversed. As described above, any type of identification information may be used to identify the main service data packet and the mobile service data packet. Therefore, the scope of the present invention is not limited only to the example set forth in the description of the present invention.

Meanwhile, a transport multiplexer used in the conventional digital broadcasting system may be used as the transport multiplexer 160 according to the present invention. More specifically, in order to multiplex the mobile service data and the main service data and to transmit the multiplexed data, the data rate of the main service is limited to a data rate of (19.39-K) Mbps. Then, K Mbps, which corresponds to the remaining data rate, is assigned as the data rate of the mobile service. Thus, the transport multiplexer which is already being used may be used as it is without any modification. Herein, the transport multiplexer 160 multiplexes the main service data packet being outputted from the main service multiplexer 161 and the mobile service data packet being outputted from the mobile service multiplexer 150. Thereafter, the transport multiplexer 160 transmits the multiplexed data packets to the transmitter 200.

However, in some cases, the output data rate of the mobile service multiplexer 150 may not be equal to K Mbps. In this case, the mobile service multiplexer 150 multiplexes and outputs null data packets generated from the null packet generator 140 so that the output data rate can reach K Mbps. More specifically, in order to match the output data rate of the mobile service multiplexer 150 to a constant data rate, the null packet generator 140 generates null data packets, which are then outputted to the mobile service multiplexer 150. For example, when the service multiplexer 100 assigns K Mbps of the 19.39 Mbps to the mobile service data, and when the remaining (19.39-K) Mbps is, therefore, assigned to the main service data, the data rate of the mobile service data that are multiplexed by the service multiplexer 100 actually becomes lower than K Mbps. This is because, in case of the mobile service data, the pre-processor of the transmitting system performs additional encoding, thereby increasing the amount of data. Eventually, the data rate of the mobile service data, which may be transmitted from the service multiplexer 100, becomes smaller than K Mbps.

For example, since the pre-processor of the transmitter performs an encoding process on the mobile service data at a coding rate of at least ½, the amount of the data outputted from the pre-processor is increased to more than twice the amount of the data initially inputted to the pre-processor. Therefore, the sum of the data rate of the main service data and the data rate of the mobile service data, both being multiplexed by the service multiplexer 100, becomes either equal to or smaller than 19.39 Mbps. Therefore, in order to match the data rate of the data that are finally outputted from the service multiplexer 100 to a constant data rate (e.g., 19.39 Mbps), an amount of null data packets corresponding to the amount of lacking data rate is generated from the null packet generator 140 and outputted to the mobile service multiplexer 150.

Accordingly, the mobile service multiplexer 150 encapsulates each of the mobile service data and the PSI/PSIP table data that are being inputted to a MPEG-2 TS packet form. Then, the above-described TS packets are multiplexed with the null data packets and, then, outputted to the TS packet multiplexer 162. Thereafter, the TS packet multiplexer 162 multiplexes the main service data packet being outputted from the main service multiplexer 161 and the mobile service data packet being outputted from the mobile service multiplexer 150 and transmits the multiplexed data packets to the transmitter 200 at a data rate of 19.39 Mbps.

According to an embodiment of the present invention, the mobile service multiplexer 150 receives the null data packets. However, this is merely exemplary and does not limit the scope of the present invention. In other words, according to another embodiment of the present invention, the TS packet multiplexer 162 may receive the null data packets, so as to match the data rate of the finally outputted data to a constant data rate. Herein, the output path and multiplexing rule of the null data packet is controlled by the controller 110. The controller 110 controls the multiplexing processed performed by the mobile service multiplexer 150, the main service multiplexer 161 of the transport multiplexer 160, and the TS packet multiplexer 162, and also controls the null data packet generation of the null packet generator 140. At this point, the transmitter 200 discards the null data packets transmitted from the service multiplexer 100 instead of transmitting the null data packets.

Further, in order to allow the transmitter 200 to discard the null data packets transmitted from the service multiplexer 100 instead of transmitting them, identification information for identifying the null data packet is required. Herein, the identification information may use values pre-decided in accordance with an agreement between the transmitting system and the receiving system. For example, the value of the synchronization byte within the header of the null data packet may be modified so as to be used as the identification information. Alternatively, a transport_error_indicator flag may also be used as the identification information.

In the description of the present invention, an example of using the transport_error_indicator flag as the identification information will be given to describe an embodiment of the present invention. In this case, the transport_error_indicator flag of the null data packet is set to '1', and the transport_error_indicator flag of the remaining data packets are reset to '0', so as to identify the null data packet. More specifically, when the null packet generator 140 generates the null data packets, if the transport_error_indicator flag from the header field of the null data packet is set to '1' and then transmitted, the null data packet may be identified and, therefore, be discarded. In the present invention, any type of identification information for identifying the null data packets may be used. Therefore, the scope of the present invention is not limited only to the examples set forth in the description of the present invention.

According to another embodiment of the present invention, a transmission parameter may be included in at least a portion of the null data packet, or at least one table or an operations and maintenance (OM) packet (or OMP) of the PSI/PSIP table for the mobile service. In this case, the transmitter 200 extracts the transmission parameter and outputs the extracted transmission parameter to the corresponding block and also transmits the extracted parameter to the receiving system if required. More specifically, a packet referred to as an OMP is defined for the purpose of operating and managing the transmitting system. For example, the OMP is configured in accordance with the MPEG-2 TS packet format, and the corresponding PID is given the value of 0×1FFA. The OMP is configured of a 4-byte header and a 184-byte payload. Herein, among the 184 bytes, the first byte corresponds to an OM_type field, which indicates the type of the OM packet.

In the present invention, the transmission parameter may be transmitted in the form of an OMP. And, in this case, among the values of the reserved fields within the OM_type field, a pre-arranged value is used, thereby indicating that the transmission parameter is being transmitted to the transmitter 200 in the form of an OMP. More specifically, the transmitter 200 may find (or identify) the OMP by referring to the PID. Also, by parsing the OM_type field within the OMP, the transmitter 200 can verify whether a transmission parameter is included after the OM_type field of the corresponding packet. The transmission parameter corresponds to supplemental data required for processing mobile service data from the transmitting system and the receiving system.

Herein, the transmission parameter may include data group information, region information within the data group, RS frame information, super frame information, burst information, turbo code information, and RS code information. The burst information may include burst size information, burst period information, and time information to next burst. The burst period signifies the period at which the burst transmitting the same mobile service is repeated. The data group includes a plurality of mobile service data packets, and a plurality of such data groups is gathered (or grouped) to form a burst. A burst section signifies the beginning of a current burst to the beginning of a next burst. Herein, the burst section is classified as a section that includes the data group (also referred to as a burst-on section), and a section that does not include the data group (also referred to as a burst-off section). A burst-on section is configured of a plurality of fields, wherein one field includes one data group.

The transmission parameter may also include information on how signals of a symbol domain are encoded in order to transmit the mobile service data, and multiplexing information on how the main service data and the mobile service data or various types of mobile service data are multiplexed. The information included in the transmission parameter is merely exemplary to facilitate the understanding of the present invention. And, the adding and deleting of the information included in the transmission parameter may be easily modified and changed by anyone skilled in the art. Therefore, the present invention is not limited to the examples proposed in the description set forth herein. Furthermore, the transmission parameters may be provided from the service multiplexer 100 to the transmitter 200. Alternatively, the transmission parameters may also be set up by an internal controller (not shown) within the transmitter 200 or received from an external source.

Transmitter

Figure 3:
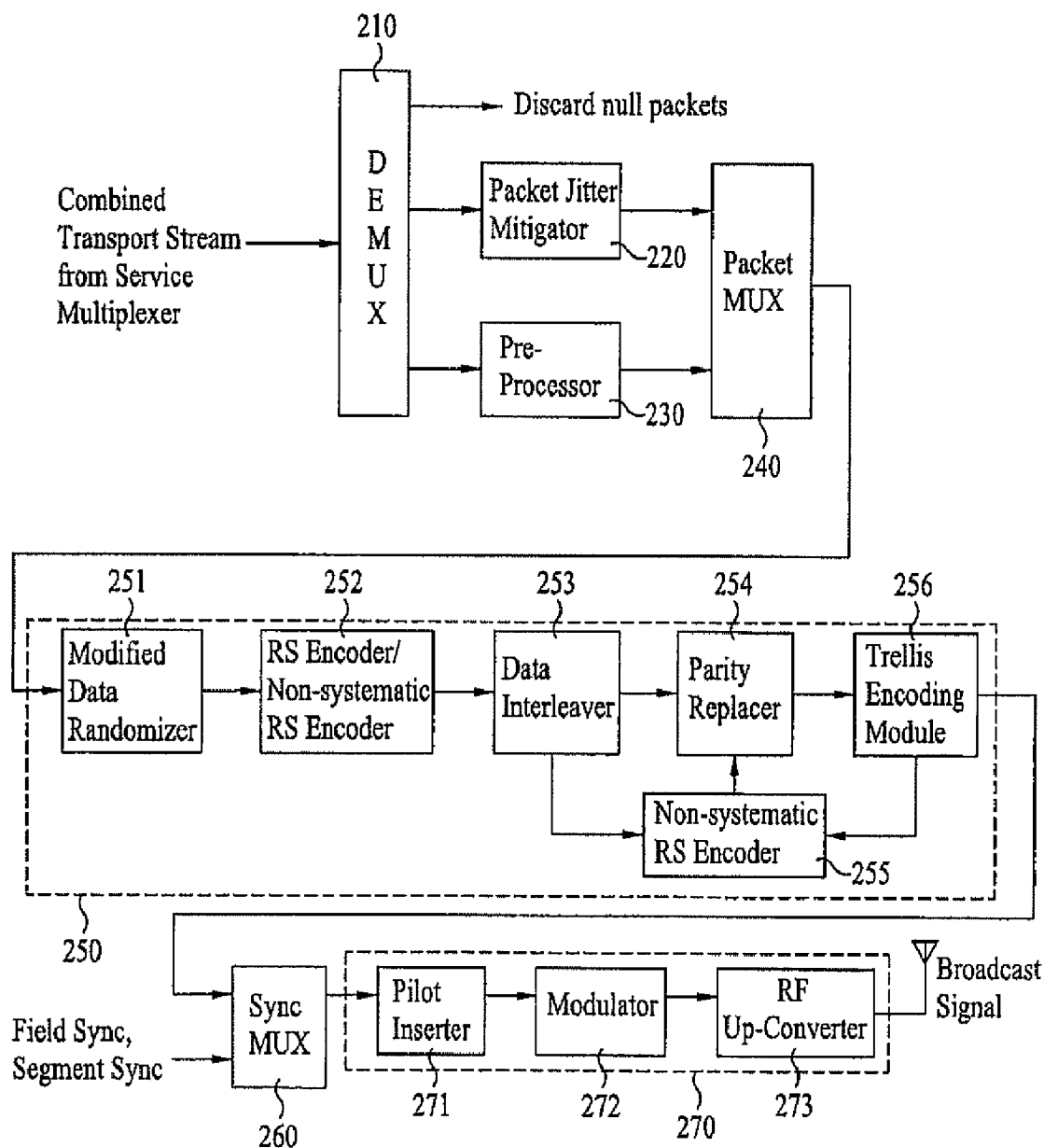
FIG. 3 illustrates a block diagram of a transmitter of FIG. 1 according to an embodiment of the present invention.

FIG. 3 illustrates a block diagram showing an example of the transmitter 200 according to an embodiment of the present invention. Herein, the transmitter 200 includes a demultiplexer 210, a packet jitter mitigator 220, a pre-processor 230, a packet multiplexer 240, a post-processor 250, a synchronization (sync) multiplexer 260, and a transmission unit 270. Herein, when a data packet is received from the service multiplexer 100, the demultiplexer 210 should identify whether the received data packet corresponds to a main service data packet, a mobile service data packet, or a null data packet. For example, the demultiplexer 210 uses the PID within the received data packet so as to identify the main service data packet and the mobile service data packet. Then, the demultiplexer 210 uses a transport_error_indicator field to identify the null data packet. The main service data packet identified by the demultiplexer 210 is outputted to the packet jitter mitigator 220, the mobile service data packet is outputted to the pre-processor 230, and the null data packet is discarded. If a transmission parameter is included in the null data packet, then the transmission parameter is first extracted and outputted to the corresponding block. Thereafter, the null data packet is discarded.

The pre-processor 230 performs an additional encoding process of the mobile service data included in the service data packet, which is demultiplexed and outputted from the demultiplexer 210. The pre-processor 230 also performs a process of configuring a data group so that the data group may be positioned at a specific place in accordance with the purpose of the data, which are to be transmitted on a transmission frame. This is to enable the mobile service data to respond swiftly and strongly against noise and channel changes. The pre-processor 230 may also refer to the transmission parameter when performing the additional encoding process. Also, the pre-processor 230 groups a plurality of mobile service data packets to configure a data group. Thereafter, known data, mobile service data, RS parity data, and MPEG header are allocated to pre-determined areas within the data group.

Pre-Processor within Transmitter

Figure 4:
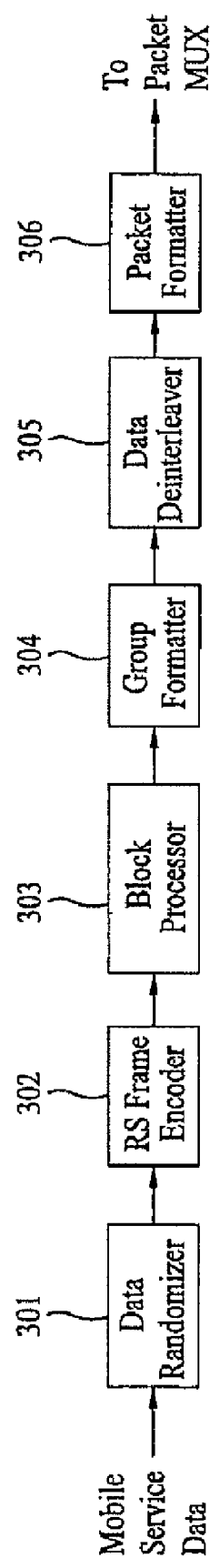
FIG. 4 illustrates a block diagram of a pre-processor of FIG. 3 according to an embodiment of the present invention.

FIG. 4 illustrates a block diagram showing an example of the pre-processor 230 according to the present invention. The pre-processor 230 includes a data randomizer 301, a RS frame encoder 302, a block processor 303, a group formatter 304, a data deinterleaver 305, a packet formatter 306. The data randomizer 301 within the above-described pre-processor 230 randomizes the mobile service data packet including the mobile service data that is inputted through the demultiplexer 210. Then, the data randomizer 301 outputs the randomized mobile service data packet to the RS frame encoder 302. At this point, since the data randomizer 301 performs the randomizing process on the mobile service data, the randomizing process that is to be performed by the data randomizer 251 of the post-processor 250 on the mobile service data may be omitted. The data randomizer 301 may also discard the synchronization byte within the mobile service data packet and perform the randomizing process. This is an option that may be chosen by the system designer. In the example given in the present invention, the randomizing process is performed without discarding the synchronization byte within the mobile service data packet.

The RS frame encoder 302 groups a plurality of mobile the synchronization byte within the mobile service data packets that is randomized and inputted, so as to create a RS frame. Then, the RS frame encoder 302 performs at least one of an error correction encoding process and an error detection encoding process in RS frame units. Accordingly, robustness may be provided to the mobile service data, thereby scattering group error that may occur during changes in a frequency environment, thereby enabling the enhanced data to respond to the frequency environment, which is extremely vulnerable and liable to frequent changes. Also, the RS frame encoder 302 groups a plurality of RS frame so as to create a super frame, thereby performing a row permutation process in super frame units. The row permutation process may also be referred to as a row interleaving process. Hereinafter, the process will be referred to as row permutation for simplicity.

More specifically, when the RS frame encoder 302 performs the process of permuting each row of the super frame in accordance with a pre-determined rule, the position of the rows within the super frame before and after the row permutation process is changed. If the row permutation process is performed by super frame units, and even though the section having a plurality of errors occurring therein becomes very long, and even though the number of errors included in the RS frame, which is to be decoded, exceeds the extent of being able to be corrected, the errors become dispersed within the entire super frame. Thus, the decoding ability is even more enhanced as compared to a single RS frame.

At this point, as an example of the present invention, RS-encoding is applied for the error correction encoding process, and a cyclic redundancy check (CRC) encoding is applied for the error detection process. When performing the RS-encoding, parity data that are used for the error correction are generated. And, when performing the CRC encoding, CRC data that are used for the error detection are generated. The RS encoding is one of forward error correction (FEC) methods. The FEC corresponds to a technique for compensating errors that occur during the transmission process. The CRC data generated by CRC encoding may be used for indicating whether or not the mobile service data have been damaged by the errors while being transmitted through the channel. In the present invention, a variety of error detection coding methods other than the CRC encoding method may be used, or the error correction coding method may be used to enhance the overall error correction ability of the receiving system. Herein, the RS frame encoder 302 refers to a pre-determined transmission parameter and/or the transmission parameter provided from the service multiplexer 100 so as to perform operations including RS frame configuration, RS encoding, CRC encoding, super frame configuration, and row permutation in super frame units.

Pre-Processor within RS Frame Encoder

Figure 5:
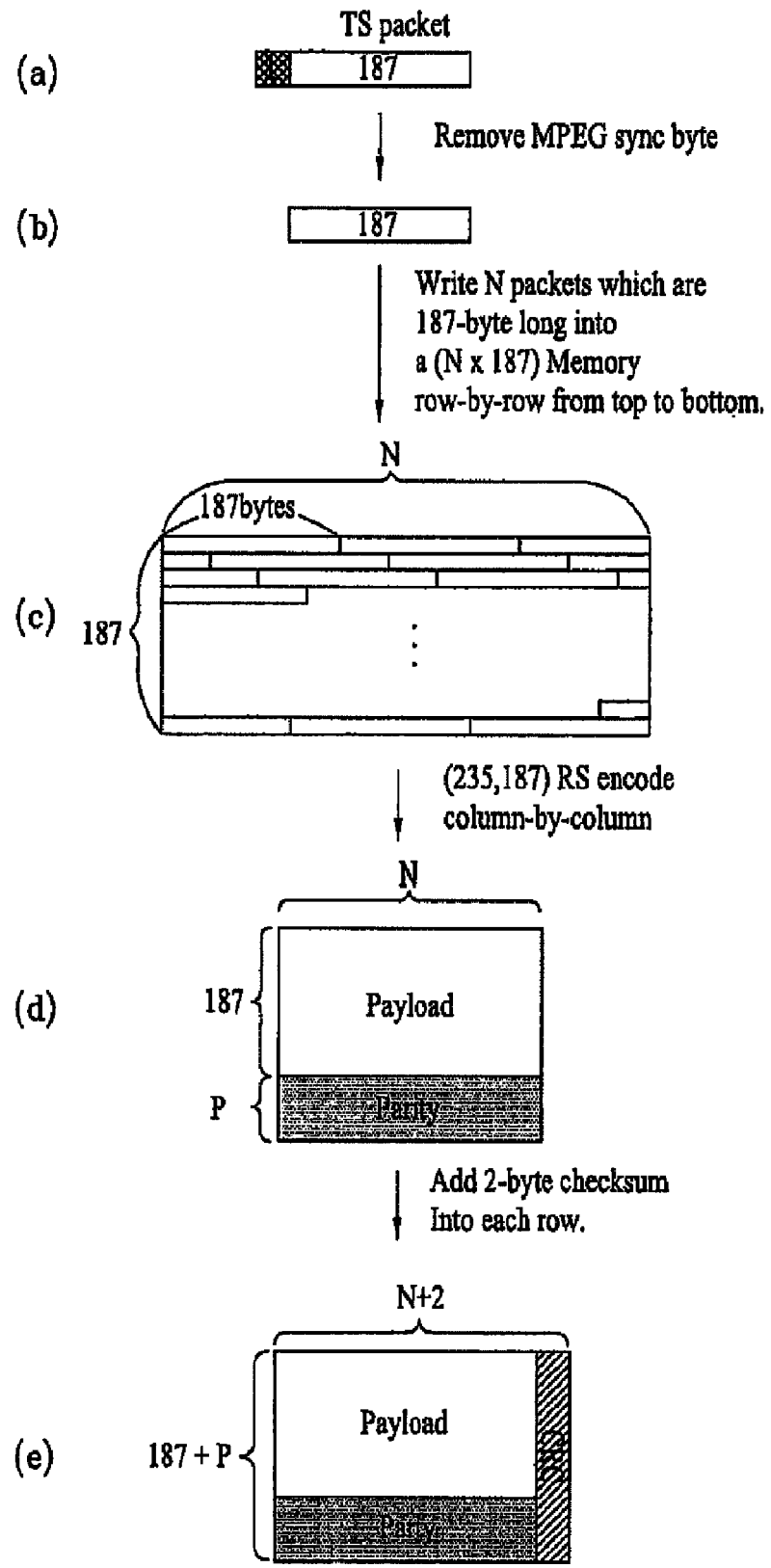
FIG. 5(*a*) to FIG. 5(*e*) illustrate process steps of error correction encoding and error detection encoding processes according to an embodiment of the present invention.

FIG. 5(a) to FIG. 5(e) illustrate error correction encoding and error detection encoding processed according to an embodiment of the present invention. More specifically, the RS frame encoder 302 first divides the inputted mobile service data bytes to units of a predetermined length. The predetermined length is decided by the system designer. And, in the example of the present invention, the predetermined length is equal to 187 bytes, and, therefore, the 187-byte unit will be referred to as a packet for simplicity. For example, when the mobile service data that are being inputted, as shown in FIG. 5(a), correspond to a MPEG transport packet stream configured of 188-byte units, the first synchronization byte is removed, as shown in FIG. 5(b), so as to configure a 187-byte unit. Herein, the synchronization byte is removed because each mobile service data packet has the same value.

Herein, the process of removing the synchronization byte may be performed during a randomizing process of the data randomizer 301 in an earlier process. In this case, the process of the removing the synchronization byte by the RS frame encoder 302 may be omitted. Moreover, when adding synchronization bytes from the receiving system, the process may be performed by the data derandomizer instead of the RS frame decoder. Therefore, if a removable fixed byte (e.g., synchronization byte) does not exist within the mobile service data packet that is being inputted to the RS frame encoder 302, or if the mobile service data that are being inputted are not configured in a packet format, the mobile service data that are being inputted are divided into 187-byte units, thereby configuring a packet for each 187-byte unit.

Subsequently, as shown in FIG. 5(c), N number of packets configured of 187 bytes is grouped to configure a RS frame. At this point, the RS frame is configured as a RS frame having the size of N(row)*187(column) bytes, in which 187-byte packets are sequentially inputted in a row direction. In order to simplify the description of the present invention, the RS frame configured as described above will also be referred to as a first ES frame. More specifically, only pure mobile service data are included in the first RS frame, which is the same as the structure configured of 187 N-byte rows. Thereafter, the mobile service data within the RS frame are divided into an equal size. Then, when the divided mobile service data are transmitted in the same order as the input order for configuring the RS frame, and when one or more errors have occurred at a particular point during the transmitting/receiving process, the errors are clustered (or gathered) within the RS frame as well. In this case, the receiving system uses a RS erasure decoding method when performing error correction decoding, thereby enhancing the error correction ability. At this point, the N number of columns within the N number of RS frame includes 187 bytes, as shown in FIG. 5(c).

In this case, a (Nc,Kc)-RS encoding process is performed on each column, so as to generate Nc−Kc(=P) number of parity bytes. Then, the newly generated P number of parity bytes is added after the very last byte of the corresponding column, thereby creating a column of (187+P) bytes. Herein, as shown in FIG. 5(c), Kc is equal to 187 (i.e., Kc=187), and Nc is equal to 187+P (i.e., Nc=187+P). For example, when P is equal to 48, (235,187)-RS encoding process is performed so as to create a column of 235 bytes. When such RS encoding process is performed on all N number of columns, as shown in FIG. 5(c), a RS frame having the size of N(row)*(187+P) (column) bytes may be created, as shown in FIG. 5(d). In order to simplify the description of the present invention, the RS frame having the RS parity inserted therein will be referred to as s second RS frame. More specifically, the second RS frame having the structure of (187+P) rows configured of N bytes may be configured.

As shown in FIG. 5(c) or FIG. 5(d), each row of the RS frame is configured of N bytes. However, depending upon channel conditions between the transmitting system and the receiving system, error may be included in the RS frame. When errors occur as described above, CRC data (or CRC code or CRC checksum) may be used on each row unit in order to verify whether error exists in each row unit. The RS frame encoder 302 may perform CRC encoding on the mobile service data being RS encoded so as to create (or generate) the CRC data. The CRC data being generated by CRC encoding may be used to indicate whether the mobile service data have been damaged while being transmitted through the channel.

The present invention may also use different error detection encoding methods other than the CRC encoding method. Alternatively, the present invention may use the error correction encoding method to enhance the overall error correction ability of the receiving system. FIG. 5(e) illustrates an example of using a 2-byte (i.e., 16-bit) CRC checksum as the CRC data. Herein, a 2-byte CRC checksum is generated for N number of bytes of each row, thereby adding the 2-byte CRC checksum at the end of the N number of bytes. Thus, each row is expanded to (N+2) number of bytes. Equation 1 below corresponds to an exemplary equation for generating a 2-byte CRC checksum for each row being configured of N number of bytes.

$$g(x)=x^{16}+x^{12}+x^{5}+1 \qquad \text{Equation 1}$$

The process of adding a 2-byte checksum in each row is only exemplary. Therefore, the present invention is not limited only to the example proposed in the description set forth herein. In order to simplify the understanding of the present invention, the RS frame having the RS parity and CRC checksum added therein will hereinafter be referred to as a third RS frame. More specifically, the third RS frame corresponds to (187+P) number of rows each configured of (N+2) number of bytes. As described above, when the process of RS encoding and CRC encoding are completed, the (N*187)-byte RS frame is expanded to a (N+2)*(187+P)-byte RS frame. Furthermore, the RS frame that is expanded, as shown in FIG. 5(e), is inputted to the block processor 303.

As described above, the mobile service data encoded by the RS frame encoder 302 are inputted to the block processor 303. The block processor 303 then encodes the inputted mobile service data at a coding rate of G/H (wherein, G is smaller than H (i.e., G<H)) and then outputted to the group formatter 304. More specifically, the block processor 303 divides the mobile service data being inputted in byte units into bit units. Then, the G number of bits is encoded to H number of bits. Thereafter, the encoded bits are converted back to byte units and then outputted. For example, if 1 bit of the input data is coded to 2 bits and outputted, then G is equal to 1 and H is equal to 2 (i.e., G=1 and H=2). Alternatively, if 1 bit of the input data is coded to 4 bits and outputted, then G is equal to 1 and H is equal to 4 (i.e., G=1 and H=4). Hereinafter, the former coding rate will be referred to as a coding rate of ½ (½-rate coding), and the latter coding rate will be referred to as a coding rate of ¼ (¼-rate coding), for simplicity.

Herein, when using the ¼ coding rate, the coding efficiency is greater than when using the ½ coding rate, and may, therefore, provide greater and enhanced error correction ability. For such reason, when it is assumed that the data encoded at a ¼ coding rate in the group formatter 304, which is located near the end portion of the system, are allocated to an area in which the receiving performance may be deteriorated, and that the data encoded at a ½ coding rate are allocated to an area having excellent receiving performance, the difference in performance may be reduced. At this point, the block processor 303 may also receive signaling information including transmission parameters. Herein, the signaling information may also be processed with either ½-rate coding or ¼-rate coding as in the step of processing mobile service data. Thereafter, the signaling information is also considered the same as the mobile service data and processed accordingly.

Meanwhile, the group formatter inserts mobile service data that are outputted from the block processor 303 in corresponding areas within a data group, which is configured in accordance with a pre-defined rule. Also, with respect to the data deinterleaving process, each place holder or known data (or known data place holders) are also inserted in corresponding areas within the data group. At this point, the data group may be divided into at least one hierarchical area. Herein, the type of mobile service data being inserted in each area may vary depending upon the characteristics of each hierarchical area. Additionally, each area may, for example, be divided based upon the receiving performance within the data group. Furthermore, one data group may be configured to include a set of field synchronization data.

Figure 6A:
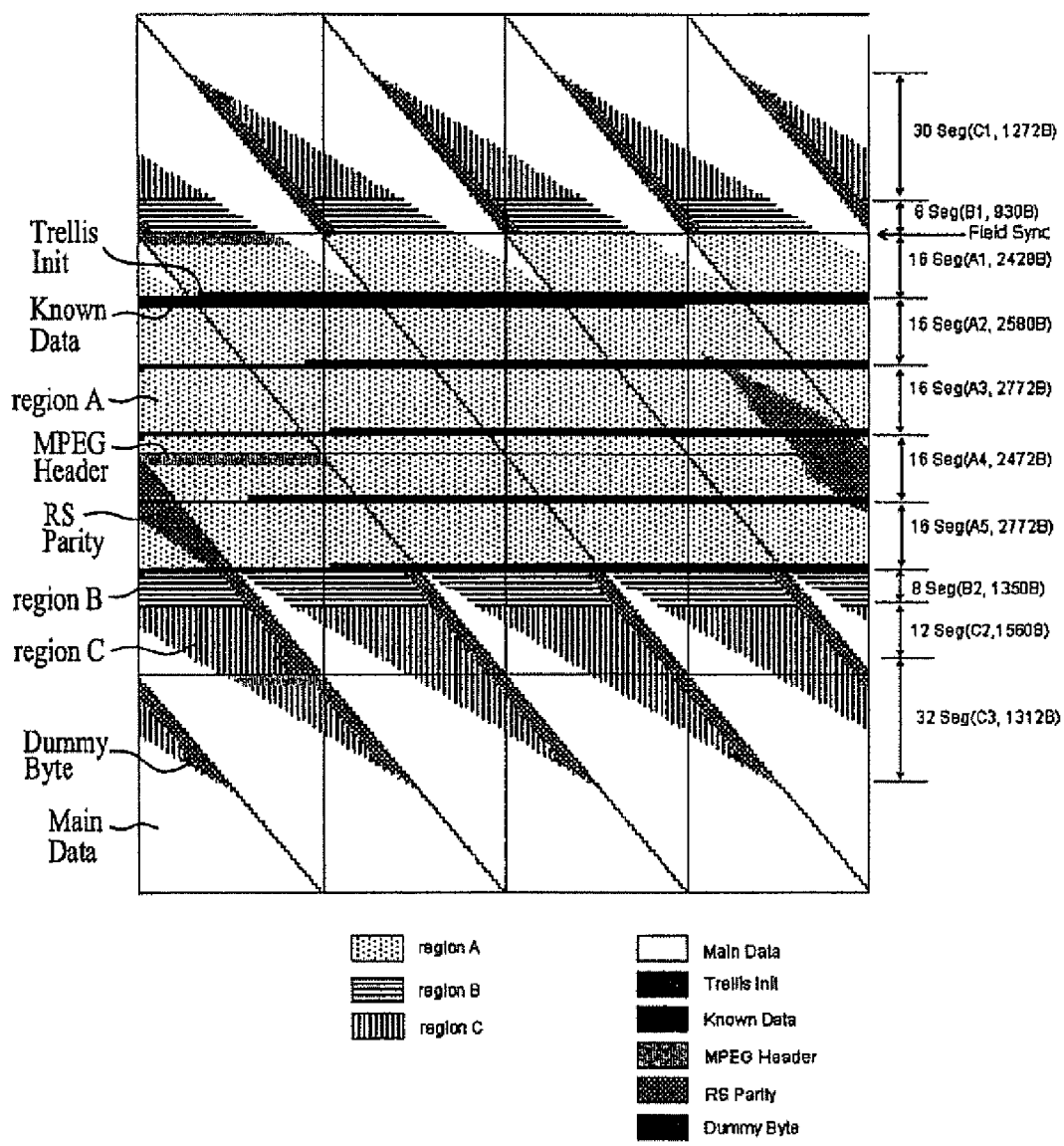
FIG. 6A and FIG. 6B respectively illustrate examples of a data structure before and after a data deinterleaver in a digital broadcast transmitting system according to the present invention.

In an example given in the present invention, a data group is divided into A, B, and C regions in a data configuration prior to data deinterleaving. At this point, the group formatter 304 allocates the mobile service data, which are inputted after being RS encoded and block encoded, to each of the corresponding regions by referring to the transmission parameter. FIG. 6A illustrates an alignment of data after being data interleaved and identified, and FIG. 5B illustrates an alignment of data before being data interleaved and identified. More specifically, a data structure identical to that shown in FIG. 6A is transmitted to a receiving system. Also, the data group configured to have the same structure as the data structure shown in FIG. 6A is inputted to the data deinterleaver 305.

As described above, FIG. 6A illustrates a data structure prior to data deinterleaving that is divided into 3 regions, such as region A, region B, and region C. Also, in the present invention, each of the regions A to C is further divided into a plurality of regions. Referring to FIG. 6A, region A is divided into 5 regions (A1 to A5), region B is divided into 2 regions (B1 and B2), and region C is divided into 3 regions (C1 to C3). Herein, regions A to C are identified as regions having similar receiving performances within the data group. Herein, the type of mobile service data, which are inputted, may also vary depending upon the characteristic of each region.

In the example of the present invention, the data structure is divided into regions A to C based upon the level of interference of the main service data. Herein, the data group is divided into a plurality of regions to be used for different purposes. More specifically, a region of the main service data having no interference or a very low interference level may be considered to have a more resistant (or stronger) receiving performance as compared to regions having higher interference levels. Additionally, when using a system inserting and transmitting known data in the data group, and when consecutively long known data are to be periodically inserted in the mobile service data, the known data having a predetermined length may be periodically inserted in the region having no interference from the main service data (e.g., region A). However, due to interference from the main service data, it is difficult to periodically insert known data and also to insert consecutively long known data to a region having interference from the main service data (e.g., region B and region C).

Hereinafter, examples of allocating data to region A (A1 to A5), region B (B1 and B2), and region C (C1 to C3) will now be described in detail with reference to FIG. 6A. The data group size, the number of hierarchically divided regions within the data group and the size of each region, and the number of mobile service data bytes that can be inserted in each hierarchically divided region of FIG. 6A are merely examples given to facilitate the understanding of the present invention. Herein, the group formatter 304 creates a data group including places in which field synchronization data bytes are to be inserted, so as to create the data group that will hereinafter be described in detail.

More specifically, region A is a region within the data group in which a long known data sequence may be periodically inserted, and in which includes regions wherein the main service data are not mixed (e.g., A1 to A5). Also, region A includes a region (e.g., A1) located between a field synchronization region and the region in which the first known data sequence is to be inserted. The field synchronization region has the length of one segment (i.e., 832 symbols) existing in an ATSC system.

For example, referring to FIG. 6A, 2428 bytes of the mobile service data may be inserted in region A1, 2580 bytes may be inserted in region A2, 2772 bytes may be inserted in region A3, 2472 bytes may be inserted in region A4, and 2772 bytes may be inserted in region A5. Herein, trellis initialization data or known data, MPEG header, and RS parity are not included in the mobile service data. As described above, when region A includes a known data sequence at both ends, the receiving system uses channel information that can obtain known data or field synchronization data, so as to perform equalization, thereby providing enforced equalization performance.

Also, region B includes a region located within 8 segments at the beginning of a field synchronization region within the data group (chronologically placed before region A1) (e.g., region B1), and a region located within 8 segments behind the very last known data sequence which is inserted in the data group (e.g., region B2). For example, 930 bytes of the mobile service data may be inserted in the region B1, and 1350 bytes may be inserted in region B2. Similarly, trellis initialization data or known data, MPEG header, and RS parity are not included in the mobile service data. In case of region B, the receiving system may perform equalization by using channel information obtained from the field synchronization region. Alternatively, the receiving system may also perform equalization by using channel information that may be obtained from the last known data sequence, thereby enabling the system to respond to the channel changes.

Region C includes a region located within 30 segments including and preceding the $9^{th}$ segment of the field synchronization region (chronologically located before region A) (e.g., region C1), a region located within 12 segments including and following the $9^{th}$ segment of the very last known data sequence within the data group (chronologically located after region A) (e.g., region C2), and a region located in 32 segments after the region C2 (e.g., region C3). For example, 1272 bytes of the mobile service data may be inserted in the region C1, 1560 bytes may be inserted in region C2, and 1312 bytes may be inserted in region C3. Similarly, trellis initialization data or known data, MPEG header, and RS parity are not included in the mobile service data. Herein, region C (e.g., region C1) is located chronologically earlier than (or before) region A.

Since region C (e.g., region C1) is located further apart from the field synchronization region which corresponds to the closest known data region, the receiving system may use the channel information obtained from the field synchronization data when performing channel equalization. Alternatively, the receiving system may also use the most recent channel information of a previous data group. Furthermore, in region C (e.g., region C2 and region C3) located before region A, the receiving system may use the channel information obtained from the last known data sequence to perform equalization. However, when the channels are subject to fast and frequent changes, the equalization may not be performed perfectly. Therefore, the equalization performance of region C may be deteriorated as compared to that of region B.

When it is assumed that the data group is allocated with a plurality of hierarchically divided regions, as described above, the block processor 303 may encode the mobile service data, which are to be inserted to each region based upon the characteristic of each hierarchical region, at a different coding rate. For example, the block processor 303 may encode the mobile service data, which are to be inserted in regions A1 to A5 of region A, at a coding rate of ½. Then, the group formatter 304 may insert the ½-rate encoded mobile service data to regions A1 to A5.

The block processor 303 may encode the mobile service data, which are to be inserted in regions B1 and B2 of region B, at a coding rate of ¼ having higher error correction ability as compared to the ½-coding rate. Then, the group formatter 304 inserts the ¼-rate coded mobile service data in region B1 and region B2. Furthermore, the block processor 303 may encode the mobile service data, which are to be inserted in regions C1 to C3 of region C, at a coding rate of ¼ or a coding rate having higher error correction ability than the ¼-coding rate. Then, the group formatter 304 may either insert the encoded mobile service data to regions C1 to C3, as described above, or leave the data in a reserved region for future usage.

In addition, the group formatter 304 also inserts supplemental data, such as signaling information that notifies the overall transmission information, other than the mobile service data in the data group. Also, apart from the encoded mobile service data outputted from the block processor 303, the group formatter 304 also inserts MPEG header place holders, nonsystematic RS parity place holders, main service data place holders, which are related to data deinterleaving in a later process, as shown in FIG. 6A. Herein, the main service data place holders are inserted because the mobile service data bytes and the main service data bytes are alternately mixed with one another in regions B and C based upon the input of the data deinterleaver, as shown in FIG. 6A. For example, based upon the data outputted after data deinterleaving, the place holder for the MPEG header may be allocated at the very beginning of each packet.

Furthermore, the group formatter 304 either inserts known data generated in accordance with a pre-determined method or inserts known data place holders for inserting the known data in a later process. Additionally, place holders for initializing the trellis encoding module 256 are also inserted in the corresponding regions. For example, the initialization data place holders may be inserted in the beginning of the known data sequence. Herein, the size of the mobile service data that can be inserted in a data group may vary in accordance with the sizes of the trellis initialization place holders or known data (or known data place holders), MPEG header place holders, and RS parity place holders.

Figure 6B:
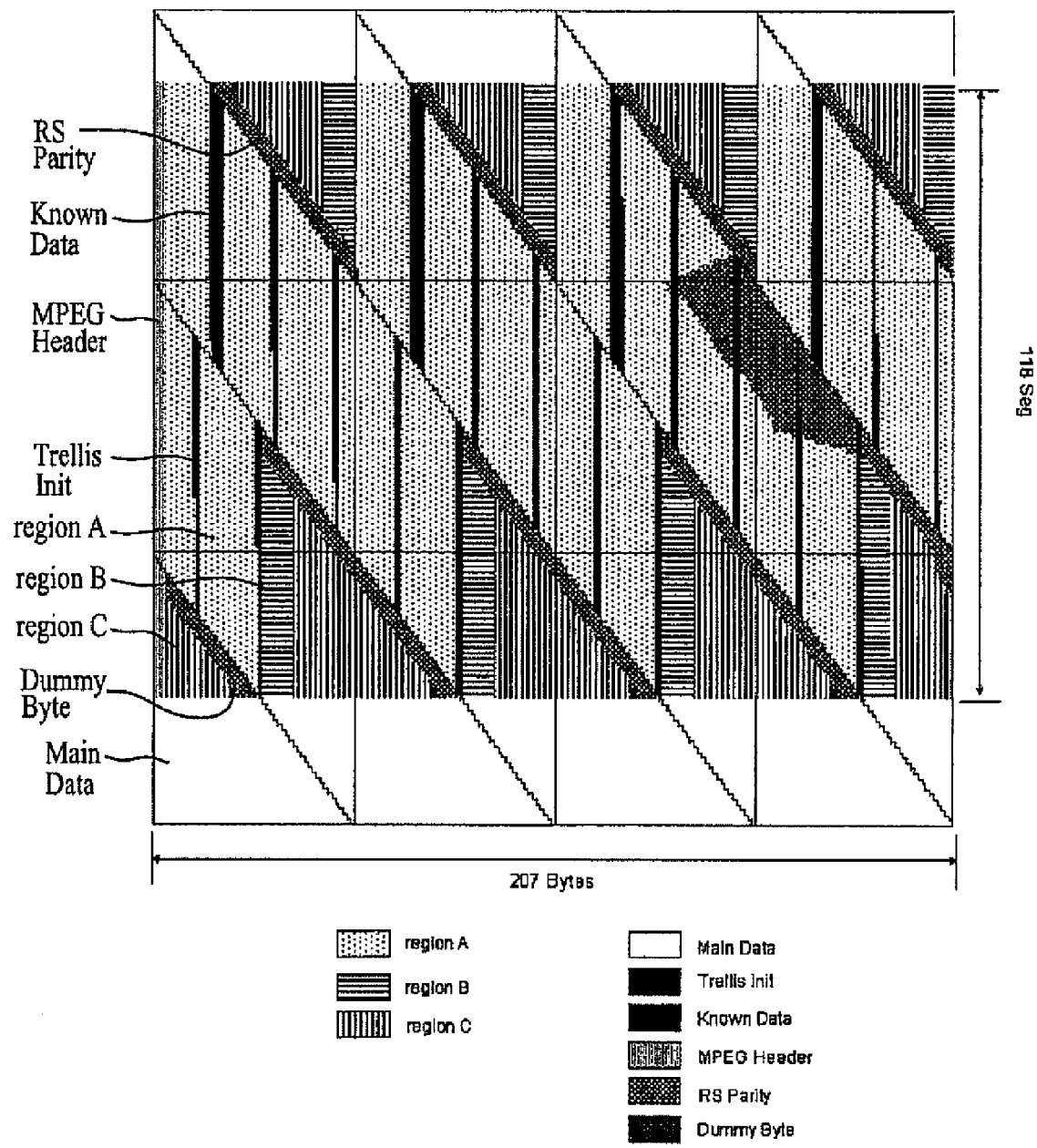

The output of the group formatter 304 is inputted to the data deinterleaver 305. And, the data deinterleaver 305 deinterleaves data by performing an inverse process of the data interleaver on the data and place holders within the data group, which are then outputted to the packet formatter 306. More specifically, when the data and place holders within the data group configured, as shown in FIG. 6A, are deinterleaved by the data deinterleaver 305, the data group being outputted to the packet formatter 306 is configured to have the structure shown in FIG. 6B.

The packet formatter 306 removes the main service data place holders and the RS parity place holders that were allocated for the deinterleaving process from the deinterleaved data being inputted. Then, the packet formatter 306 groups the remaining portion and replaces the 4-byte MPEG header place holder with an MPEG header having a null packet PID (or an unused PID from the main service data packet). Also, when the group formatter 304 inserts known data place holders, the packet formatter 306 may insert actual known data in the known data place holders, or may directly output the known data place holders without any modification in order to make replacement insertion in a later process. Thereafter, the packet formatter 306 identifies the data within the packet-formatted data group, as described above, as a 188-byte unit mobile service data packet (i.e., MPEG TS packet), which is then provided to the packet multiplexer 240.

The packet multiplexer 240 multiplexes the mobile service data packet outputted from the pre-processor 230 and the main service data packet outputted from the packet jitter mitigator 220 in accordance with a pre-defined multiplexing method. Then, the packet multiplexer 240 outputs the multiplexed data packets to the data randomizer 251 of the post-processor 250. Herein, the multiplexing method may vary in accordance with various variables of the system design. One of the multiplexing methods of the packet formatter 240 consists of providing a burst section along a time axis, and, then, transmitting a plurality of data groups during a burst-on section within the burst section, and transmitting only the main service data during the burst-off section within the burst section. Herein, the burst section indicates the section starting from the beginning of the current burst until the beginning of the next burst.

At this point, the main service data may be transmitted during the burst-on section. The packet multiplexer 240 refers to the transmission parameter, such as information on the burst size or the burst period, so as to be informed of the number of data groups and the period of the data groups included in a single burst. Herein, the mobile service data and the main service data may co-exist in the burst-on section, and only the main service data may exist in the burst-off section. Therefore, a main data service section transmitting the main service data may exist in both burst-on and burst-off sections. At this point, the main data service section within the burst-on section and the number of main data service packets included in the burst-off section may either be different from one another or be the same.

When the mobile service data are transmitted in a burst structure, in the receiving system receiving only the mobile service data turns the power on only during the burst section, thereby receiving the corresponding data. Alternatively, in the section transmitting only the main service data, the power is turned off so that the main service data are not received in this section. Thus, the power consumption of the receiving system may be reduced.

Detailed Embodiments of the RS Frame Structure and Packet Multiplexing

Hereinafter, detailed embodiments of the pre-processor 230 and the packet multiplexer 240 will now be described. According to an embodiment of the present invention, the N value corresponding to the length of a row, which is included in the RS frame that is configured by the RS frame encoder 302, is set to 538. Accordingly, the RS frame encoder 302 receives 538 transport stream (TS) packets so as to configure a first RS frame having the size of 538*187 bytes. Thereafter, as described above, the first RS frame is processed with a (235,187)-RS encoding process so as to configure a second RS frame having the size of 538*235 bytes. Finally, the second RS frame is processed with generating a 16-bit checksum so as to configure a third RS frame having the sizes of 540*235.

Meanwhile, as shown in FIG. 6A, the sum of the number of bytes of regions A1 to A5 of region A, in which ½-rate encoded mobile service data are to be inserted, among the plurality of regions within the data group is equal to 13024 bytes (=2428+2580+2772+2472+2772 bytes). Herein, the number of byte prior to performing the ½-rate encoding process is equal to 6512 (=13024/2). On the other hand, the sum of the number of bytes of regions B1 and B2 of region B, in which ¼-rate encoded mobile service data are to be inserted, among the plurality of regions within the data group is equal to 2280 bytes (=930+1350 bytes). Herein, the number of byte prior to performing the ¼-rate encoding process is equal to 570 (=2280/4).

In other words, when 7082 bytes of mobile service data are inputted to the block processor 303, 6512 byte are expanded to 13024 bytes by being ½-rate encoded, and 570 bytes are expanded to 2280 bytes by being ¼-rate encoded. Thereafter, the block processor 303 inserts the mobile service data expanded to 13024 bytes in regions A1 to A5 of region A and, also, inserts the mobile service data expanded to 2280 bytes in regions B1 and B2 of region B. Herein, the 7082 bytes of mobile service data being inputted to the block processor 303 may be divided into an output of the RS frame encoder 302 and signaling information. In the present invention, among the 7082 bytes of mobile service data, 7050 bytes correspond to the output of the RS frame encoder 302, and the remaining 32 bytes correspond to the signaling information data. Then, ½-rate encoding or ¼-rate encoding is performed on the corresponding data bytes.

Meanwhile, a RS frame being processed with RS encoding and CRC encoding from the RS frame encoder 302 is configured of 540*235 bytes, in other words, 126900 bytes. The 126900 bytes are divided by 7050-byte units along the time axis, so as to produce 18 7050-byte units. Thereafter, a 32-byte unit of signaling information data is added to the 7050-byte unit mobile service data being outputted from the RS frame encoder 302. Subsequently, the RS frame encoder 302 performs ½-rate encoding or ¼-rate encoding on the corresponding data bytes, which are then outputted to the group formatter 304. Accordingly, the group formatter 304 inserts the ½-rate encoded data in region A and the ¼-rate encoded data in region B.

The process of deciding an N value that is required for configuring the RS frame from the RS frame encoder 302 will now be described in detail. More specifically, the size of the final RS frame (i.e., the third RS frame), which is RS encoded and CRC encoded from the RS frame encoder 302, which corresponds to (N+2)*235 bytes should be allocated to X number of groups, wherein X is an integer. Herein, in a single data group, 7050 data bytes prior to being encoded are allocated. Therefore, if the (N+2)*235 bytes are set to be the exact multiple of 7050(=30*235), the output data of the RS frame encoder 302 may be efficiently allocated to the data group. According to an embodiment of the present invention, the value of N is decided so that (N+2) becomes a multiple of 30. For example, in the present invention, N is equal to 538, and (N+2)(=540) divided by 30 is equal to 18. This indicates that the mobile service data within one RS frame are processed with either ½-rate encoding or ¼-rate encoding. The encoded mobile service data are then allocated to 18 data groups.

Figure 7:
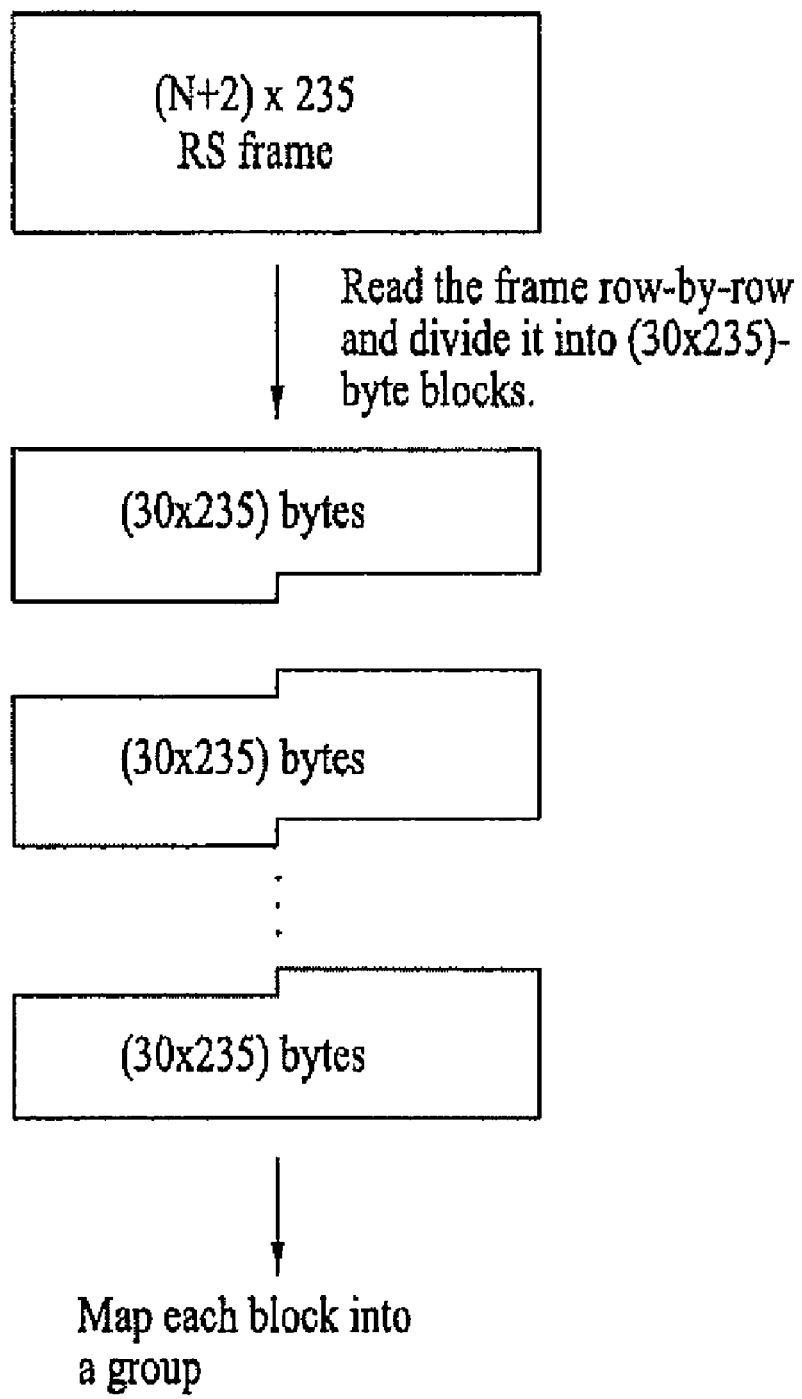
FIG. 7 illustrates an example of a process for dividing a RS frame in order to configure a data group according to the present invention.

FIG. 7 illustrates a process of dividing the RS frame according to the present invention. More specifically, the RS frame having the size of (N+2)*235 is divided into 30*235 byte blocks. Then, the divided blocks are mapped to a single group. In other words, the data of a block having the size of 30*235 bytes are processed with one of a ½-rate encoding process and a ¼-rate encoding process and are, then, inserted in a data group. Thereafter, the data group having corresponding data and place holders inserted in each hierarchical region divided by the group formatter 304 passes through the data deinterleaver 305 and the packet formatter 306 so as to be inputted to the packet multiplexer 240.

Figure 8:
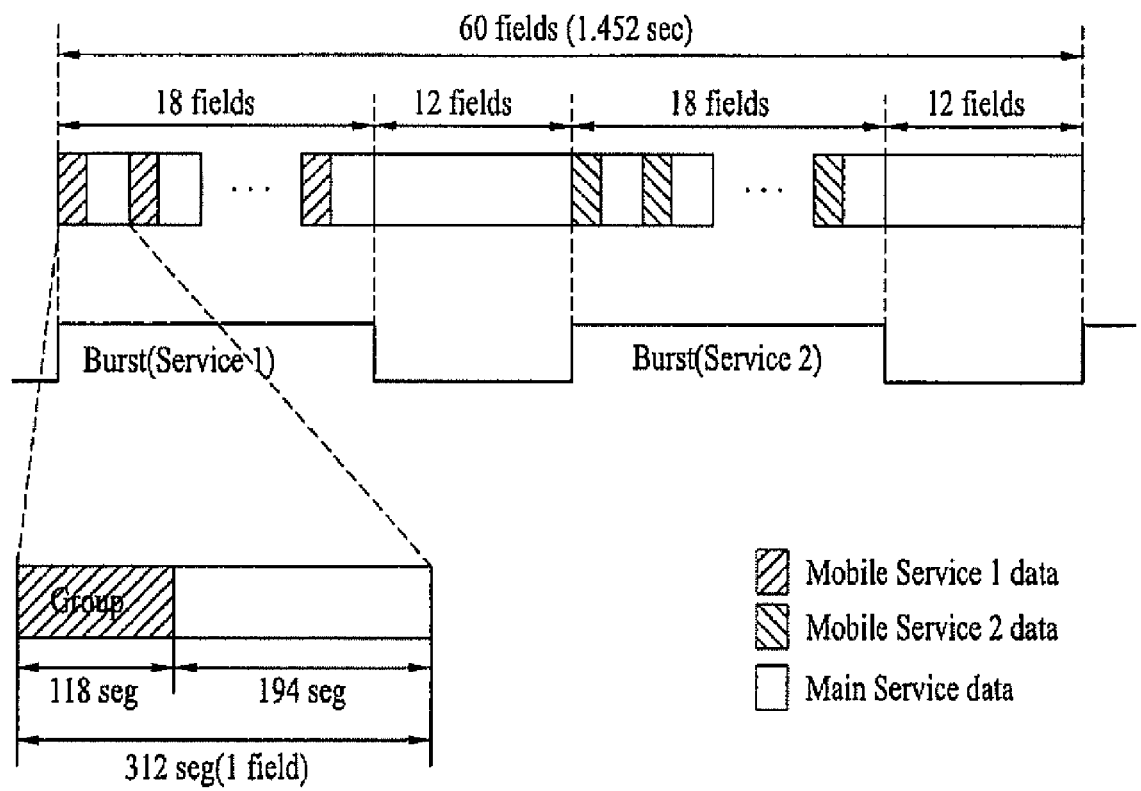
FIG. 8 illustrates an example of an operation of a packet multiplexer for transmitting the data group according to the present invention.

FIG. 8 illustrates exemplary operations of a packet multiplexer for transmitting the data group according to the present invention. More specifically, the packet multiplexer 240 multiplexes a field including a data group, in which the mobile service data and main service data are mixed with one another, and a field including only the main service data. Thereafter, the packet multiplexer 240 outputs the multiplexed fields to the data randomizer 251. At this point, in order to transmit the RS frame having the size of 540*235 bytes, 18 data groups should be transmitted. Herein, each data group includes field synchronization data, as shown in FIG. 6A. Therefore, the 18 data groups are transmitted during 18 field sections, and the section during which the 18 data groups are being transmitted corresponds to the burst-on section.

In each field within the burst-on section, a data group including field synchronization data is multiplexed with main service data, which are then outputted. For example, in the embodiment of the present invention, in each field within the burst-on section, a data group having the size of 118 segments is multiplexed with a set of main service data having the size of 194 segments. Referring to FIG. 8, during the burst-on section (i.e., during the 18 field sections), a field including 18 data groups is transmitted. Then, during the burst-off section that follows (i.e., during the 12 field sections), a field consisting only of the main service data is transmitted. Subsequently, during a subsequent burst-on section, 18 fields including 18 data groups are transmitted. And, during the following burst-off section, 12 fields consisting only of the main service data are transmitted.

Furthermore, in the present invention, the same type of data service may be provided in the first burst-on section including the first 18 data groups and in the second burst-on section including the next 18 data groups. Alternatively, different types of data service may be provided in each burst-on section. For example, when it is assumed that different data service types are provided to each of the first burst-on section and the second burst-on section, and that the receiving system wishes to receive only one type of data service, the receiving system turns the power on only during the corresponding burst-on section including the desired data service type so as to receive the corresponding 18 data fields. Then, the receiving system turns the power off during the remaining 42 field sections so as to prevent other data service types from being received. Thus, the amount of power consumption of the receiving system may be reduced. In addition, the receiving system according to the present invention is advantageous in that one RS frame may be configured from the 18 data groups that are received during a single burst-on section.

According to the present invention, the number of data groups included in a burst-on section may vary based upon the size of the RS frame, and the size of the RS frame varies in accordance with the value N. More specifically, by adjusting the value N, the number of data groups within the burst section may be adjusted. Herein, in an example of the present invention, the (235,187)-RS encoding process adjusts the value N during a fixed state. Furthermore, the size of the mobile service data that can be inserted in the data group may vary based upon the sizes of the trellis initialization data or known data, the MPEG header, and the RS parity, which are inserted in the corresponding data group.

Meanwhile, since a data group including mobile service data in-between the data bytes of the main service data during the packet multiplexing process, the shifting of the chronological position (or place) of the main service data packet becomes relative. Also, a system object decoder (i.e., MPEG decoder) for processing the main service data of the receiving system, receives and decodes only the main service data and recognizes the mobile service data packet as a null data packet. Therefore, when the system object decoder of the receiving system receives a main service data packet that is multiplexed with the data group, a packet jitter occurs.

At this point, since a multiple-level buffer for the video data exists in the system object decoder and the size of the buffer is relatively large, the packet jitter generated from the packet multiplexer 240 does not cause any serious problem in case of the video data. However, since the size of the buffer for the audio data is relatively small, the packet jitter may cause considerable problem. More specifically, due to the packet jitter, an overflow or underflow may occur in the buffer for the main service data of the receiving system (e.g., the buffer for the audio data). Therefore, the packet jitter mitigator 220 re-adjusts the relative position of the main service data packet so that the overflow or underflow does not occur in the system object decoder.

In the present invention, examples of repositioning places for the audio data packets within the main service data in order to minimize the influence on the operations of the audio buffer will be described in detail. The packet jitter mitigator 220 repositions the audio data packets in the main service data section so that the audio data packets of the main service data can be as equally and uniformly aligned and positioned as possible. The standard for repositioning the audio data packets in the main service data performed by the packet jitter mitigator 220 will now be described. Herein, it is assumed that the packet jitter mitigator 220 knows the same multiplexing information as that of the packet multiplexer 240, which is placed further behind the packet jitter mitigator 220.

Firstly, if one audio data packet exists in the main service data section (e.g., the main service data section positioned between two data groups) within the burst-on section, the audio data packet is positioned at the very beginning of the main service data section. Alternatively, if two audio data packets exist in the corresponding data section, one audio data packet is positioned at the very beginning and the other audio data packet is positioned at the very end of the main service data section. Further, if more than three audio data packets exist, one audio data packet is positioned at the very beginning of the main service data section, another is positioned at the very end of the main service data section, and the remaining audio data packets are equally positioned between the first and last audio data packets. Secondly, during the main service data section placed immediately before the beginning of a burst-on section (i.e., during a burst-off section), the audio data packet is placed at the very end of the corresponding section.

Thirdly, during a main service data section within the burst-off section after the burst-on section, the audio data packet is positioned at the very end of the main service data section. Finally, the data packets other than audio data packets are positioned in accordance with the inputted order in vacant spaces (i.e., spaces that are not designated for the audio data packets). Meanwhile, when the positions of the main service data packets are relatively re-adjusted, associated program clock reference (PCR) values may also be modified accordingly. The PCR value corresponds to a time reference value for synchronizing the time of the MPEG decoder. Herein, the PCR value is inserted in a specific region of a TS packet and then transmitted.

In the example of the present invention, the packet jitter mitigator 220 also performs the operation of modifying the PCR value. The output of the packet jitter mitigator 220 is inputted to the packet multiplexer 240. As described above, the packet multiplexer 240 multiplexes the main service data packet outputted from the packet jitter mitigator 220 with the mobile service data packet outputted from the pre-processor 230 into a burst structure in accordance with a pre-determined multiplexing rule. Then, the packet multiplexer 240 outputs the multiplexed data packets to the data randomizer 251 of the post-processor 250.

If the inputted data correspond to the main service data packet, the data randomizer 251 performs the same randomizing process as that of the conventional randomizer. More specifically, the synchronization byte within the main service data packet is deleted. Then, the remaining 187 data bytes are randomized by using a pseudo random byte generated from the data randomizer 251. Thereafter, the randomized data are outputted to the RS encoder/non-systematic RS encoder 252.

On the other hand, if the inputted data correspond to the mobile service data packet, the data randomizer 251 may randomize only a portion of the data packet. For example, if it is assumed that a randomizing process has already been performed in advance on the mobile service data packet by the pre-processor 230, the data randomizer 251 deletes the synchronization byte from the 4-byte MPEG header included in the mobile service data packet and, then, performs the randomizing process only on the remaining 3 data bytes of the MPEG header. Thereafter, the randomized data bytes are outputted to the RS encoder/non-systematic RS encoder 252. More specifically, the randomizing process is not performed on the remaining portion of the mobile service data excluding the MPEG header. In other words, the remaining portion of the mobile service data packet is directly outputted to the RS encoder/non-systematic RS encoder 252 without being randomized. Also, the data randomizer 251 may or may not perform a randomizing process on the known data (or known data place holders) and the initialization data place holders included in the mobile service data packet.

The RS encoder/non-systematic RS encoder 252 performs an RS encoding process on the data being randomized by the data randomizer 251 or on the data bypassing the data randomizer 251, so as to add 20 bytes of RS parity data. Thereafter, the processed data are outputted to the data interleaver 253. Herein, if the inputted data correspond to the main service data packet, the RS encoder/non-systematic RS encoder 252 performs the same systematic RS encoding process as that of the conventional broadcasting system, thereby adding the 20-byte RS parity data at the end of the 187-byte data. Alternatively, if the inputted data correspond to the mobile service data packet, the RS encoder/non-systematic RS encoder 252 performs a non-systematic RS encoding process. At this point, the 20-byte RS parity data obtained from the non-systematic RS encoding process are inserted in a pre-decided parity byte place within the mobile service data packet.

The data interleaver 253 corresponds to a byte unit convolutional interleaver. The output of the data interleaver 253 is inputted to the parity replacer 254 and to the non-systematic RS encoder 255. Meanwhile, a process of initializing a memory within the trellis encoding module 256 is primarily required in order to decide the output data of the trellis encoding module 256, which is located after the parity replacer 254, as the known data pre-defined according to an agreement between the receiving system and the transmitting system. More specifically, the memory of the trellis encoding module 256 should first be initialized before the received known data sequence is trellis-encoded. At this point, the beginning portion of the known data sequence that is received corresponds to the initialization data place holder and not to the actual known data. Herein, the initialization data place holder has been included in the data by the group formatter within the pre-processor 230 in an earlier process. Therefore, the process of generating initialization data and replacing the initialization data place holder of the corresponding memory with the generated initialization data are required to be performed immediately before the inputted known data sequence is trellis-encoded.

Additionally, a value of the trellis memory initialization data is decided and generated based upon a memory status of the trellis encoding module 256. Further, due to the newly replaced initialization data, a process of newly calculating the RS parity and replacing the RS parity, which is outputted from the data interleaver 253, with the newly calculated RS parity is required. Therefore, the non-systematic RS encoder 255 receives the mobile service data packet including the initialization data place holders, which are to be replaced with the actual initialization data, from the data interleaver 253 and also receives the initialization data from the trellis encoding module 256.

Among the inputted mobile service data packet, the initialization data place holders are replaced with the initialization data, and the RS parity data that are added to the mobile service data packet are removed and processed with non-systematic RS encoding. Thereafter, the new RS parity obtained by performing the non-systematic RS encoding process is outputted to the parity replacer 255. Accordingly, the parity replacer 255 selects the output of the data interleaver 253 as the data within the mobile service data packet, and the parity replacer 255 selects the output of the non-systematic RS encoder 255 as the RS parity. The selected data are then outputted to the trellis encoding module 256.

Meanwhile, if the main service data packet is inputted or if the mobile service data packet, which does not include any initialization data place holders that are to be replaced, is inputted, the parity replacer 254 selects the data and RS parity that are outputted from the data interleaver 253. Then, the parity replacer 254 directly outputs the selected data to the trellis encoding module 256 without any modification. The trellis encoding module 256 converts the byte-unit data to symbol units and performs a 12-way interleaving process so as to trellis-encode the received data. Thereafter, the processed data are outputted to the synchronization multiplexer 260.

The synchronization multiplexer 260 inserts a field synchronization signal and a segment synchronization signal to the data outputted from the trellis encoding module 256 and, then, outputs the processed data to the pilot inserter 271 of the transmission unit 270. Herein, the data having a pilot inserted therein by the pilot inserter 271 are modulated by the modulator 272 in accordance with a pre-determined modulating method (e.g., a VSB method). Thereafter, the modulated data are transmitted to each receiving system though the radio frequency (RF) up-converter 273.

Block Processor

Figure 9:
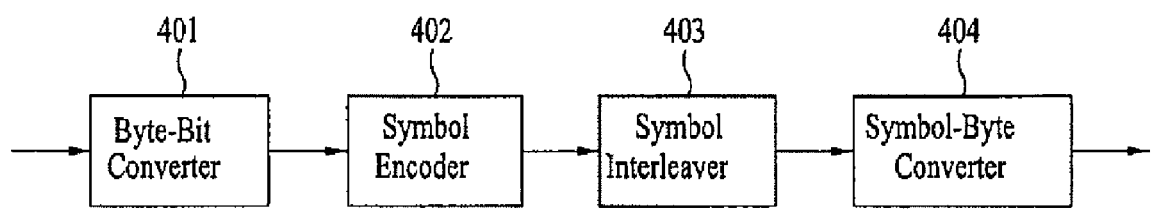
FIG. 9 illustrates a block diagram of a block processor according to an embodiment of the present invention.

FIG. 9 illustrates a block diagram showing a structure of a block processor according to the present invention. Herein, the block processor includes a byte-bit converter 401, a symbol encoder 402, a symbol interleaver 403, and a symbol-byte converter 404. The byte-bit converter 401 divides the mobile service data bytes that are inputted from the RS frame encoder 112 into bits, which are then outputted to the symbol encoder 402. The byte-bit converter 401 may also receive signaling information including transmission parameters. The signaling information data bytes are also divided into bits so as to be outputted to the symbol encoder 402. Herein, the signaling information including transmission parameters may be processed with the same data processing step as that of the mobile service data. More specifically, the signaling information may be inputted to the block processor 303 by passing through the data randomizer 301 and the RS frame encoder 302. Alternatively, the signaling information may also be directly outputted to the block processor 303 without passing though the data randomizer 301 and the RS frame encoder 302.

The symbol encoder 402 corresponds to a G/H-rate encoder encoding the inputted data from G bits to H bits and outputting the data encoded at the coding rate of G/H. According to the embodiment of the present invention, it is assumed that the symbol encoder 402 performs either a coding rate of ½ (also referred to as a ½-rate encoding process) or an encoding process at a coding rate of ¼ (also referred to as a ¼-rate encoding process). The symbol encoder 402 performs one of ½-rate encoding and ¼-rate encoding on the inputted mobile service data and signaling information. Thereafter, the signaling information is also recognized as the mobile service data and processed accordingly.

In case of performing the ½-rate coding process, the symbol encoder 402 receives 1 bit and encodes the received 1 bit to 2 bits (i.e., 1 symbol). Then, the symbol encoder 402 outputs the processed 2 bits (or 1 symbol). On the other hand, in case of performing the ¼-rate encoding process, the symbol encoder 402 receives 1 bit and encodes the received 1 bit to 4 bits (i.e., 2 symbols). Then, the symbol encoder 402 outputs the processed 4 bits (or 2 symbols).

Figure 10:
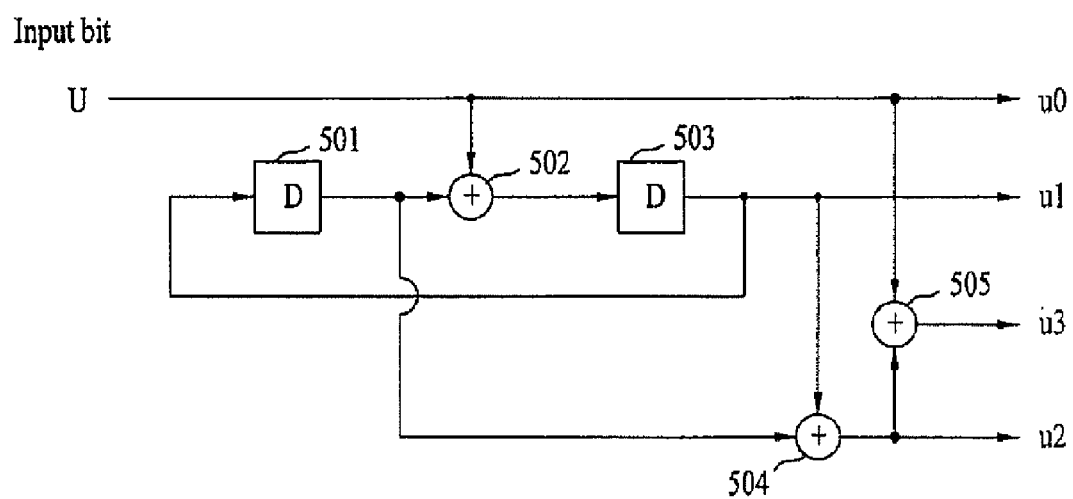
FIG. 10 illustrates a detailed block diagram of a symbol encoder of FIG. 9.

FIG. 10 illustrates a detailed block diagram of the symbol encoder 402 shown in FIG. 9. The symbol encoder 402 includes two delay units 501 and 503 and three adders 502, 504, and 505. Herein, the symbol encoder 402 encodes an input data bit U and outputs the coded bit U to 4 bits (u0 to u4). At this point, the data bit U is directly outputted as uppermost bit u0 and simultaneously encoded as lower bit u1u2u3 and then outputted. More specifically, the input data bit U is directly outputted as the uppermost bit u0 and simultaneously outputted to the first and third adders 502 and 505. The first adder 502 adds the input data bit U and the output bit of the first delay unit 501 and, then, outputs the added bit to the second delay unit 503. Then, the data bit delayed by a pre-determined time (e.g., by 1 clock) in the second delay unit 503 is outputted as lower bit u1 and simultaneously fed-back to the first delay unit 501. The first delay unit 501 delays the data bit fed-back from the second delay unit 503 by a pre-determined time (e.g., by 1 clock). Then, the first delay unit 501 outputs the delayed data bit to the first adder 502 and the second adder 504. The second adder 504 adds the data bits outputted from the first and second delay units 501 and 503 as a lower bit u2. The third adder 505 adds the input data bit U and the output of the second delay unit 503 and outputs the added data bit as a lower bit u3.

At this point, if the input data bit U corresponds to data encoded at a ½-coding rate, the symbol encoder 402 configures a symbol with u1u0 bits from the 4 output bits u0u1u2u3. Then, the symbol encoder 402 outputs the newly configured symbol. Alternatively, if the input data bit U corresponds to data encoded at a ¼-coding rate, the symbol encoder 402 configures and outputs a symbol with bits u1u0 and, then, configures and outputs another symbol with bits u2u3.

According to another embodiment of the present invention, if the input data bit U corresponds to data encoded at a ¼-coding rate, the symbol encoder 402 may also configure and output a symbol with bits u1u0, and then repeat the process once again and output the corresponding bits u0u1u2u3. According to yet another embodiment of the present invention, the symbol encoder outputs all four output bits U u0u1u2u3. Then, when using the ½-coding rate, the symbol interleaver 403 located behind the symbol encoder 402 selects only the symbol configured of bits u1u0 from the four output bits u0u1u2u3. Alternatively, when using the ¼-coding rate, the symbol interleaver 403 may select the symbol configured of bits u1u0 and then select another symbol configured of bits u2u3. According to another embodiment, when using the ¼-coding rate, the symbol interleaver 403 may repeatedly select the symbol configured of bits u1u0.

The output of the symbol encoder 402 is inputted to the symbol interleaver 403. Then, the symbol interleaver 403 performs block interleaving in symbol units on the data outputted from the symbol encoder 402. Any interleaver performing structural rearrangement (or realignment) may be applied as the symbol interleaver 403 of the block processor. However, in the present invention, a variable length symbol interleaver that can be applied even when a plurality of lengths is provided for the symbol, so that its order may be rearranged, may also be used.

Figure 11:
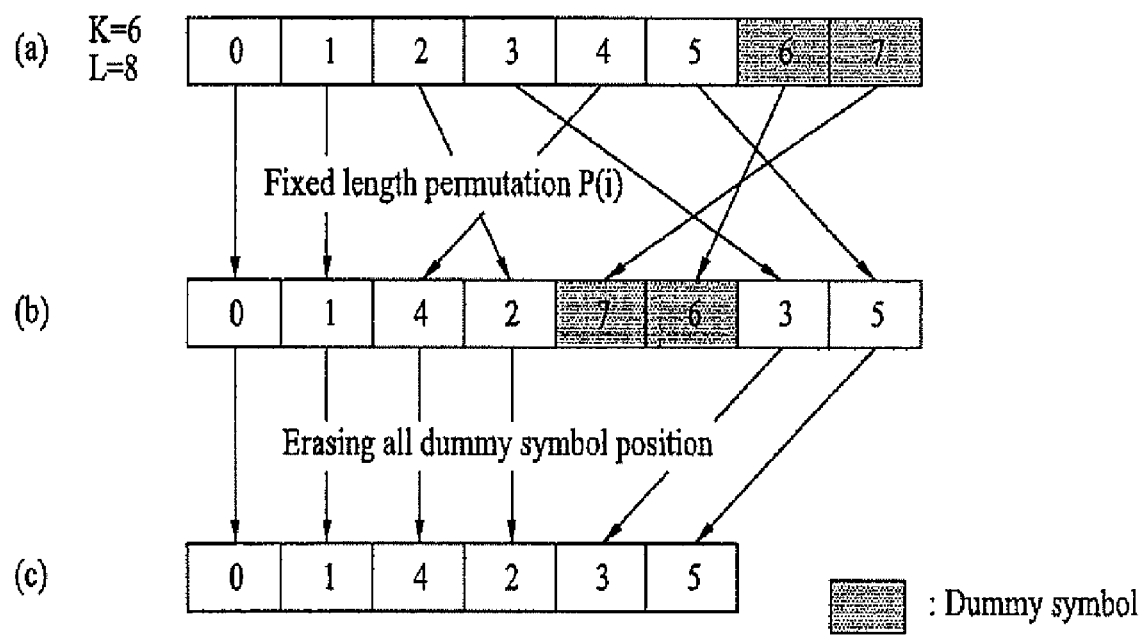
FIG. 11(a) to FIG. 11(c) illustrates an example of a variable length interleaving process of a symbol interleaver shown in FIG. 9.

FIG. 11 illustrates a symbol interleaver according to an embodiment of the present invention. Herein, the symbol interleaver according to the embodiment of the present invention corresponds to a variable length symbol interleaver that may be applied even when a plurality of lengths is provided for the symbol, so that its order may be rearranged. Particularly, FIG. 11 illustrates an example of the symbol interleaver when K=6 and L=8. Herein, K indicates a number of symbols that are outputted for symbol interleaving from the symbol encoder 402. And, L represents a number of symbols that are actually interleaved by the symbol interleaver 403.

In the present invention, the symbol intereleaver 403 should satisfy the conditions of L=$2^n$ (wherein n is an integer) and of L≧K. If there is a difference in value between K and L, (L−K) number of null (or dummy) symbols is added, thereby creating an interleaving pattern. Therefore, K becomes a block size of the actual symbols that are inputted to the symbol interleaver 403 in order to be interleaved. L becomes an interleaving unit when the interleaving process is performed by an interleaving pattern created from the symbol interleaver 403. The example of what is described above is illustrated in FIG. 11.

More specifically, FIG. 11(a) to FIG. 11(c) illustrate a variable length interleaving process of a symbol interleaver shown in FIG. 9. The number of symbols outputted from the symbol encoder 402 in order to be interleaved is equal to 6 (i.e., K=6). In other words, 6 symbols are outputted from the symbol encoder 402 in order to be interleaved. And, the actual interleaving unit (L) is equal to 8 symbols. Therefore, as shown in FIG. 11(a), 2 symbols are added to the null (or dummy) symbol, thereby creating the interleaving pattern. Equation 2 shown below described the process of sequentially receiving K number of symbols, the order of which is to be rearranged, and obtaining an L value satisfying the conditions of L=$2^n$ (wherein n is an integer) and of L≧K, thereby creating the interleaving so as to realign (or rearrange) the symbol order.

In relation to all places, wherein 0≦i≦L−1, $$P(i)=\{S \times i \times (i+1)/2\} \bmod L \qquad \text{Equation 2}$$

Herein, L≧K, L=$2^n$, and n and S are integers. Referring to FIG. 11, it is assumed that S is equal to 89, and that L is equal to 8, and FIG. 11 illustrates the created interleaving pattern and an example of the interleaving process. As shown in FIG. 11(b), the order of K number of input symbols and (L−K) number of null symbols is rearranged by using the above-mentioned Equation 2. Then, as shown in FIG. 11(c), the null byte places are removed, so as to rearrange the order, by using Equation 3 shown below. Thereafter, the symbol that is interleaved by the rearranged order is then outputted to the symbol-byte converter.

if $P(i)>K-1$, then $P(i)$ place is removed and rearranged $\qquad$ Equation 3

Subsequently, the symbol-byte converter 404 converts to bytes the mobile service data symbols, having the rearranging of the symbol order completed and then outputted in accordance with the rearranged order, and thereafter outputs the converted bytes to the group formatter 304.

Figure 12A:
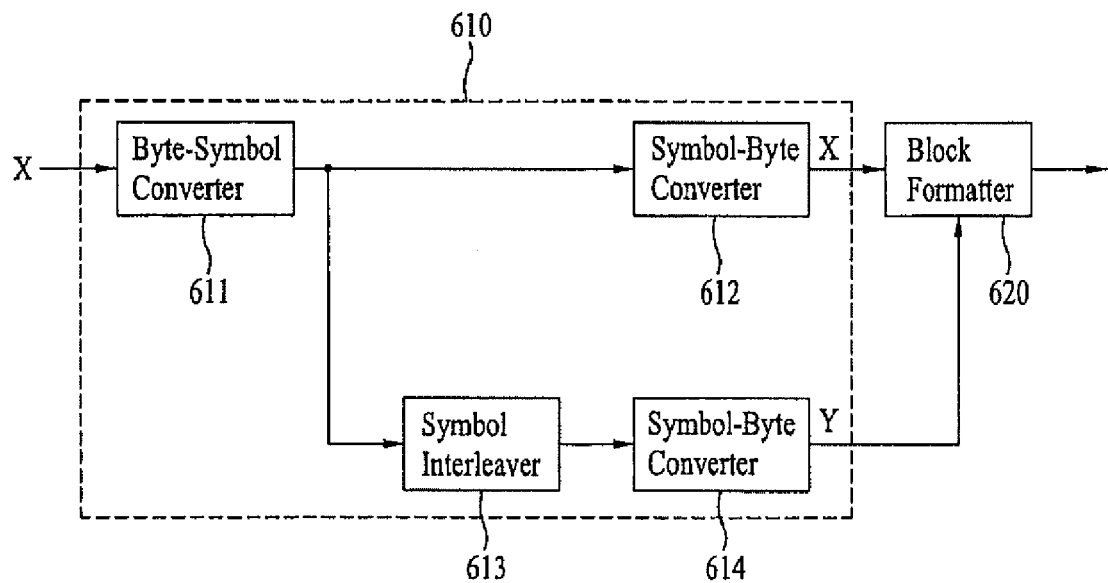
FIG. 12A and FIG. 12B respectively illustrate block diagrams of a block processor according to another embodiment of the present invention.

FIG. 12A illustrates a block diagram showing the structure of a block processor according to another embodiment of the present invention. Herein, the block processor includes an interleaving unit 610 and a block formatter 620. The interleaving unit 610 may include a byte-symbol converter 611, a symbol-byte converter 612, a symbol interleaver 613, and a symbol-byte converter 614. Herein, the symbol interleaver 613 may also be referred to as a block interleaver.

The byte-symbol converter 611 of the interleaving unit 610 converts the mobile service data X outputted in byte units from the RS frame encoder 302 to symbol units. Then, the byte-symbol converter 611 outputs the converted mobile service data symbols to the symbol-byte converter 612 and the symbol interleaver 613. More specifically, the byte-symbol converter 611 converts each 2 bits of the inputted mobile service data byte (=8 bits) to 1 symbol and outputs the converted symbols. This is because the input data of the trellis encoding module 256 consist of symbol units configured of 2 bits. The relationship between the block processor 303 and the trellis encoding module 256 will be described in detail in a later process. At this point, the byte-symbol converter 611 may also receive signaling information including transmission parameters. Furthermore, the signaling information bytes may also be divided into symbol units and then outputted to the symbol-byte converter 612 and the symbol interleaver 613.

Figure 12B:
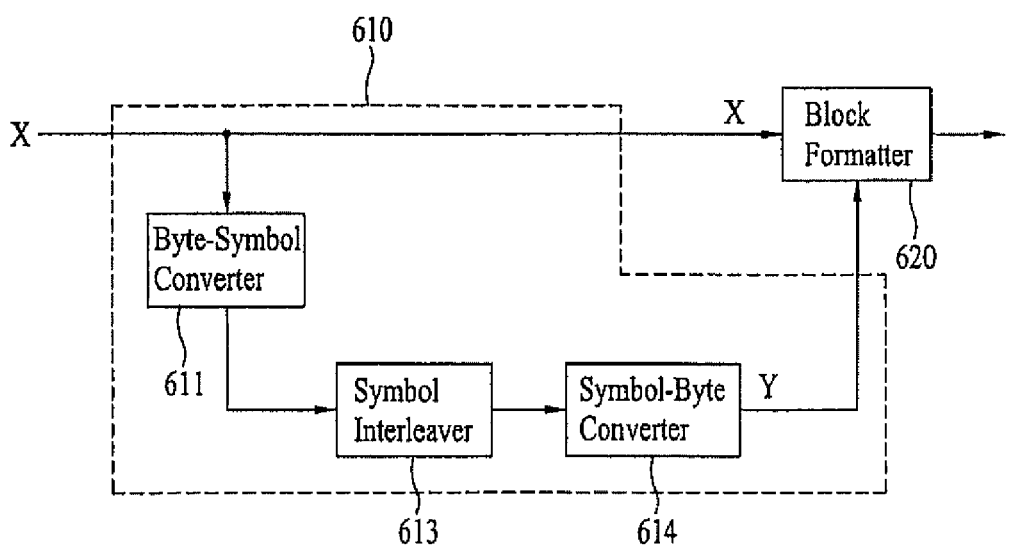

The symbol-byte converter 612 groups 4 symbols outputted from the byte-symbol converter 611 so as to configure a byte. Thereafter, the converted data bytes are outputted to the block formatter 620. Herein, each of the symbol-byte converter 612 and the byte-symbol converter 611 respectively performs an inverse process on one another. Therefore, the yield of these two blocks is offset. Accordingly, as shown in FIG. 12B, the input data X bypass the byte-symbol converter 611 and the symbol-byte converter 612 and are directly inputted to the block formatter 620. More specifically, the interleaving unit 610 of FIG. 12B has a structure equivalent to that of the interleaving unit shown in FIG. 12A. Therefore, the same reference numerals will be used in FIG. 12A and FIG. 12B.

The symbol interleaver 613 performs block interleaving in symbol units on the data that are outputted from the byte-symbol converter 611. Subsequently, the symbol interleaver 613 outputs the interleaved data to the symbol-byte converter 614. Herein, any type of interleaver that can rearrange the structural order may be used as the symbol interleaver 613 of the present invention. In the example given in the present invention, a variable length interleaver that may be applied for symbols having a wide range of lengths, the order of which is to be rearranged. For example, the symbol interleaver of FIG. 11 may also be used in the block processor shown in FIG. 12A and FIG. 12B.

Figure 13:
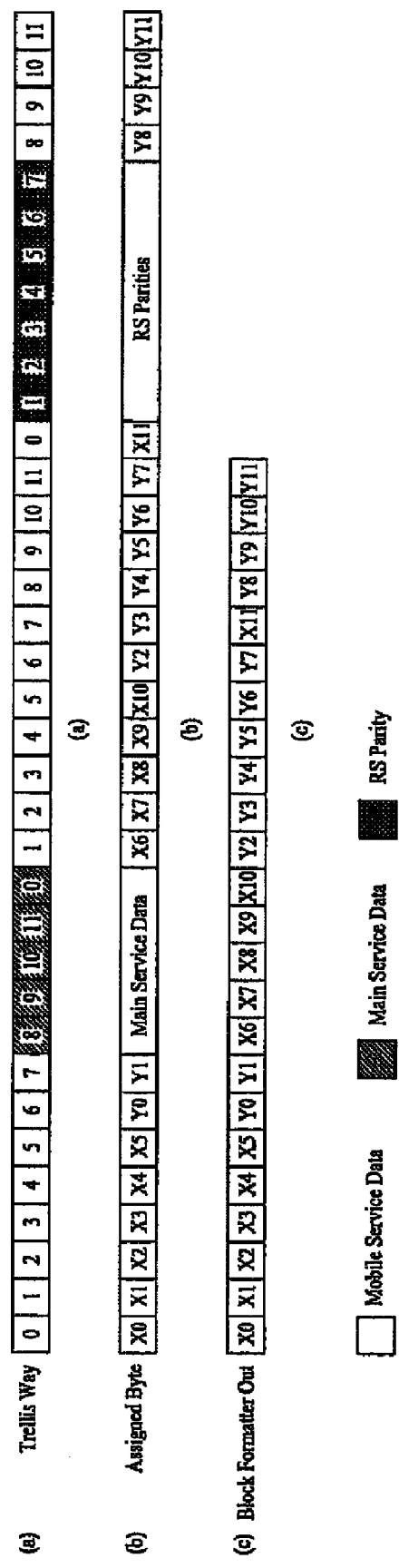
FIG. 13(a) to FIG. 13(c) illustrates an example of a block encoding and trellis encoding processes according to the present invention.

The symbol-byte converter 614 outputs the symbols having the rearranging of the symbol order completed, in accordance with the rearranged order. Thereafter, the symbols are grouped to be configured in byte units, which are then outputted to the block formatter 620. More specifically, the symbol-byte converter 614 groups 4 symbols outputted from the symbol interleaver 613 so as to configure a data byte. As shown in FIG. 13, the block formatter 620 performs the process of aligning the output of each symbol-byte converter 612 and 614 within the block in accordance with a set standard. Herein, the block formatter 620 operates in association with the trellis encoding module 256.

More specifically, the block formatter 620 decides the output order of the mobile service data outputted from each symbol-byte converter 612 and 614 while taking into consideration the place (or order) of the data excluding the mobile service data that are being inputted, wherein the mobile service data include main service data, known data, RS parity data, and MPEG header data.

Figure 14:
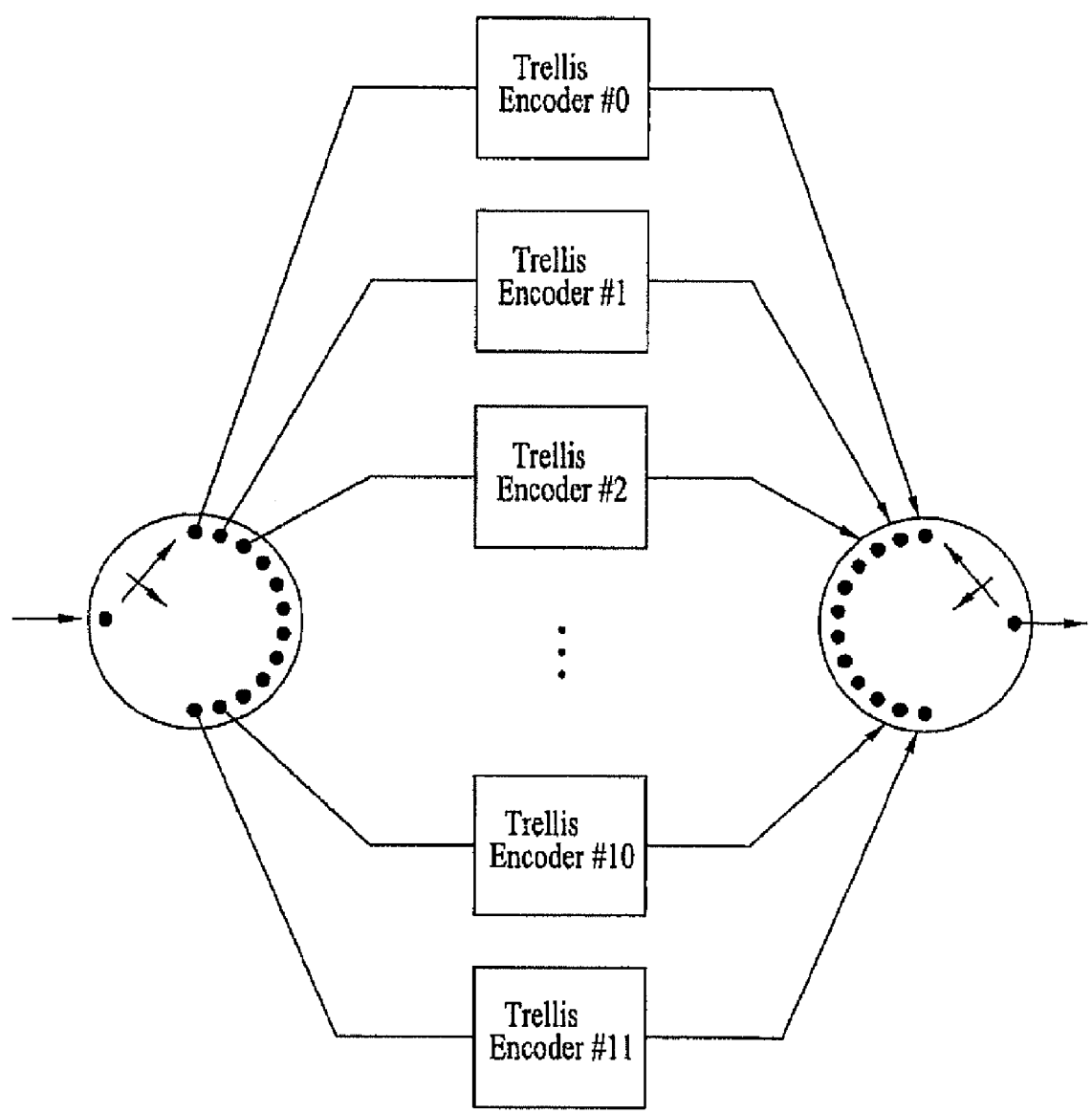
FIG. 14 illustrates a block diagram of a trellis encoding module according to an embodiment of the present invention.

According to the embodiment of the present invention, the trellis encoding module 256 is provided with 12 trellis encoders. FIG. 14 illustrates a block diagram showing the trellis encoding module 256 according to the present invention. In the example shown in FIG. 14, 12 identical trellis encoders are combined to the interleaver in order to disperse noise. Herein, each trellis encoder may be provided with a pre-coder.

Figure 15A:
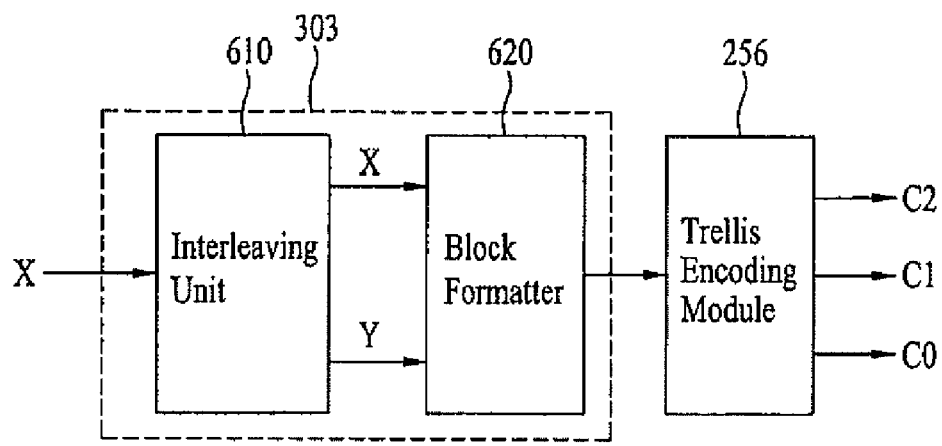
FIG. 15A and FIG. 15B illustrate a block processor and a trellis encoding module being connected to one another according to the present invention.
Figure 15B:
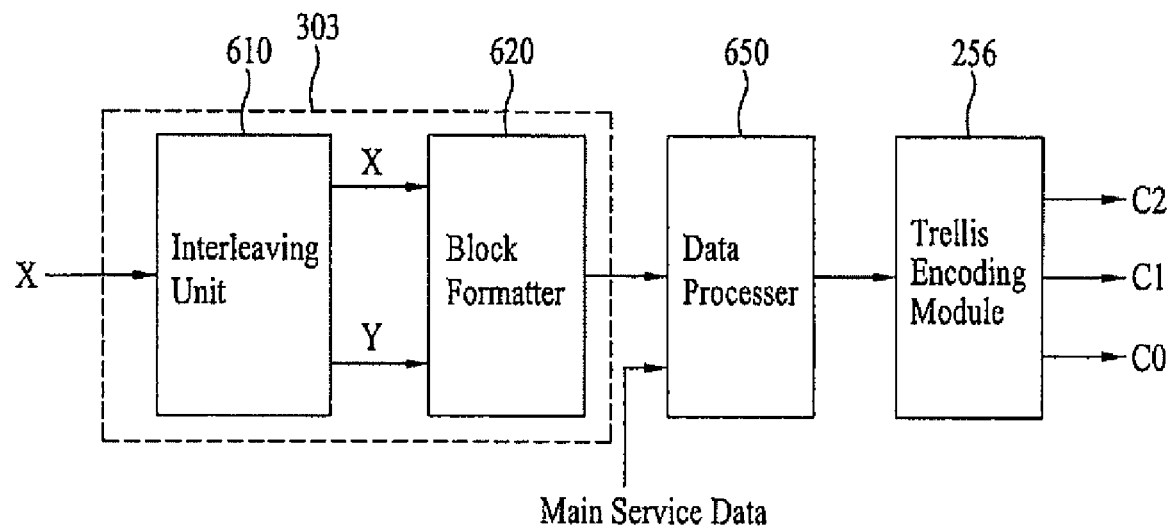

FIG. 15A illustrates the block processor 303 being concatenated with the trellis encoding module 256. In the transmitting system, a plurality of blocks actually exists between the pre-processor 230 including the block processor 303 and the trellis encoding module 256, as shown in FIG. 3. Conversely, the receiving system considers the pre-processor 230 to be concatenated with the trellis encoding module 256, thereby performing the decoding process accordingly. However, the data excluding the mobile service data that are being inputted to the trellis encoding module 256, wherein the mobile service data include main service data, known data, RS parity data, and MPEG header data, correspond to data that are added to the blocks existing between the block processor 303 and the trellis encoding module 256. FIG. 15B illustrates an example of a data processor 650 being positioned between the block processor 303 and the trellis encoding module 256, while taking the above-described instance into consideration.

Herein, when the interleaving unit 610 of the block processor 303 performs a ½-rate encoding process, the interleaving unit 610 may be configured as shown in FIG. 12A (or FIG. 12B). Referring to FIG. 3, for example, the data processor 650 may include a group formatter 304, a data deinterleaver 305, a packet formatter 306, a packet multiplexer 240, and a post-processor 250, wherein the post-processor 250 includes a data randomizer 251, a RS encoder/non-systematic RS encoder 252, a data interleaver 253, a parity replacer 254, and a non-systematic RS encoder 255.

At this point, the trellis encoding module 256 symbolizes the data that are being inputted so as to divide the symbolized data and to send the divided data to each trellis encoder in accordance with a pre-defined method. Herein, one byte is converted into 4 symbols, each being configured of 2 bits. Also, the symbols created from the single data byte are all transmitted to the same trellis encoder. Accordingly, each trellis encoder pre-codes an upper bit of the input symbol, which is then outputted as the uppermost output bit C2. Alternatively, each trellis encoder trellis-encodes a lower bit of the input symbol, which is then outputted as two output bits C1 and C0. The block formatter 620 is controlled so that the data byte outputted from each symbol-byte converter can be transmitted to different trellis encoders.

Hereinafter, the operation of the block formatter 620 will now be described in detail with reference to FIG. 9 to FIG. 12. Referring to FIG. 12A, for example, the data byte outputted from the symbol-byte converter 612 and the data byte outputted from the symbol-byte converter 614 are inputted to different trellis encoders of the trellis encoding module 256 in accordance with the control of the block formatter 620. Hereinafter, the data byte outputted from the symbol-byte converter 612 will be referred to as X, and the data byte outputted from the symbol-byte converter 614 will be referred to as Y, for simplicity. Referring to FIG. 13(a), each number (i.e., 0 to 11) indicates the first to twelfth trellis encoders of the trellis encoding module 256, respectively.

In addition, the output order of both symbol-byte converters are arranged (or aligned) so that the data bytes outputted from the symbol-byte converter 612 are respectively inputted to the $0^{th}$ to $5^{th}$ trellis encoders (0 to 5) of the trellis encoding module 256, and that the data bytes outputted from the symbol-byte converter 614 are respectively inputted to the $6^{th}$ to $11^{th}$ trellis encoders (6 to 11) of the trellis encoding module 256. Herein, the trellis encoders having the data bytes outputted from the symbol-byte converter 612 allocated therein, and the trellis encoders having the data bytes outputted from the symbol-byte converter 614 allocated therein are merely examples given to simplify the understanding of the present invention. Furthermore, according to an embodiment of the present invention, and assuming that the input data of the block processor 303 correspond to a block configured of 12 bytes, the symbol-byte converter 612 outputs 12 data bytes from X0 to X11, and the symbol-byte converter 614 outputs 12 data bytes from Y0 to Y11.

FIG. 13(b) illustrates an example of data being inputted to the trellis encoding module 256. Particularly, FIG. 13(b) illustrates an example of not only the mobile service data but also the main service data and RS parity data being inputted to the trellis encoding module 256, so as to be distributed to each trellis encoder. More specifically, the mobile service data outputted from the block processor 303 pass through the group formatter 304, from which the mobile service data are mixed with the main service data and RS parity data and then outputted, as shown in FIG. 13(a). Accordingly, each data byte is respectively inputted to the 12 trellis encoders in accordance with the positions (or places) within the data group after being data-interleaved.

Herein, when the output data bytes X and Y of the symbol-byte converters 612 and 614 are allocated to each respective trellis encoder, the input of each trellis encoder may be configured as shown in FIG. 13(b). More specifically, referring to FIG. 13(b), the six mobile service data bytes (X0 to X5) outputted from the symbol-byte converter 612 are sequentially allocated (or distributed) to the first to sixth trellis encoders (0 to 5) of the trellis encoding module 256. Also, the 2 mobile service data bytes Y0 and Y1 outputted from the symbol-byte converter 614 are sequentially allocated to the $7^{th}$ and $8^{th}$ trellis encoders (6 and 7) of the trellis encoding module 256. Thereafter, among the 5 main service data bytes, 4 data bytes are sequentially allocated to the $9^{th}$ and $12^{th}$ trellis encoders (8 to 11) of the trellis encoding module 256. Finally, the remaining 1 byte of the main service data byte is allocated once again to the first trellis encoder (0).

It is assumed that the mobile service data, the main service data, and the RS parity data are allocated to each trellis encoder, as shown in FIG. 13(b). It is also assumed that, as described above, the input of the block processor 303 is configured of 12 bytes, and that 12 bytes from X0 to X11 are outputted from the symbol-byte converter 612, and that 12 bytes from Y0 to Y11 are outputted from the symbol-byte converter 614. In this case, as shown in FIG. 13(c), the block formatter 620 arranges the data bytes that are to be outputted from the symbol-byte converters 612 and 614 by the order of X0 to X5, Y0, Y1, X5 to X10, Y2 to Y7, X11, and Y8 to Y11. More specifically, the trellis encoder that is to perform the encoding process is decided based upon the position (or place) within the transmission frame in which each data byte is inserted. At this point, not only the mobile service data but also the main service data, the MPEG header data, and the RS parity data are also inputted to the trellis encoding module 256. Herein, it is assumed that, in order to perform the above-described operation, the block formatter 620 is informed of (or knows) the information on the data group format after the data-interleaving process.

Figure 16:
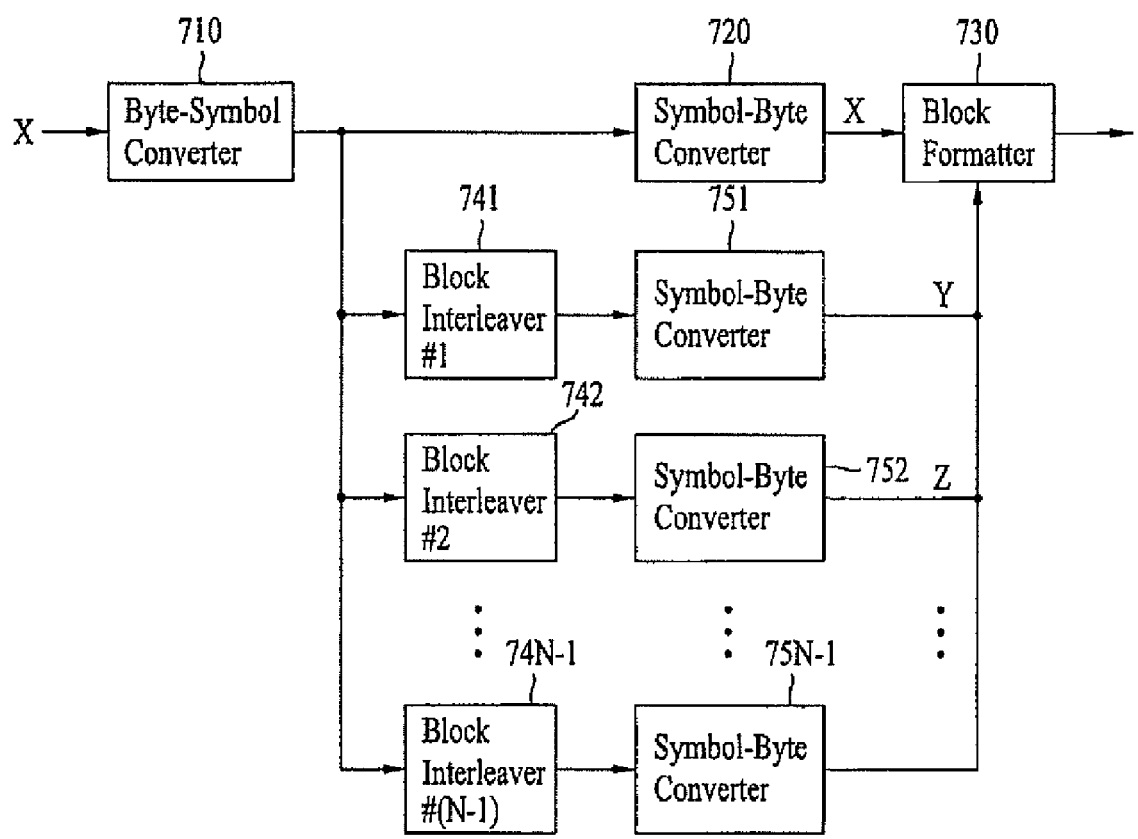
FIG. 16 illustrates a block processor according to yet another embodiment of the present invention.

FIG. 16 illustrates a block diagram of the block processor performing an encoding process at a coding rate of 1/N according to an embodiment of the present invention. Herein, the block processor includes (N−1) number of symbol interleavers 741 to 74N−1, which are configured in a parallel structure. More specifically, the block processor having the coding rate of 1/N consists of a total of N number of branches (or paths) including a branch (or path), which is directly transmitted to the block formatter 730. In addition, the symbol interleaver 741 to 74N−1 of each branch may each be configured of a different symbol interleaver. Furthermore, (N−1) number of symbol-byte converter 751 to 75N−1 each corresponding to each (N−1) number of symbol interleavers 741 to 74N−1 may be included at the end of each symbol interleaver, respectively. Herein, the output data of the (N−1) number of symbol-byte converter 751 to 75N−1 are also inputted to the block formatter 730.

In the example of the present invention, N is equal to or smaller than 12. If N is equal to 12, the block formatter 730 may align the output data so that the output byte of the $12^{th}$ symbol-byte converter 75N−1 is inputted to the $12^{th}$ trellis encoder. Alternatively, if N is equal to 3, the block formatter 730 may arranged the output order, so that the data bytes outputted from the symbol-byte converter 720 are inputted to the $1^{st}$ to $4^{th}$ trellis encoders of the trellis encoding module 256, and that the data bytes outputted from the symbol-byte converter 751 are inputted to the $5^{th}$ to $8^{th}$ trellis encoders, and that the data bytes outputted from the symbol-byte converter 752 are inputted to the $9^{th}$ to $12^{th}$ trellis encoders. At this point, the order of the data bytes outputted from each symbol-byte converter may vary in accordance with the position within the data group of the data other than the mobile service data, which are mixed with the mobile service data that are outputted from each symbol-byte converter.

Figure 17:
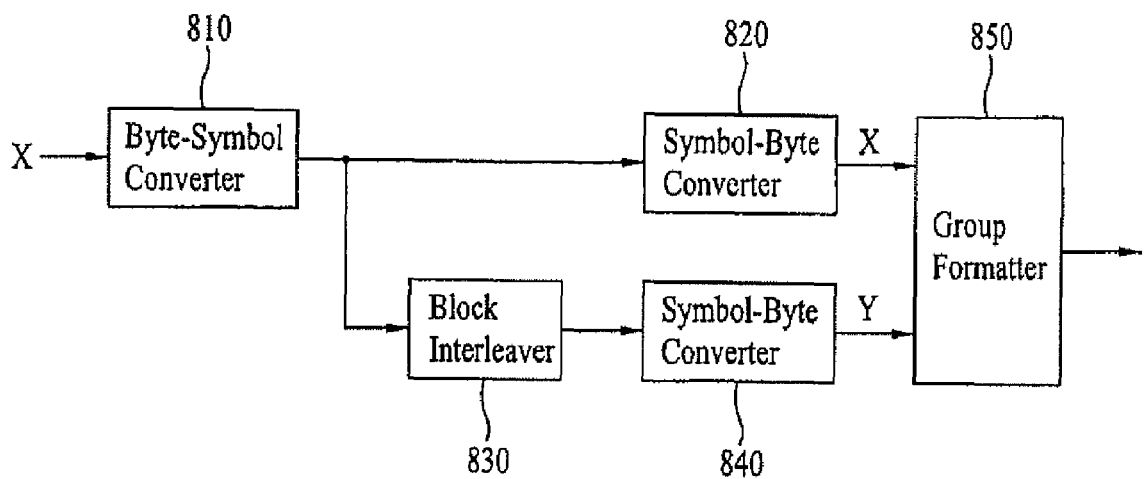
FIG. 17 illustrates a block processor according to yet another embodiment of the present invention.

FIG. 17 illustrates a detailed block diagram showing the structure of a block processor according to another embodiment of the present invention. Herein, the block formatter is removed from the block processor so that the operation of the block formatter may be performed by a group formatter. More specifically, the block processor of FIG. 17 may include a byte-symbol converter 810, symbol-byte converters 820 and 840, and a symbol interleaver 830. In this case, the output of each symbol-byte converter 820 and 840 is inputted to the group formatter 850.

Also, the block processor may obtain a desired coding rate by adding symbol interleavers and symbol-byte converters. If the system designer wishes a coding rate of 1/N, the block processor needs to be provided with a total of N number of branches (or paths) including a branch (or path), which is directly transmitted to the block formatter 850, and (N−1) number of symbol interleavers and symbol-byte converters configured in a parallel structure with (N−1) number of branches. At this point, the group formatter 850 inserts place holders ensuring the positions (or places) for the MPEG header, the non-systematic RS parity, and the main service data. And, at the same time, the group formatter 850 positions the data bytes outputted from each branch of the block processor.

The number of trellis encoders, the number of symbol-byte converters, and the number of symbol interleavers proposed in the present invention are merely exemplary. And, therefore, the corresponding numbers do not limit the spirit or scope of the present invention. It is apparent to those skilled in the art that the type and position of each data byte being allocated to each trellis encoder of the trellis encoding module 256 may vary in accordance with the data group format. Therefore, the present invention should not be understood merely by the examples given in the description set forth herein. The mobile service data that are encoded at a coding rate of 1/N and outputted from the block processor 303 are inputted to the group formatter 304. Herein, in the example of the present invention, the order of the output data outputted from the block formatter of the block processor 303 are aligned and outputted in accordance with the position of the data bytes within the data group.

Signaling Information Processing

The transmitter 200 according to the present invention may insert transmission parameters by using a plurality of methods and in a plurality of positions (or places), which are then transmitted to the receiving system. For simplicity, the definition of a transmission parameter that is to be transmitted from the transmitter to the receiving system will now be described. The transmission parameter includes data group information, region information within a data group, the number of RS frames configuring a super frame (i.e., a super frame size (SFS)), the number of RS parity data bytes (P) for each column within the RS frame, whether or not a checksum, which is added to determine the presence of an error in a row direction within the RS frame, has been used, the type and size of the checksum if the checksum is used (presently, 2 bytes are added to the CRC), the number of data groups configuring one RS frame—since the RS frame is transmitted to one burst section, the number of data groups configuring the one RS frame is identical to the number of data groups within one burst (i.e., burst size (BS)), a turbo code mode, and a RS code mode.

Also, the transmission parameter required for receiving a burst includes a burst period—herein, one burst period corresponds to a value obtained by counting the number of fields starting from the beginning of a current burst until the beginning of a next burst, a positioning order of the RS frames that are currently being transmitted within a super frame (i.e., a permuted frame index (PFI)) or a positioning order of groups that are currently being transmitted within a RS frame (burst) (i.e., a group index (GI)), and a burst size. Depending upon the method of managing a burst, the transmission parameter also includes the number of fields remaining until the beginning of the next burst (i.e., time to next burst (TNB)). And, by transmitting such information as the transmission parameter, each data group being transmitted to the receiving system may indicate a relative distance (or number of fields) between a current position and the beginning of a next burst.

The information included in the transmission parameter corresponds to examples given to facilitate the understanding of the present invention. Therefore, the proposed examples do not limit the scope or spirit of the present invention and may be easily varied or modified by anyone skilled in the art. According to the first embodiment of the present invention, the transmission parameter may be inserted by allocating a predetermined region of the mobile service data packet or the data group. In this case, the receiving system performs synchronization and equalization on a received signal, which is then decoded by symbol units. Thereafter, the packet deformatter may separate the mobile service data and the transmission parameter so as to detect the transmission parameter. According to the first embodiment, the transmission parameter may be inserted from the group formatter 304 and then transmitted.

According to the second embodiment of the present invention, the transmission parameter may be multiplexed with another type of data. For example, when known data are multiplexed with the mobile service data, a transmission parameter may be inserted, instead of the known data, in a place (or position) where a known data byte is to be inserted. Alternatively, the transmission parameter may be mixed with the known data and then inserted in the place where the known data byte is to be inserted. According to the second embodiment, the transmission parameter may be inserted from the group formatter 304 or from the packet formatter 306 and then transmitted.

According to a third embodiment of the present invention, the transmission parameter may be inserted by allocating a portion of a reserved region within a field synchronization segment of a transmission frame. In this case, since the receiving system may perform decoding on a receiving signal by symbol units before detecting the transmission parameter, the transmission parameter having information on the processing methods of the block processor 303 and the group formatter 304 may be inserted in a reserved field of a field synchronization signal. More specifically, the receiving system obtains field synchronization by using a field synchronization segment so as to detect the transmission parameter from a pre-decided position. According to the third embodiment, the transmission parameter may be inserted from the synchronization multiplexer 240 and then transmitted.

According to the fourth embodiment of the present invention, the transmission parameter may be inserted in a layer (or hierarchical region) higher than a transport stream (TS) packet. In this case, the receiving system should be able to receive a signal and process the received signal to a layer higher than the TS packet in advance. At this point, the transmission parameter may be used to certify the transmission parameter of a currently received signal and to provide the transmission parameter of a signal that is to be received in a later process.

In the present invention, the variety of transmission parameters associated with the transmission signal may be inserted and transmitted by using the above-described methods according to the first to fourth embodiment of the present invention. At this point, the transmission parameter may be inserted and transmitted by using only one of the four embodiments described above, or by using a selection of the above-described embodiments, or by using all of the above-described embodiments. Furthermore, the information included in the transmission parameter may be duplicated and inserted in each embodiment. Alternatively, only the required information may be inserted in the corresponding position of the corresponding embodiment and then transmitted. Furthermore, in order to ensure robustness of the transmission parameter, a block encoding process of a short cycle (or period) may be performed on the transmission parameter and, then, inserted in a corresponding region. The method for performing a short-period block encoding process on the transmission parameter may include, for example, Kerdock encoding, BCH encoding, RS encoding, and repetition encoding of the transmission parameter. Also, a combination of a plurality of block encoding methods may also be performed on the transmission parameter.

The transmission parameters may be grouped to create a block code of a small size, so as to be inserted in a byte place allocated within the data group for signaling and then transmitted. However, in this case, the block code passes through the block decoded from the receiving end so as to obtain a transmission parameter value. Therefore, the transmission parameters of the turbo code mode and the RS code mode, which are required for block decoding, should first be obtained. Accordingly, the transmission parameters associated with a particular mode may be inserted in a specific section of a known data region. And, in this case, a correlation of with a symbol may be used for a faster decoding process. The receiving system refers to the correlation between each sequence and the currently received sequences, thereby determining the encoding mode and the combination mode.

Meanwhile, when the transmission parameter is inserted in the field synchronization segment region or the known data region and then transmitted, and when the transmission parameter has passed through the transmission channel, the reliability of the transmission parameter is deteriorated. Therefore, one of a plurality of pre-defined patterns may also be inserted in accordance with the corresponding transmission parameter. Herein, the receiving system performs a correlation calculation between the received signal and the pre-defined patterns so as to recognize the transmission parameter. For example, it is assumed that a burst including 5 data groups is pre-decided as pattern A based upon an agreement between the transmitting system and the receiving system. In this case, the transmitting system inserts and transmits pattern A, when the number of groups within the burst is equal to 5. Thereafter, the receiving system calculates a correlation between the received data and a plurality of reference patterns including pattern A, which was created in advance. At this point, if the correlation value between the received data and pattern A is the greatest, the received data indicates the corresponding parameter, and most particularly, the number of groups within the burst. At this point, the number of groups may be acknowledged as 5. Hereinafter, the process of inserting and transmitting the transmission parameter will now be described according to first, second, and third embodiments of the present invention.

First Embodiment

Figure 18:
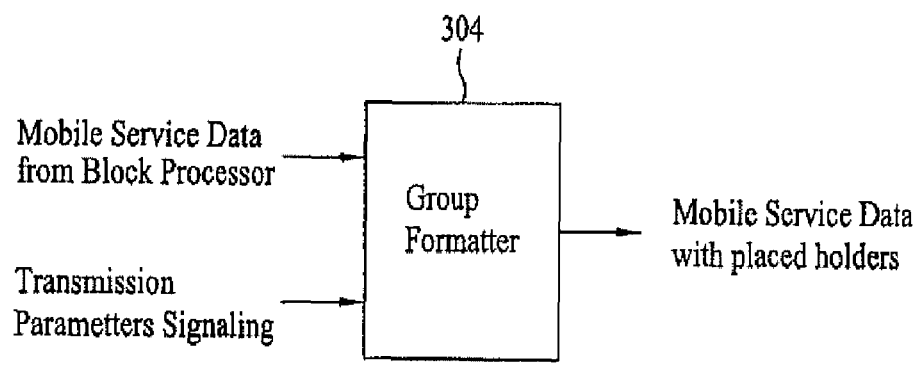
FIG. 18 illustrates an example of a group formatter inserting and transmitting a transmission parameter.

FIG. 18 illustrates a schematic diagram of the group formatter 304 receiving the transmission parameter and inserting the received transmission parameter in region A of the data group according to the present invention. Herein, the group formatter 304 receives mobile service data from the block processor 303. Conversely, the transmission parameter is processed with at least one of a data randomizing process, a RS frame encoding process, and a block processing process, and may then be inputted to the group formatter 304. Alternatively, the transmission parameter may be directly inputted to the group formatter 304 without being processed with any of the above-mentioned processes. In addition, the transmission parameter may be provided from the service multiplexer 100. Alternatively, the transmission parameter may also be generated and provided from within the transmitter 200. The transmission parameter may also include information required by the receiving system in order to receive and process the data included in the data group. For example, the transmission parameter may include data group information, and multiplexing information.

The group formatter 304 inserts the mobile service data and transmission parameter which are to be inputted to corresponding regions within the data group in accordance with a rule for configuring a data group. For example, the transmission parameter passes through a block encoding process of a short period and is, then, inserted in region A of the data group. Particularly, the transmission parameter may be inserted in a pre-arranged and arbitrary position (or place) within region A. If it is assumed that the transmission parameter has been block encoded by the block processor 303, the block processor 303 performs the same data processing operation as the mobile service data, more specifically, either a ½-rate encoding or ¼-rate encoding process on the signaling information including the transmission parameter. Thereafter, the block processor 303 outputs the processed transmission parameter to the group formatter 304. Thereafter, the signaling information is also recognized as the mobile service data and processed accordingly.

Figure 19:
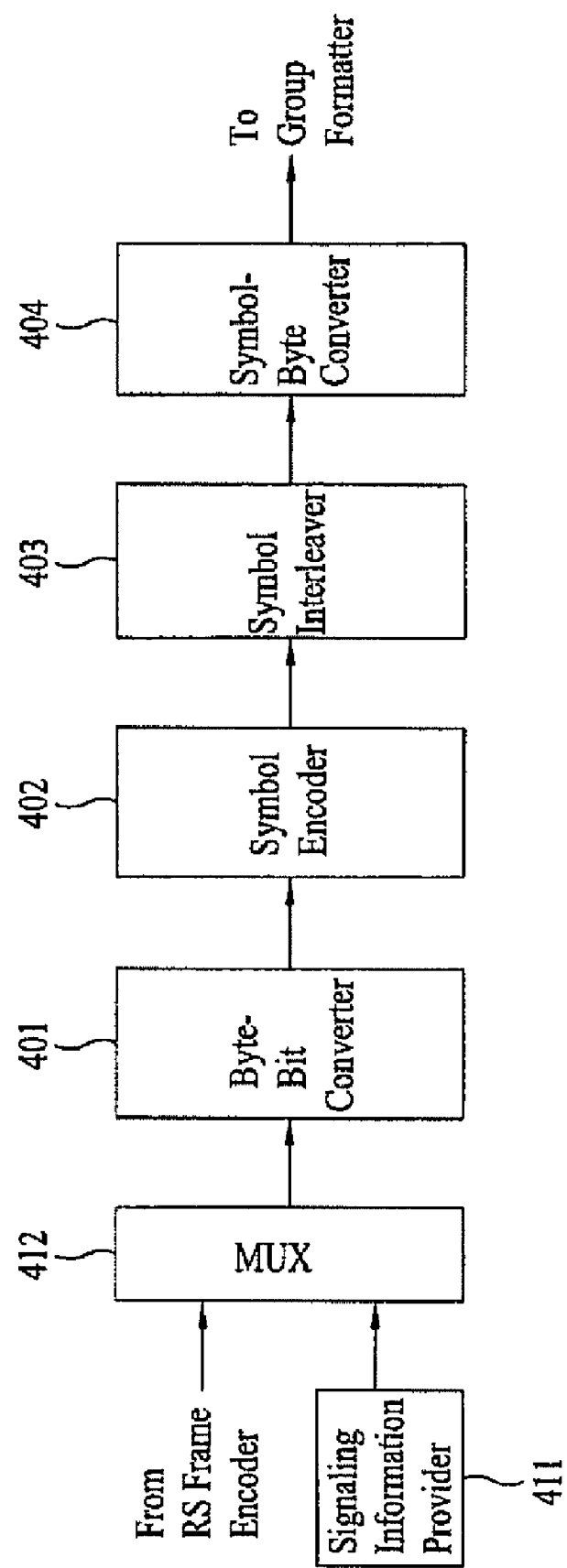
FIG. 19 illustrates an example of a block processor inserting and transmitting a transmission parameter.

FIG. 19 illustrates a block diagram showing an example of the block processor receiving the transmission parameter and processing the received transmission parameter with the same process as the mobile service data. Particularly, FIG. 19 illustrates an example showing the structure of FIG. 9 further including a signaling information provider 411 and multiplexer 412. More specifically, the signaling information provider 411 outputs the signaling information including the transmission parameter to the multiplexer 412. The multiplexer 412 multiplexes the signaling information and the output of the RS frame encoder 302. Then, the multiplexer 412 outputs the multiplexed data to the byte-bit converter 401.

The byte-bit converter 401 divides the mobile service data bytes or signaling information byte outputted from the multiplexer 412 into bits, which are then outputted to the symbol encoder 402. The subsequent operations are identical to those described in FIG. 9. Therefore, a detailed description of the same will be omitted for simplicity. If any of the detailed structures of the block processor 303 shown in FIG. 12, FIG. 15, FIG. 16, and FIG. 17, the signaling information provider 411 and the multiplexer 412 may be provided behind the byte-symbol converter.

Second Embodiment

Meanwhile, when known data generated from the group formatter in accordance with a pre-decided rule are inserted in a corresponding region within the data group, a transmission parameter may be inserted in at least a portion of a region, where known data may be inserted, instead of the known data. For example, when a long known data sequence is inserted at the beginning of region A within the data group, a transmission parameter may be inserted in at least a portion of the beginning of region A instead of the known data. A portion of the known data sequence that is inserted in the remaining portion of region A, excluding the portion in which the transmission parameter is inserted, may be used to detect a starting point of the data group by the receiving system. Alternatively, another portion of region A may be used for channel equalization by the receiving system.

In addition, when the transmission parameter is inserted in the known data region instead of the actual known data. The transmission parameter may be block encoded in short periods and then inserted. Also, as described above, the transmission parameter may also be inserted based upon a pre-defined pattern in accordance with the transmission parameter. If the group formatter 304 inserts known data place holders in a region within the data group, wherein known data may be inserted, instead of the actual known data, the transmission parameter may be inserted by the packet formatter 306. More specifically, when the group formatter 304 inserts the known data place holders, the packet formatter 306 may insert the known data instead of the known data place holders. Alternatively, when the group formatter 304 inserts the known data, the known data may be directly outputted without modification.

Figure 20:
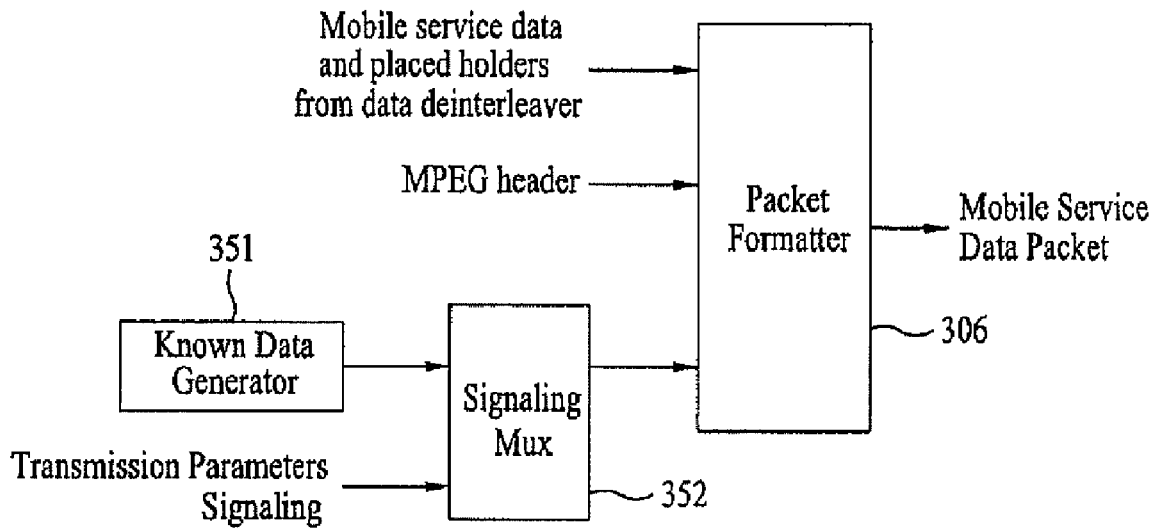
FIG. 20 illustrates an example of a packet formatter inserting and transmitting a transmission parameter.

FIG. 20 illustrates a block diagram showing the structure of a packet formatter 306 being expanded so that the packet formatter 306 can insert the transmission parameter according to an embodiment of the present invention. More specifically, the structure of the packet formatter 306 further includes a known data generator 351 and a signaling multiplexer 352. Herein, the transmission parameter that is inputted to the signaling multiplexer 352 may include information on the length of a current burst, information indicating a starting point of a next burst, positions in which the groups within the burst exist and the lengths of the groups, information on the time from the current group and the next group within the burst, and information on known data.

The signaling multiplexer 352 selects one of the transmission parameter and the known data generated from the known data generator 351 and, then, outputs the selected data to the packet formatter 306. The packet formatter 306 inserts the known data or transmission parameter outputted from the signaling multiplexer 352 into the known data place holders outputted from the data interleaver 305. Then, the packet formatter 306 outputs the processed data. More specifically, the packet formatter 306 inserts a transmission parameter in at least a portion of the known data region instead of the known data, which is then outputted. For example, when a known data place holder is inserted at a beginning portion of region A within the data group, a transmission parameter may be inserted in a portion of the known data place holder instead of the actual known data.

Also, when the transmission parameter is inserted in the known data place holder instead of the known data, the transmission parameter may be block encoded in short periods and inserted. Alternatively, a pre-defined pattern may be inserted in accordance with the transmission parameter. More specifically, the signaling multiplexer 352 multiplexes the known data and the transmission parameter (or the pattern defined by the transmission parameter) so as to configure a new known data sequence. Then, the signaling multiplexer 352 outputs the newly configured known data sequence to the packet formatter 306. The packet formatter 306 deletes the main service data place holder and RS parity place holder from the output of the data interleaver 305, and creates a mobile service data packet of 188 bytes by using the mobile service data, MPEG header, and the output of the signaling multiplexer. Then, the packet formatter 306 outputs the newly created mobile service data packet to the packet multiplexer 240.

In this case, the region A of each data group has a different known data pattern. Therefore, the receiving system separates only the symbol in a pre-arranged section of the known data sequence and recognizes the separated symbol as the transmission parameter. Herein, depending upon the design of the transmitting system, the known data may be inserted in different blocks, such as the packet formatter 306, the group formatter 304, or the block processor 303. Therefore, a transmission parameter may be inserted instead of the known data in the block wherein the known data are to be inserted.

According to the second embodiment of the present invention, a transmission parameter including information on the processing method of the block processor 303 may be inserted in a portion of the known data region and then transmitted. In this case, a symbol processing method and position of the symbol for the actual transmission parameter symbol are already decided. Also, the position of the transmission parameter symbol should be positioned so as to be transmitted or received earlier than any other data symbols that are to be decoded. Accordingly, the receiving system may detect the transmission symbol before the data symbol decoding process, so as to use the detected transmission symbol for the decoding process.

Third Embodiment

Figure 21:
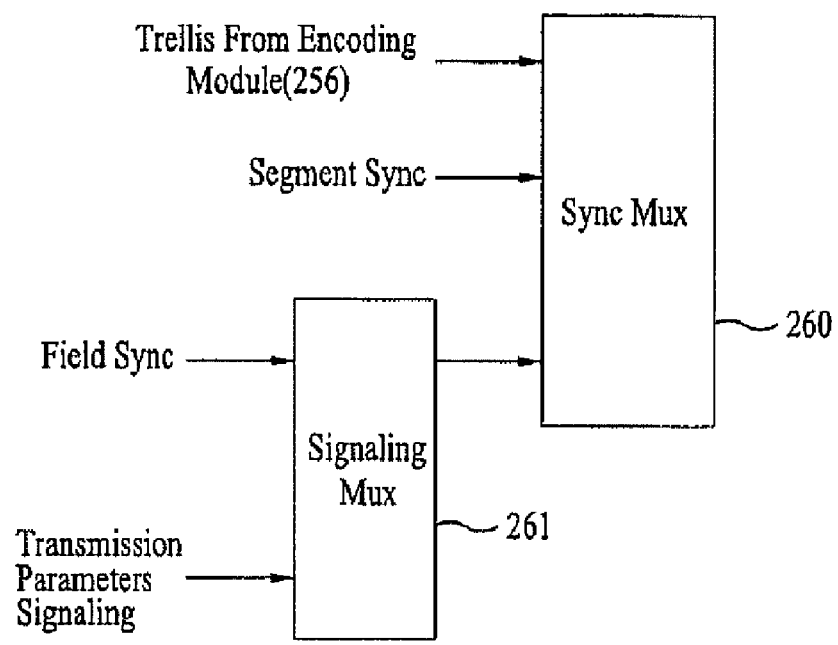
FIG. 21 illustrates an example for inserting and transmitting the transmission parameter in a field synchronization segment area.

Meanwhile, the transmission parameter may also be inserted in the field synchronization segment region and then transmitted. FIG. 21 illustrates a block diagram showing the synchronization multiplexer being expanded in order to allow the transmission parameter to be inserted in the field synchronization segment region. Herein, a signaling multiplexer 261 is further included in the synchronization multiplexer 260. The transmission parameter of the general VSB method is configured of 2 fields. More specifically, each field is configured of one field synchronization segment and 312 data segments. Herein, the first 4 symbols of a data segment correspond to the segment synchronization portion, and the first data segment of each field corresponds to the field synchronization portion.

One field synchronization signal is configured to have the length of one data segment. The data segment synchronization pattern exists in the first 4 symbols, which are then followed by pseudo random sequences PN 511, PN 63, PN 63, and PN 63. The next 24 symbols include information associated with the VSB mode. Additionally, the 24 symbols that include information associated with the VSB mode are followed by the remaining 104 symbols, which are reserved symbols. Herein, the last 12 symbols of a previous segment are copied and positioned as the last 12 symbols in the reserved region. In other words, only the 92 symbols in the field synchronization segment are the symbols that correspond to the actual reserved region.

Therefore, the signaling multiplexer 261 multiplexes the transmission parameter with an already-existing field synchronization segment symbol, so that the transmission parameter can be inserted in the reserved region of the field synchronization segment. Then, the signaling multiplexer 261 outputs the multiplexed transmission parameter to the synchronization multiplexer 260. The synchronization multiplexer 260 multiplexes the segment synchronization symbol, the data symbols, and the new field synchronization segment outputted from the signaling multiplexer 261, thereby configuring a new transmission frame. The transmission frame including the field synchronization segment, wherein the transmission parameter is inserted, is outputted to the transmission unit 270. At this point, the reserved region within the field synchronization segment for inserting the transmission parameter may correspond to a portion of or the entire 92 symbols of the reserved region. Herein, the transmission parameter being inserted in the reserved region may, for example, include information identifying the transmission parameter as the main service data, the mobile service data, or a different type of mobile service data.

If the information on the processing method of the block processor 303 is transmitted as a portion of the transmission parameter, and when the receiving system wishes to perform a decoding process corresponding to the block processor 303, the receiving system should be informed of such information on the block processing method in order to perform the decoding process. Therefore, the information on the processing method of the block processor 303 should already be known prior to the block decoding process. Accordingly, as described in the third embodiment of the present invention, when the transmission parameter having the information on the processing method of the block processor 303 (and/or the group formatter 304) is inserted in the reserved region of the field synchronization signal and then transmitted, the receiving system is capable of detecting the transmission parameter prior to performing the block decoding process on the received signal.

Receiving System

Figure 22:
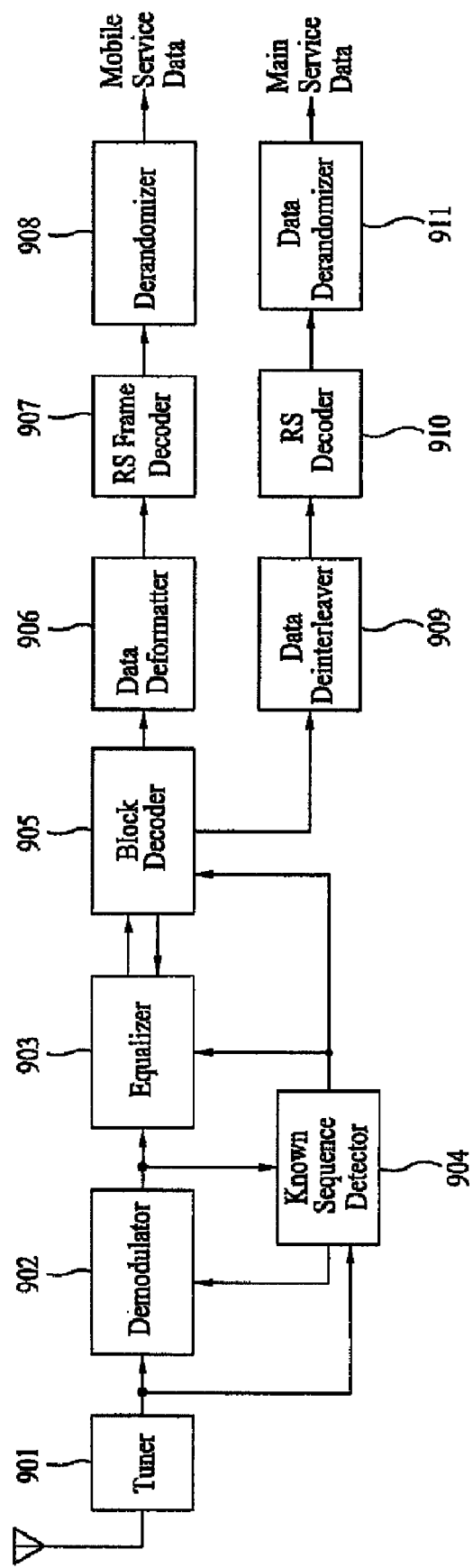
FIG. 22 illustrates a block diagram of a digital broadcast receiving system according to the present invention.

FIG. 22 illustrates a block diagram showing a structure of a digital broadcast receiving system according to the present invention. The digital broadcast receiving system of FIG. 22 uses known data information, which is inserted in the mobile service data section and, then, transmitted by the transmitting system, so as to perform carrier synchronization recovery, frame synchronization recovery, and channel equalization, thereby enhancing the receiving performance. Referring to FIG. 22, the digital broadcast receiving system includes a tuner 901, a demodulator 902, an equalizer 903, a known data detector 904, a block decoder 905, a data deformatter 906, a RS frame decoder 907, a derandomizer 908, a data deinterleaver 909, a RS decoder 910, and a data derandomizer 911. Herein, for simplicity of the description of the present invention, the data deformatter 906, the RS frame decoder 907, and the derandomizer 908 will be collectively referred to as a mobile service data processing unit. And, the data deinterleaver 909, the RS decoder 910, and the data derandomizer 911 will be collectively referred to as a main service data processing unit.

More specifically, the tuner 901 tunes a frequency of a particular channel and down-converts the tuned frequency to an intermediate frequency (IF) signal. Then, the tuner 901 outputs the down-converted IF signal to the demodulator 902 and the known data detector 904. The demodulator 902 performs self gain control, carrier recovery, and timing recovery processes on the inputted IF signal, thereby modifying the IF signal to a baseband signal. Herein, an analog/digital converter (ADC) converting pass band analog IF signals to digital IF signals may be included between the tuner 901 and the demodulator 902. Then, the demodulator 902 outputs the digitalized and inputted pass band IF signal to the equalizer 903 and the known data detector 904. The equalizer 903 compensates the distortion of the channel included in the demodulated signal and then outputs the error-compensated signal to the block decoder 905.

At this point, the known data detector 904 detects the known sequence place inserted by the transmitting end from the input/output data of the demodulator 902 (i.e., the data prior to the demodulation process or the data after the demodulation process). Thereafter, the place information (or position indicator) along with the symbol sequence of the known data, which are generated from the detected place, is outputted to the demodulator 902 and the equalizer 903. Also, the known data detector 904 outputs a set of information to the block decoder 905. This set of information is used to allow the block decoder 905 of the receiving system to identify the mobile service data that are processed with additional encoding from the transmitting system and the main service data that are not processed with additional encoding. In addition, although the connection status is not shown in FIG. 22, the information detected from the known data detector 904 may be used throughout the entire receiving system and may also be used in the data deformatter 906 and the RS frame decoder 907.

The demodulator 902 uses the known data (or sequence) position indicator and the known data symbol sequence during the timing and/or carrier recovery, thereby enhancing the demodulating performance. Similarly, the equalizer 903 uses the known sequence position indicator and the known data symbol sequence so as to enhance the equalizing performance. Moreover, the decoding result of the block decoder 905 may be fed-back to the equalizer 903, thereby enhancing the equalizing performance. At this point, the transmitting system may periodically insert and transmit known data within a transmission frame, as shown in FIG. 6A.

Figure 23:
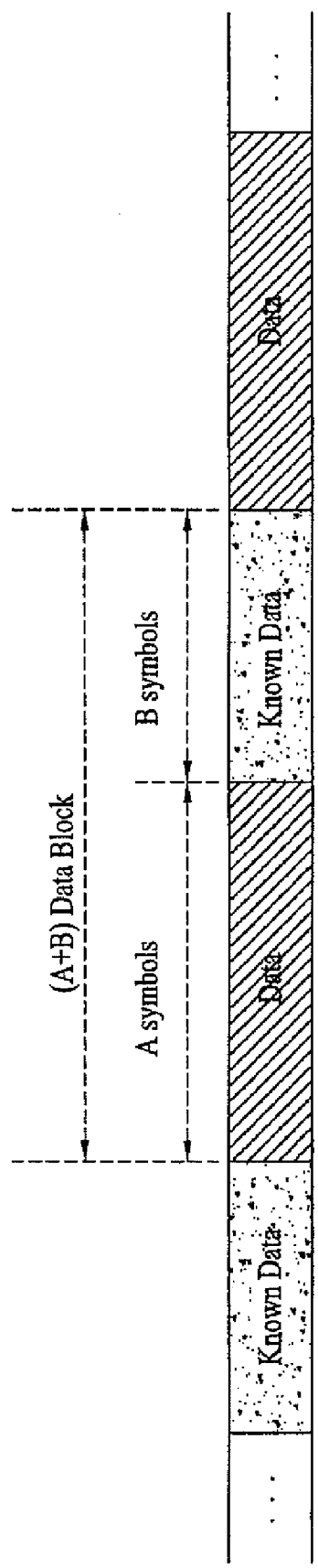
FIG. 23 illustrates a data structure showing an example of known data being periodically inserted in valid data according to the present invention.

FIG. 23 illustrates an example of known data sequence being periodically inserted and transmitted in-between actual data by the transmitting system. Referring to FIG. 23, A represent s the number of valid data symbols, and B represents the number of known data symbols. Therefore, B number of known data symbols are inserted and transmitted at a period of (A+B) symbols. Herein, A may correspond to mobile service data, main service data, or a combination of mobile service data and main service data. In order to be differentiated from the known data, data corresponding to A will hereinafter be referred to as valid data.

Referring to FIG. 23, known data sequence having the same pattern are included in each known data section that is being periodically inserted. Herein, the length of the known data sequence having identical data patterns may be either equal to or different from the length of the entire (or total) known data sequence of the corresponding known data section (or block). If the two lengths are different from one another, the length of the entire known data sequence should be longer than the length of the known data sequence having identical data patterns. In this case, the same known data sequences are included in the entire known data sequence. The known data detector 904 detects the position of the known data being periodically inserted and transmitted as described above. At the same time, the known data detector 904 may also estimate initial frequency offset during the process of detecting known data. In this case, the demodulator 902 may estimate with more accuracy carrier frequency offset from the information on the known data position (or known sequence position indicator) and initial frequency offset estimation value, thereby compensating the estimated initial frequency offset.

Figure 24:
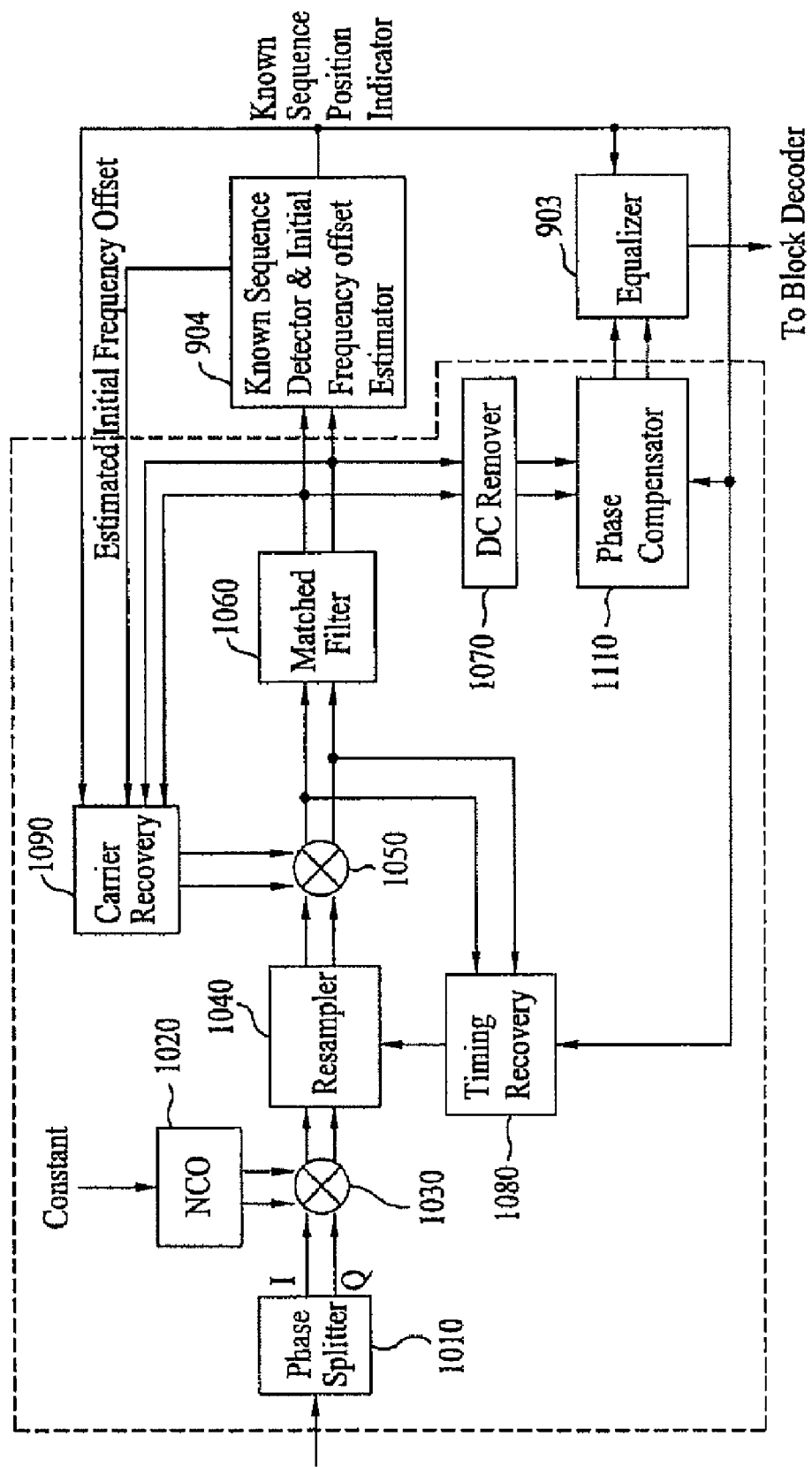
FIG. 24 illustrates a block diagram showing a structure of a demodulator of a digital broadcast receiving system shown in FIG. 22.

FIG. 24 illustrates a detailed block diagram of a demodulator according to the present invention. Referring to FIG. 24, the demodulator includes a phase splitter 1010, a numerically controlled oscillator (NCO) 1020, a first multiplier 1030, a resampler 1040, a second multiplier 1050, a matched filter 1060, a DC remover 1070, a timing recovery unit 1080, a carrier recovery unit 1090, and a phase compensator 1110. Herein, the known data detector 904 includes a known data detector and initial frequency offset estimator 9041 for estimating known data information and initial frequency offset. Also referring to FIG. 24, the phase splitter 1010 receives a pass band digital signal and splits the received signal into a pass band digital signal of a real number element and a pass band digital signal of an imaginary number element both having a phase of 90 degrees between one another. In other words, the pass band digital signal is split into complex signals. The split portions of the pass band digital signal are then outputted to the first multiplier 1030. Herein, the real number signal outputted from the phase splitter 1010 will be referred to as an 'I' signal, and the imaginary number signal outputted from the phase splitter 1010 will be referred to as a 'Q' signal, for simplicity of the description of the present invention.

The first multiplier 1030 multiplies the I and Q pass band digital signals, which are outputted from the phase splitter 1010, to a complex signal having a frequency proportional to a constant being outputted from the NCO 1020, thereby changing the I and Q pass band digital signals to baseband digital complex signals. Then, the baseband digital signals of the first multiplier 1030 are inputted to the resampler 1040. The resampler 1040 resamples the signals being outputted from the first multiplier 1030 so that the signal corresponds to the timing clock provided by the timing recovery unit 1080. Thereafter, the resampler 1040 outputs the resampled signals to the second multiplier 1050

For example, when the analog/digital converter uses a 25 MHz fixed oscillator, the baseband digital signal having a frequency of 25 MHz, which is created by passing through the analog/digital converter, the phase splitter 1010, and the first multiplier 1030, is processed with an interpolation process by the resampler 1040. Thus, the interpolated signal is recovered to a baseband digital signal having a frequency twice that of the receiving signal of a symbol clock (i.e., a frequency of 21.524476 MHz). Alternatively, if the analog/digital converter uses the timing clock of the timing recovery unit 1080 as the sampling frequency (i.e., if the analog/digital converter uses a variable frequency) in order to perform an A/D conversion process, the resampler 1040 is not required and may be omitted.

The second multiplier 1050 multiplies an output frequency of the carrier recovery unit 1090 with the output of the resampler 1040 so as to compensate any remaining carrier included in the output signal of the resampler 1040. Thereafter, the compensated carrier is outputted to the matched filter 1060 and the timing recovery unit 1080. The signal matched-filtered by the matched filter 1060 is inputted to the DC remover 1070, the known data detector and initial frequency offset estimator 9041, and the carrier recovery unit 1090.

The known data detector and initial frequency offset estimator 9041 detects the place (or position) of the known data sequences that are being periodically or non-periodically transmitted Simultaneously, the known data detector and initial frequency offset estimator 9041 estimates an initial frequency offset during the known data detection process. More specifically, while the transmission data frame is being received, as shown in FIG. 6A, the known data detector and initial frequency offset estimator 9041 detects the position (or place) of the known data included in the transmission data frame. Then, the known data detector and initial frequency offset estimator 9041 outputs the detected information on the known data place (i.e., a known sequence position indicator) to the timing recovery unit 1080, the carrier recovery unit 1090, and the phase compensator 1110 of the demodulator 902 and the equalizer 903. Furthermore, the known data detector and initial frequency offset estimator 9041 estimates the initial frequency offset, which is then outputted to the carrier recovery unit 1090. At this point, the known data detector and initial frequency offset estimator 9041 may either receive the output of the matched filter 1060 or receive the output of the resampler 1040. This may be optionally decided depending upon the design of the system designer.

The timing recovery unit 1080 uses the output of the second multiplier 1050 and the known sequence position indicator detected from the known data detector and initial frequency offset estimator 9041, so as to detect the timing error and, then, to output a sampling clock being in proportion with the detected timing error to the resampler 1040, thereby adjusting the sampling timing of the resampler 1040. At this point, the timing recovery unit 1080 may receive the output of the matched filter 1060 instead of the output of the second multiplier 1050. This may also be optionally decided depending upon the design of the system designer.

Meanwhile, the DC remover 1070 removes a pilot tone signal (i.e., DC signal), which has been inserted by the transmitting system, from the matched-filtered signal. Thereafter, the DC remover 1070 outputs the processed signal to the phase compensator 1110. The phase compensator 1110 uses the data having the DC removed by the DC remover 1070 and the known sequence position indicator detected by the known data detector and initial frequency offset estimator 9041 to estimate the frequency offset and, then, to compensate the phase change included in the output of the DC remover 1070. The data having its phase change compensated are inputted to the equalizer 903. Herein, the phase compensator 1110 is optional. If the phase compensator 1110 is not provided, then the output of the DC remover 1070 is inputted to the equalizer 903 instead.

Figure 25:
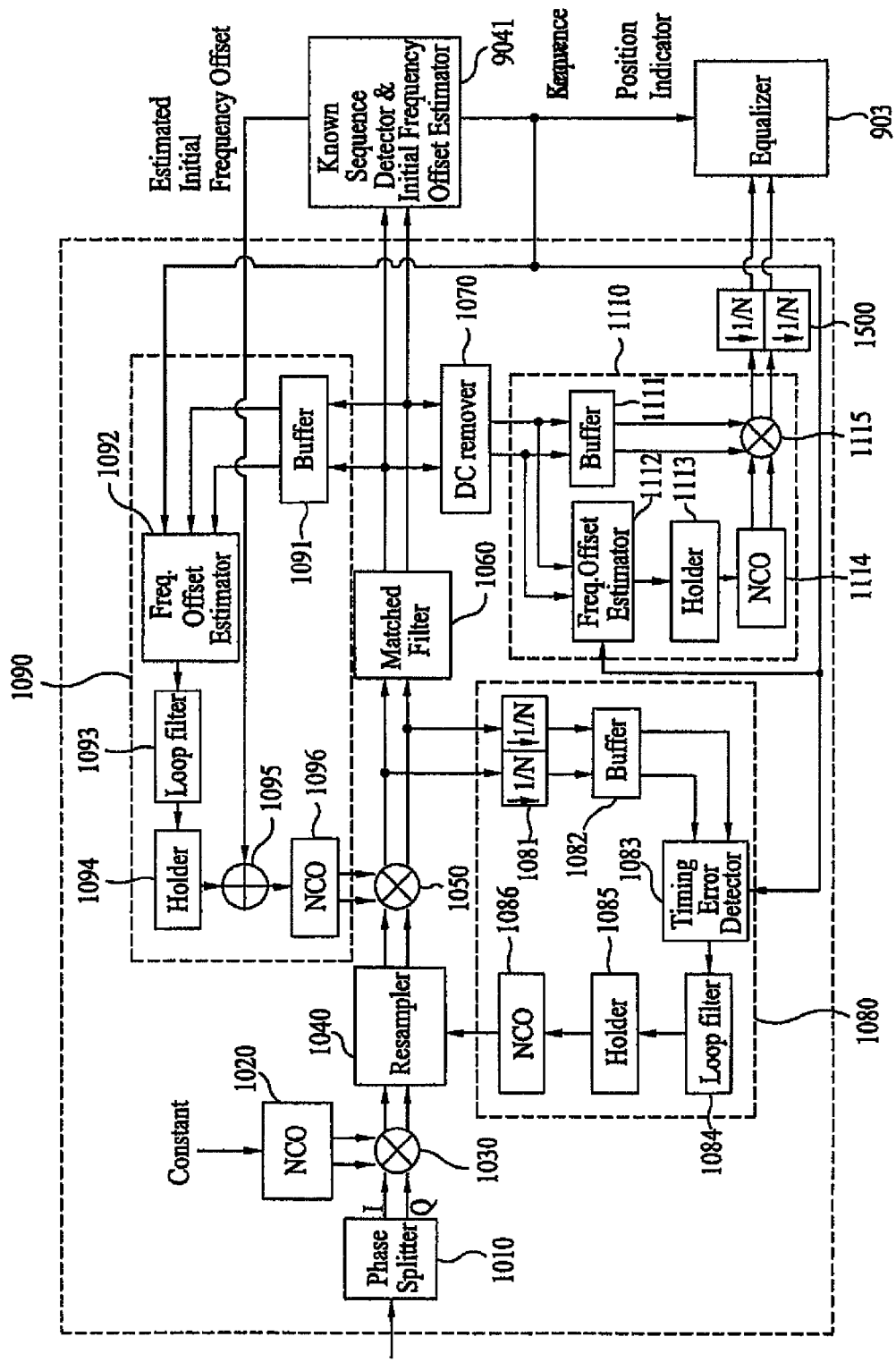
FIG. 25 illustrates a detailed block diagram of the demodulator of the digital broadcast receiving system shown in FIG. 22.

FIG. 25 includes detailed block diagrams of the timing recovery unit 1080, the carrier recovery unit 1090, and the phase compensator 1110 of the demodulator. According to an embodiment of the present invention, the carrier recovery unit 1090 includes a buffer 1091, a frequency offset estimator 1092, a loop filter 1093, a holder 1094, an adder 1095, and a NCO 1096. Herein, a decimator may be included before the buffer 1091. The timing recovery unit 1080 includes a decimator 1081, a buffer 1082, a timing error detector 1083, a loop filter 1084, a holder 1085, and a NCO 1086. Finally, the phase compensator 1110 includes a buffer 1111, a frequency offset estimator 1112, a holder 1113, a NCO 1114, and a multiplier 1115. Furthermore, a decimator 1500 may be included between the phase compensator 1110 and the equalizer 903. The decimator 1500 may be outputted in front of the DC remover 1070 instead of at the outputting end of the phase compensator 1110.

Herein, the decimators correspond to components required when a signal being inputted to the demodulator is oversampled to N times by the analog/digital converter. More specifically, the integer N represents the sampling rate of the received signal. For example, when the input signal is oversampled to 2 times (i.e., when N=2) by the analog/digital converter, this indicates that two samples are included in one symbol. In this case, each of the decimators corresponds to a ½ decimator. Depending upon whether or not the oversampling process of the received signal has been performed, the signal may bypass the decimators.

Meanwhile, the output of the second multiplier 1050 is temporarily stored in the decimator 1081 and the buffer 1082 both included in the timing recovery unit 1080. Subsequently, the temporarily stored output data are inputted to the timing error detector 1083 through the decimator 1081 and the buffer 10B2. Assuming that the output of the second multiplier 1050 is oversampled to N times its initial state, the decimator 1081 decimates the output of the second multiplier 1050 at a decimation rate of 1/N. Then, the 1/N-decimated data are inputted to the buffer 1082. In other words, the decimator 1081 performs decimation on the input signal in accordance with a VSB symbol cycle. Furthermore, the decimator 1081 may also receive the output of the matched filter 1060 instead of the output of the second multiplier 1050. The timing error detector 1083 uses the data prior to or after being processed with matched-filtering and the known sequence position indicator outputted from the known data detector and initial frequency offset estimator 9041 in order to detect a timing error. Thereafter, the detected timing error is outputted to the loop filter 1084. Accordingly, the detected timing error information is obtained once during each repetition cycle of the known data sequence.

For example, if a known data sequence having the same pattern is periodically inserted and transmitted, as shown in FIG. 23, the timing error detector 1083 may use the known data in order to detect the timing error. There exists a plurality of methods for detecting timing error by using the known data. In the example of the present invention, the timing error may be detected by using a correlation characteristic between the known data and the received data in the time domain, the known data being already known in accordance with a pre-arranged agreement between the transmitting system and the receiving system. The timing error may also be detected by using the correlation characteristic of the two known data types being received in the frequency domain. Thus, the detected timing error is outputted. In another example, a spectral lining method may be applied in order to detect the timing error. Herein, the spectral lining method corresponds to a method of detecting timing error by using sidebands of the spectrum included in the received signal.

The loop filter 1084 filters the timing error detected by the timing error detector 1083 and, then, outputs the filtered timing error to the holder 1085. The holder 1085 holds (or maintains) the timing error filtered and outputted from the loop filter 1084 during a pre-determined known data sequence cycle period and outputs the processed timing error to the NCO 1086. Herein, the order of positioning of the loop filter 1084 and the holder 1085 may be switched with one another. In additionally, the function of the holder 1085 may be included in the loop filter 1084, and, accordingly, the holder 1085 may be omitted. The NCO 1086 accumulates the timing error outputted from the holder 1085. Thereafter, the NCO 1086 outputs the phase element (i.e., a sampling clock) of the accumulated timing error to the resampler 1040, thereby adjusting the sampling timing of the resampler 1040.

Meanwhile, the buffer 1091 of the carrier recovery unit 1090 may receive either the data inputted to the matched filter 1060 or the data outputted from the matched filter 1060 and, then, temporarily store the received data. Thereafter, the temporarily stored data are outputted to the frequency offset estimator 1092. If a decimator is provided in front of the buffer 1091, the input data or output data of the matched filter 1060 are decimated by the decimator at a decimation rate of 1/N. Thereafter, the decimated data are outputted to the buffer 1091. For example, when the input data or output data of the matched filter 1060 are oversampled to 2 times (i.e., when N=2), this indicates that the input data or output data of the matched filter 1060 are decimated at a rate of ½ by the decimator 1081 and then outputted to the buffer 1091. More specifically, when a decimator is provided in front of the buffer 1091, the carrier recovery unit 1090 operates in symbol units. Alternatively, if a decimator is not provided, the carrier recovery unit 1090 operates in oversampling units.

The frequency offset estimator 1092 uses the input data or output data of the matched filter 1060 and the known sequence position indicator outputted from the known data detector and initial frequency offset estimator 9041 in order to estimate the frequency offset. Then, the estimated frequency offset is outputted to the loop filter 1093. Therefore, the estimated frequency offset value is obtained once every repetition period of the known data sequence. The loop filter 1093 performs low pass filtering on the frequency offset value estimated by the frequency offset estimator 1092 and outputs the low pass-filtered frequency offset value to the holder 1094. The holder 1094 holds (or maintains) the low pass-filtered frequency offset value during a pre-determined known data sequence cycle period and outputs the frequency offset value to the adder 109S. Herein, the positions of the loop filter 1093 and the holder 1094 may be switched from one to the other. Furthermore, the function of the holder 1085 may be included in the loop filter 1093, and, accordingly, the holder 1094 may be omitted.

The adder 1095 adds the value of the initial frequency offset estimated by the known data detector and initial frequency offset estimator 9041 to the frequency offset value outputted from the loop filter 1093 (or the holder 1094). Thereafter, the added offset value is outputted to the NCO 1096. Herein, if the adder 1095 is designed to also receive the constant being inputted to the NCO 1020, the NCO 1020 and the first multiplier 1030 may be omitted. In this case, the second multiplier 1050 may simultaneously perform changing signals to baseband signals and removing remaining carrier.

The NCO 1096 generates a complex signal corresponding to the frequency offset outputted from the adder 1095, which is then outputted to the second multiplier 1050. Herein, the NCO 1096 may include a ROM. In this case, the NCO 1096 generates a compensation frequency corresponding to the frequency offset being outputted from the adder 1095. Then, the NCO 1096 reads a complex cosine corresponding to the compensation frequency from the ROM, which is then outputted to the second multiplier 1050. The second multiplier 1050 multiplies the output of the NCO 1094 included in the carrier recovery unit 1090 to the output of the resampler 1040, so as to remove the carrier offset included in the output signal of the resampler 1040.

Figure 26:
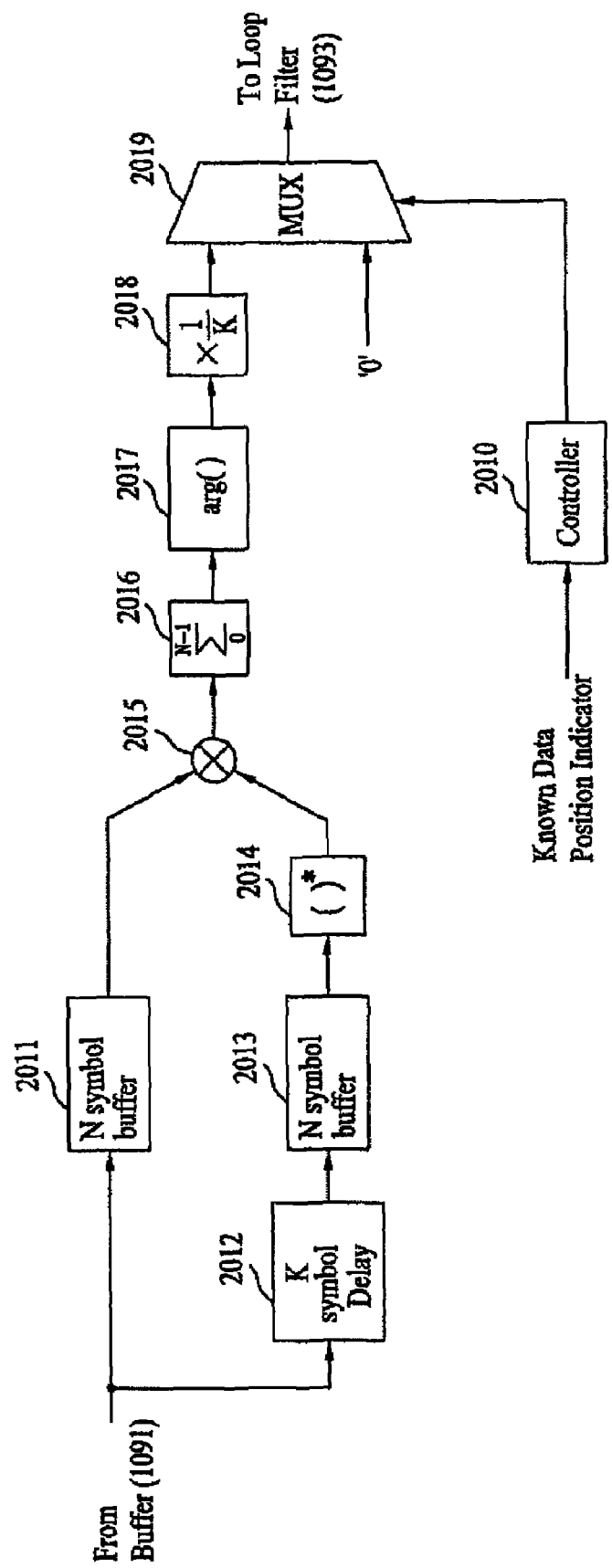
FIG. 26 illustrates a block diagram of a frequency offset estimator according to an embodiment of the present invention.

FIG. 26 illustrates a detailed block diagram of the frequency offset estimator 1092 of the carrier recovery unit 1090 according to an embodiment of the present invention. Herein, the frequency offset estimator 1092 operates in accordance with the known sequence position indicator detected from the known data detector and initial frequency offset estimator 9041. At this point, if the input data or output data of the matched filter 1060 are inputted through the decimator, the frequency offset estimator 1092 operates in symbol units. Alternatively, if a decimator is not provided, the frequency offset estimator 1092 operates in oversampling units. In the example given in the description of the present invention, the frequency offset estimator 1092 operates in symbol units. Referring to FIG. 26, the frequency offset estimator 1092 includes a controller 2010, a first N symbol buffer 2011, a K symbol delay 2012, a second N symbol buffer 2013, a conjugator 2014, a multiplier 2015, an accumulator 2016, a phase detector 2017, a multiplier 2018, and a multiplexer 2019. The frequency offset estimator 1092 having the above-described structure, as shown in FIG. 26, will now be described in detail with respect to an operation example during a known data section.

The first N symbol buffer 2011 may store a maximum of N number of symbol being inputted thereto. The symbol data that are temporarily stored in the first N symbol buffer 2011 are then inputted to the multiplier 2015. At the same time, the inputted symbol is inputted to the K symbol delay 2012 so as to be delayed by K symbols. Thereafter, the delayed symbol passes through the second N symbol buffer 2013 so as to be conjugated by the conjugator 2014. Thereafter, the conjugated symbol is inputted to the multiplier 2015. The multiplier 2015 multiplies the output of the first N symbol buffer 2011 and the output of the conjugator 2014. Then, the multiplier 2015 outputs the multiplied result to the accumulator 2016. Subsequently, the accumulator 2016 accumulates the output of the multiplier 2015 during N symbol periods, thereby outputted the accumulated result to the phase detector 2017.

The phase detector 2017 extracts the corresponding phase information from the output of the accumulator 2016, which is then outputted to the multiplier 2018. The multiplier 2018 then divides the phase information by K, thereby outputting the divided result to the multiplexer 2019. Herein, the result of the phase information divided by becomes the frequency offset estimation value. More specifically, at the point where the input of the known data ends or at a desired point, the frequency offset estimator 1092 accumulates during an N symbol period multiplication of the complex conjugate of N number of the input data stored in the first N symbol buffer 2011 and the complex conjugate of the N number of the input data that are delayed by K symbols and stored in the second N symbol buffer 2013. Thereafter, the accumulated value is divided by K, thereby extracting the frequency offset estimation value.

Based upon a control signal of the controller 2010, the multiplexer 2019 selects either the output of the multiplier 201B or '0' and, then, outputs the selected result as the final frequency offset estimation value. The controller 2010 receives the known data sequence position indicator from the known data detector and initial frequency offset estimator 9041 in order to control the output of the multiplexer 2019. More specifically, the controller 2010 determines based upon the known data sequence position indicator whether the frequency offset estimation value being outputted from the multiplier 2018 is valid. If the controller 2010 determines that the frequency offset estimation value is valid, the multiplexer 2019 selects the output of the multiplier 2018. Alternatively, if the controller 2010 determines that the frequency offset estimation value is invalid, the controller 2010 generates a control signal so that the multiplexer 2019 selects '0'. At this point, it is preferable that the input signals stored in the first N symbol buffer 2011 and in the second N symbol buffer 2013 correspond to signals each being transmitted by the same known data and passing through almost the same channel. Otherwise, due to the influence of the transmission channel, the frequency offset estimating performance may be largely deteriorated.

Further, the values N and K of the frequency offset estimator 1092 (shown in FIG. 26) may be diversely decided. This is because a particular portion of the known data that are identically repeated may be used herein. For example, when the data having the structure described in FIG. 23 are being transmitted, N may be set as B (i.e., N=B), and K may be set as (A+B) (i.e., K=A+B)). The frequency offset estimation value range of the frequency offset estimator 1092 is decided in accordance with the value K. If the value K is large, then the frequency offset estimation value range becomes smaller. Alternatively, if the value K is small, then the frequency offset estimation value range becomes larger. Therefore, when the data having the structure of FIG. 23 is transmitted, and if the repetition cycle (A+B) of the known data is long, then the frequency offset estimation value range becomes smaller.

In this case, even if the initial frequency offset is estimated by the known sequence detector and initial frequency offset estimator 9041, and if the estimated value is compensated by the second multiplier 1050, the remaining frequency offset after being compensated will exceed the estimation range of the frequency offset estimator 1092. In order to overcome such problems, the known data sequence that is regularly transmitted may be configured of a repetition of a same data portion by using a cyclic extension process. For example, if the known data sequence shown in FIG. 23 is configured of two identical portions having the length of B/2, then the N and K values of the frequency offset estimator 1092 (shown in FIG. 26) may be respectively set as B/2 and B/2 (i.e., N=B/2 and K=B/2). In this case, the estimation value range may become larger than when using repeated known data.

Meanwhile, the known data detector and initial frequency offset estimator 9041 detects the place (o position) of the known data sequences that are being periodically or non-periodically transmitted. Simultaneously, the known data detector and initial frequency offset estimator 9041 estimates an initial frequency offset during the known data detection process. The known data sequence position indicator detected by the known data detector and initial frequency offset estimator 9041 is outputted to the timing recovery unit 1080, the carrier recovery unit 1090, and the phase compensator 1110 of the demodulator 902, and to the equalizer 903. Thereafter, the estimated initial frequency offset is outputted to the carrier recovery unit 1090. At this point, the known data detector and initial frequency offset estimator 9041 may either receive the output of the matched filter 1060 or receive the output of the resampler 1040. This may be optionally decided depending upon the design of the system designer. Herein, the frequency offset estimator shown in FIG. 26 may be directly applied in the known data detector and initial frequency offset estimator 9041 or in the phase compensator 1110 of the frequency offset estimator.

Figure 27:
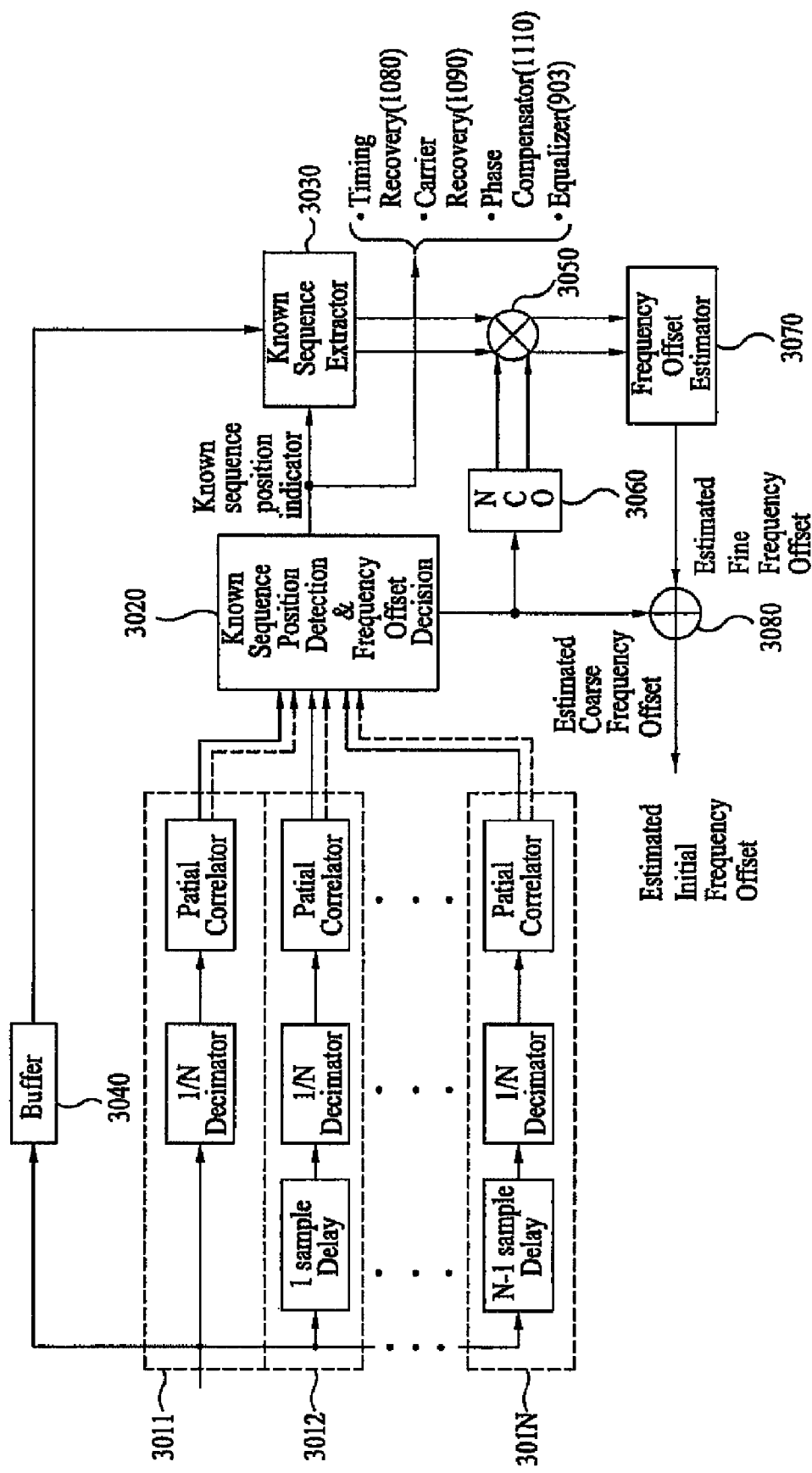
FIG. 27 illustrates a block diagram of a known data detector and initial frequency offset estimator according to the present invention.

FIG. 27 illustrates a detailed block diagram showing a known data detector and initial frequency offset estimator according to an embodiment of the present invention. More specifically, FIG. 27 illustrates an example of an initial frequency offset being estimated along with the known sequence position indicator. Herein, FIG. 27 shows an example of an inputted signal being oversampled to N times of its initial state. In other words, N represents the sampling rate of a received signal. Referring to FIG. 27, the known data detector and initial frequency offset estimator includes N number of partial correlators 3011 to 301N configured in parallel, a known data place detector and frequency offset decider 3020, a known data extractor 3030, a buffer 3040, a multiplier 3050, a NCO 3060, a frequency offset estimator 3070, and an adder 3080. Herein, the first partial correlator 3011 consists of a 1/N decimator, and a partial correlator. The second partial correlator 3012 consists of a 1 sample delay, a 1/N decimator, and a partial correlator. And, the $N^{th}$ partial correlator 301N consists of a N−1 sample delay, a 1/N decimator, and a partial correlator. These are used to match (or identify) the phase of each of the samples within the oversampled symbol with the phase of the original (or initial) symbol, and to decimate the samples of the remaining phases, thereby performing partial correlation on each sample. More specifically, the input signal is decimated at a rate of 1/N for each sampling phase, so as to pass through each partial correlator.

For example, when the input signal is oversampled to 2 times (i.e., when N=2), this indicates that two samples are included in one signal. In this case, two partial correlators (e.g., 3011 and 3012) are required, and each 1/N decimator becomes a ½ decimator. At this point, the 1/N decimator of the first partial correlator 3011 decimates (or removes), among the input samples, the samples located in-between symbol places (or positions). Then, the corresponding 1/N decimator outputs the decimated sample to the partial correlator. Furthermore, the I sample delay of the second partial correlator 3012 delays the input sample by 1 sample (i.e., performs a 1 sample delay on the input sample) and outputs the delayed input sample to the 1/N decimator. Subsequently, among the samples inputted from the 1 sample delay, the 1/N decimator of the second partial correlator 3012 decimates (or removes) the samples located in-between symbol places (or positions). Thereafter, the corresponding 1/N decimator outputs the decimated sample to the partial correlator.

After each predetermined period of the VSB symbol, each of the partial correlators outputs a correlation value and an estimation value of the coarse frequency offset estimated at that particular moment to the known data place detector and frequency offset decider 3020. The known data place detector and frequency offset decider 3020 stores the output of the partial correlators corresponding to each sampling phase during a data group cycle or a pre-decided cycle. Thereafter, the known data place detector and frequency offset decider 3020 decides a position (or place) corresponding to the highest correlation value, among the stored values, as the place (or position) for receiving the known data. Simultaneously, the known data place detector and frequency offset decider 3020 finally decides the estimation value of the frequency offset estimated at the moment corresponding to the highest correlation value as the coarse frequency offset value of the receiving system. At this point, the known sequence position indicator is inputted to the known data extractor 3030, the timing recovery unit 1080, the carrier recovery unit 1090, the phase compensator 1110, and the equalizer 903, and the coarse frequency offset is inputted to the adder 3080 and the NCO 3060.

In the meantime, while the N number of partial correlators 3011 to 301N detect the known data place (or known sequence position) and estimate the coarse frequency offset, the buffer 3040 temporarily stores the received data and outputs the temporarily stored data to the known data extractor 3030. The known data extractor 3030 uses the known sequence position indicator, which is outputted from the known data place detector and frequency offset decider 3020, so as to extract the known data from the output of the buffer 3040. Thereafter, the known data extractor 3030 outputs the extracted data to the multiplier 3050. The NCO 3060 generates a complex signal corresponding to the coarse frequency offset being outputted from the known data place detector and frequency offset decider 3020. Then, the NCO 3060 outputs the generated complex signal to the multiplier 3050.

The multiplier 3050 multiplies the complex signal of the NCO 3060 to the known data being outputted from the known data extractor 3030, thereby outputting the known data having the coarse frequency offset compensated to the frequency offset estimator 3070. The frequency offset estimator 3070 estimates a fine frequency offset from the known data having the coarse frequency offset compensated. Subsequently, the frequency offset estimator 3070 outputs the estimated fine frequency offset to the adder 3080. The adder 3080 adds the coarse frequency offset to the fine frequency offset. Thereafter, the adder 3080 decides the added result as a final initial frequency offset, which is then outputted to the adder 1095 of the carrier recovery unit 1090 included in the demodulator 902. More specifically, during the process of acquiring initial synchronization, the present invention may estimate and use the coarse frequency offset as well as the fine frequency offset, thereby enhancing the estimation performance of the initial frequency offset.

It is assumed that the known data is inserted within the data group and then transmitted, as shown in FIG. 6A. Then, the known data detector and initial frequency offset estimator 9041 may use the known data that have been additionally inserted between the A1 area and the A2 area, so as to estimate the initial frequency offset. The known position indicator, which was periodically inserted within the A area estimated by the known data detector and initial frequency offset estimator 9041, is inputted to the timing error detector 1083 of the timing error recovery unit 1080, to the frequency offset estimator 1092 of the carrier recovery unit 1090, to the frequency offset estimator 1112 of the phase compensator 1110, and to the equalizer 903.

Figure 28:
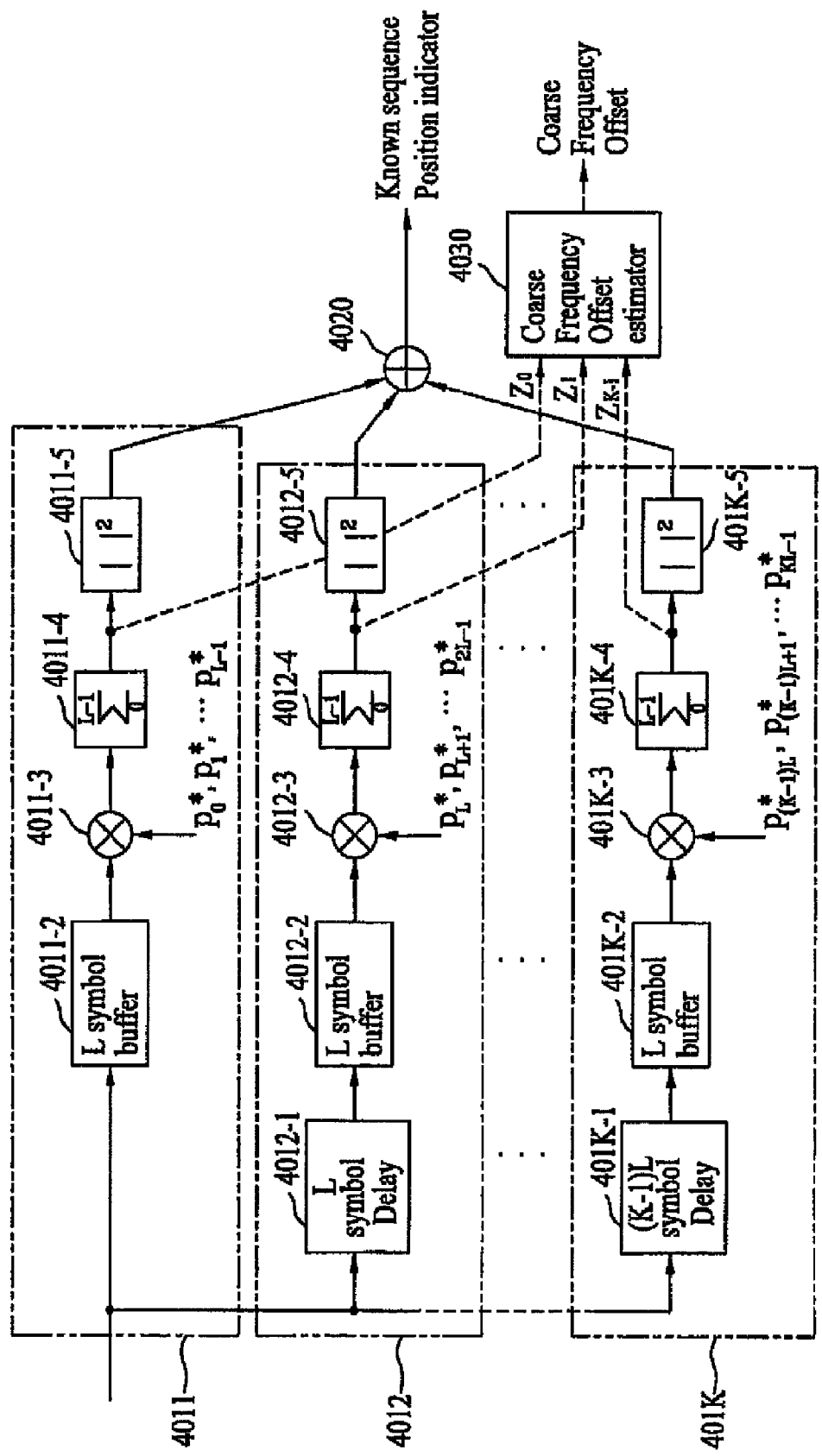
FIG. 28 illustrates a block diagram of a partial correlator shown in FIG. 27.

FIG. 28 illustrates a block diagram showing the structure of one of the partial correlators shown in FIG. 27. During the step of detecting known data, since a frequency offset is included in the received signal, each partial correlator divides the known data, which is known according to an agreement between the transmitting system and the receiving system, to K number of parts each having an L symbol length, thereby correlating each divided part with the corresponding part of the received signal. In order to do so, each partial correlator includes K number of phase and size detector 4011 to 401K each formed in parallel, an adder 4020, and a coarse frequency offset estimator 4030.

The first phase and size detector 4011 includes an L symbol buffer 4011-2, a multiplier 4011-3, an accumulator 4011-4, and a squarer 40115. Herein, the first phase and size detector 4011 calculates the correlation value of the known data having a first L symbol length among the K number of sections. Also, the second phase and size detector 4012 includes an L symbol delay 4012-1, an L symbol buffer 4012-2, a multiplier 4012-3, an accumulator 4012-4, and a squarer 4012-5. Herein, the second phase and size detector 4012 calculates the correlation value of the known data having a second L symbol length among the K number of sections. Finally, the $N^{th}$ phase and size detector 401K includes a (K−1)L symbol delay 401K-1, an L symbol buffer 401K-2, a multiplier 401K-3, an accumulator 401K-4, and a squarer 401K-5. Herein, the $N^{th}$ phase and size detector 401K calculates the correlation value of the known data having an $N^{th}$ L symbol length among the K number of sections.

Referring to FIG. 28, $\{P_0, P_1, \ldots, P_{KL-1}\}$ each being multiplied with the received signal in the multiplier represents the known data known by both the transmitting system and the receiving system (i.e., the reference known data generated from the receiving system). And, * represents a complex conjugate. For example, in the first phase and size detector 4011, the signal outputted from the 1/N decimator of the first partial correlator 3011, shown in FIG. 27, is temporarily stored in the L symbol buffer 4011-2 of the first phase and size detector 4011 and then inputted to the multiplier 4011-3. The multiplier 4011-3 multiplies the output of the L symbol buffer 4011-2 with the complex conjugate of the known data parts $P_0, P_1, \ldots, P_{KL-1}$, each having a first L symbol length among the known K number of sections. Then, the multiplied result is outputted to the accumulator 4011-4. During the L symbol period, the accumulator 4011-4 accumulates the output of the multiplier 4011-3 and, then, outputs the accumulated value to the squarer 4011-5 and the coarse frequency offset estimator 4030. The output of the accumulator 4011-4 is a correlation value having a phase and a size. Accordingly, the squarer 4011-5 calculates an absolute value of the output of the multiplier 4011-4 and squares the calculated absolute value, thereby obtaining the size of the correlation value. The obtained size is then inputted to the adder 4020.

The adder 4020 adds the output of the squarers corresponding to each size and phase detector 4011 to 401K. Then, the adder 4020 outputs the added result to the known data place detector and frequency offset decider 3020. Also, the coarse frequency offset estimator 4030 receives the output of the accumulator corresponding to each size and phase detector 4011 to 401K, so as to estimate the coarse frequency offset at each corresponding sampling phase. Thereafter, the coarse frequency offset estimator 4030 outputs the estimated offset value to the known data place detector and frequency offset decider 3020. When the K number of inputs that are outputted from the accumulator of each phase and size detector 4011 to 401K are each referred to as $\{Z_0, Z_1, \ldots, Z_{K-1}\}$, the output of the coarse frequency offset estimator 4030 may be obtained by using Equation 4 shown below.

$$\omega_0 = \frac{1}{L}\arg\left\{\sum_{n=1}^{K-1}\left(\frac{Z_n}{|Z_n|}\right)\left(\frac{Z_{n-1}}{|Z_{n-1}|}\right)^*\right\}$$ Equation 4

The known data place detector and frequency offset decider 3020 stores the output of the partial correlator corresponding to each sampling phase during an enhanced data group cycle or a pre-decided cycle. Then, among the stored correlation values, the known data place detector and frequency offset decider 3020 decides the place (or position) corresponding to the highest correlation value as the place for receiving the known data. Furthermore, the known data place detector and frequency offset decider 3020 decides the estimated value of the frequency offset taken (or estimated) at the point of the highest correlation value as the coarse frequency offset value of the receiving system. For example, if the output of the partial correlator corresponding to the second partial correlator 3012 is the highest value, the place corresponding to the highest value is decided as the known data place. Thereafter, the coarse frequency offset estimated by the second partial correlator 3012 is decided as the final coarse frequency offset, which is then outputted to the demodulator 902. Meanwhile, the DC remover 1070 removes a pilot tone signal (i.e., DC signal), which has been inserted by the transmitting system, from the matched-filtered signal. Thereafter, the DC remover 1070 outputs the processed signal to the phase compensator 1110.

Figure 29:
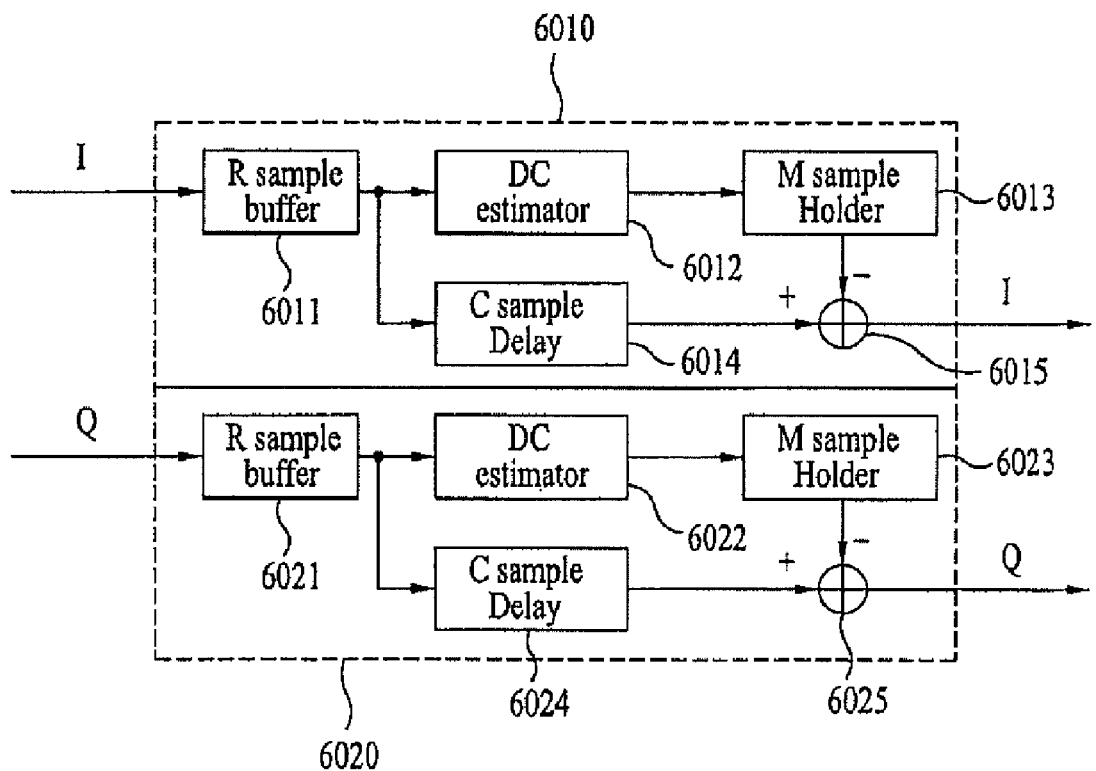
FIG. 29 illustrates a block diagram of a DC remover according to an embodiment of the present invention.

FIG. 29 illustrates a detailed block diagram of a DC remover according to an embodiment of the present invention. Herein, identical signal processing processes are performed on each of a real number element (or in-phase (I)) and an imaginary number element (or a quadrature (Q)) of the inputted complex signal, thereby estimating and removing the DC value of each element. In order to do so, the DC remover shown in FIG. 29 includes a first DC estimator and remover 6010 and a second DC estimator and remover 6020. Herein, the first DC estimator and remover 6010 includes an R sample buffer 6011, a DC estimator 6012, an M sample holder 6013, a C sample delay 6014, and a subtractor 6015. Herein, the first DC estimator and remover 6010 estimates and removes the DC of the real number element (i.e., an in-phase DC). Furthermore, the second DC estimator and remover 6020 includes an R sample buffer 6021, a DC estimator 6022, an M sample holder 6023, a C sample delay 6024, and a subtractor 6025. The second DC estimator and remover 6020 estimates and removes the DC of the imaginary number element (i.e., a quadrature DC). In the present invention, the first DC estimator and remover 6010 and the second DC estimator and remover 6020 may receive different input signals. However, each DC estimator and remover 6010 and 6020 has the same structure. Therefore, a detailed description of the first DC estimator and remover 6010 will be presented herein, and the second DC estimator and remover 6020 will be omitted for simplicity.

More specifically, the in-phase signal matched-filtered by the matched filter 1060 is inputted to the R sample buffer 6011 of the first DC estimator and remover 6010 within the DC remover 1070 and is then stored. The R sample buffer 6011 is a buffer having the length of R sample. Herein, the output of the R sample buffer 6011 is inputted to the DC estimator 6012 and the C sample delay 6014. The DC estimator 6012 uses the data having the length of R sample, which are outputted from the buffer 6011, so as to estimate the DC value by using Equation 5 shown below.

$$y[n] = \frac{1}{R}\sum_{k=0}^{R-1} x[k + M*n]$$ Equation 5

In the above-described Equation 5, x[n] represents the inputted sample data stored in the buffer 6011. And, y[n] indicates the DC estimation value. More specifically, the DC estimator 6012 accumulates R number of sample data stored in the buffer 6011 and estimates the DC value by dividing the accumulated value by R. At this point, the stored input sample data set is shifted as much as M sample. Herein, the DC estimation value is outputted once every M samples.

Figure 30:
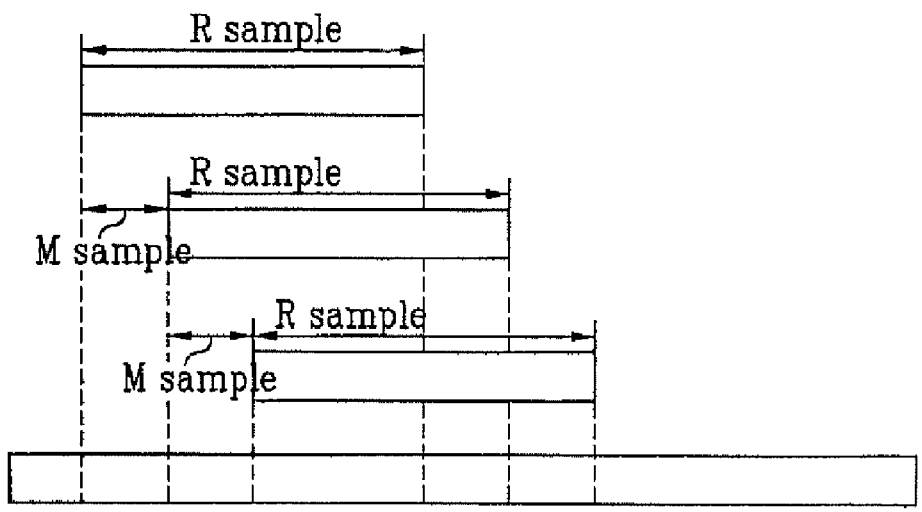
FIG. 30 illustrates an example of shifting sample data inputted to a DC estimator shown in FIG. 29.

FIG. 30 illustrates a shifting of the input sample data used for DC estimation. For example, when M is equal to 1 (i.e., M=1), the DC estimator 6012 estimates the DC value each time a sample is shifted to the buffer 6011. Accordingly, each estimated result is outputted for each sample. If M is equal to R (i.e., M=R), the DC estimator 6012 estimates the DC value each time R number of samples are shifted to the buffer 6011. Accordingly, each estimated result is outputted for each cycle of R samples. Therefore, in this case, the DC estimator 6012 corresponds to a DC estimator that operates in a block unit of R samples. Herein, any value within the range of 1 and R may correspond to the value M.

As described above, since the output of the DC estimator 6012 is outputted after each cycle of M samples, the M sample holder 6013 holds the DC value estimated from the DC estimator 6012 for a period of M samples. Then, the estimated DC value is outputted to the subtractor 6015. Also, the C sample delay 6014 delays the input sample data stored in the buffer 6011 by C samples, which are then outputted to the subtractor 6015. The subtractor 6015 subtracts the output of the M sample holder 6013 from the output of the C sample delay 6014. Thereafter, the subtractor 6011 outputs the signal having the in-phase DC removed.

Herein, the C sample delay 6014 decides which portion of the input sample data is to be compensated with the output of the DC estimator 6012. More specifically, the DC estimator and remover 6010 may be divided into a DC estimator 6012 for estimating the DC and the subtractor for compensating the input sample data within the estimated DC value. At this point, the C sample delay 6014 decides which portion of the input sample data is to be compensated with the estimated DC value. For example, when C is equal to 0 (i.e., C=0), the beginning of the R samples is compensated with the estimated DC value obtained by using R samples. Alternatively, when C is equal to R (i.e., C=R), the end of the R samples is compensated with the estimated DC value obtained by using R samples. Similarly, the data having the DC removed are inputted to the buffer 1111 and the frequency offset estimator 1112 of the phase compensator 1110.

Figure 31:
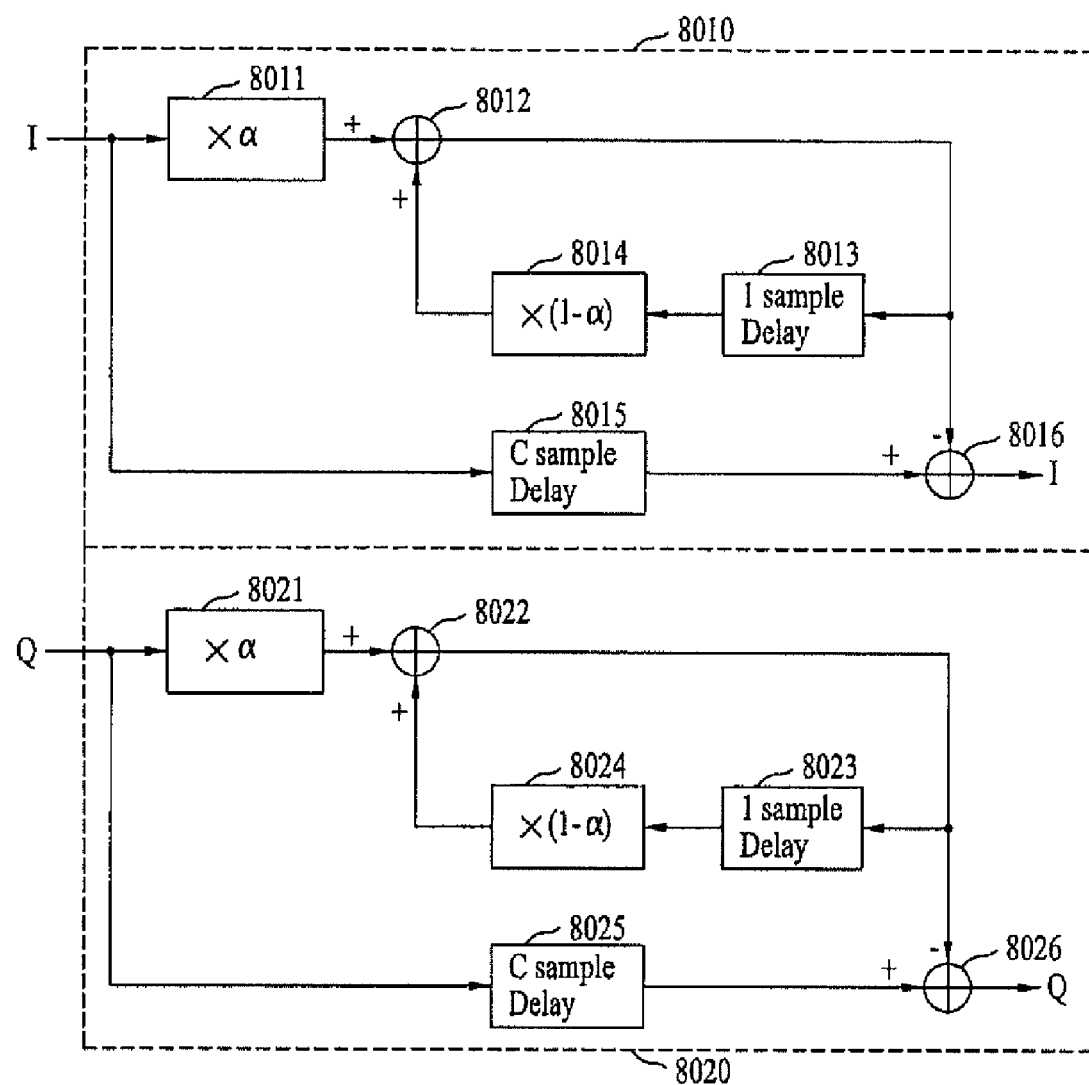
FIG. 31 illustrates a block diagram of a DC remover according to another embodiment of the present invention.

Meanwhile, FIG. 31 illustrates a detailed block diagram of a DC remover according to another embodiment of the present invention. Herein, identical signal processing processes are performed on each of a real number element (or in-phase (I)) and an imaginary number element (or a quadrature (Q)) of the inputted complex signal, thereby estimating and removing the DC value of each element. In order to do so, the DC remover shown in FIG. 31 includes a first DC estimator and remover 8010 and a second DC estimator and remover 8020. FIG. 31 corresponds to an infinite impulse response (IIR) structure.

Herein, the first DC estimator and remover 8010 includes a multiplier 8011, an adder 8012, an 1 sample delay 8013, a multiplier 8014, a C sample delay 8015, and a subtractor 8016. Also, the second DC estimator and remover 8020 includes a multiplier 8021, an adder 8022, an 1 sample delay 8023, a multiplier 8024, a C sample delay 8025, and a subtractor 8026. In the present invention, the first DC estimator and remover 8010 and the second DC estimator and remover 8020 may receive different input signals. However, each DC estimator and remover 8010 and 8020 has the same structure. Therefore, a detailed description of the first DC estimator and remover 8010 will be presented herein, and the second DC estimator and remover 8020 will be omitted for simplicity.

More specifically, the in-phase signal matched-filtered by the matched filter 1060 is inputted to the multiplier 8011 and the C sample delay 8015 of the first DC estimator and remover 8010 within the DC remover 1070. The multiplier Boll multiplies a pre-determined constant α to the in-phase signal that is being inputted. Then, the multiplier 8011 outputs the multiplied result to the adder 8012. The adder 8012 adds the output of the multiplier 8011 to the output of the multiplier 8014 that is being fed-back. Thereafter, the adder 8012 outputs the added result to the 1 sample delay 8013 and the subtractor 8016. More specifically, the output of the adder 8012 corresponds to the estimated in-phase DC value.

The 1 sample delay 8013 delays the estimated DC value by 1 sample and outputs the DC value delayed by 1 sample to the multiplier 8014. The multiplier 8014 multiplies a pre-determined constant (1−α) to the DC value delayed by 1 sample. Then, the multiplier 8014 feeds-back the multiplied result to the adder 8012. Subsequently, the C sample delay 8015 delays the in-phase sample data by C samples and, then, outputs the delayed in-phase sample data to the subtractor 8016. The subtractor 8016 subtracts the output of the adder 8012 from the output of the C sample delay 8015, thereby outputting the signal having the in-phase DC removed therefrom. Similarly, the data having the DC removed are inputted to the buffer 1111 and the frequency offset estimator 1112 of the phase compensator 1110.

The frequency offset estimator 1112 uses the known sequence position indicator outputted from the known data detector and initial frequency offset estimator 9041 in order to estimate the frequency offset from the known data sequence that is being inputted, the known data sequence having the DC removed by the DC remover 1070. Then, the frequency offset estimator 1112 outputs the estimated frequency offset to the holder 1113. Similarly, the frequency offset estimation value is obtained at each repetition cycle of the known data sequence.

Therefore, the holder 1113 holds the frequency offset estimation value during a cycle period of the known data sequence and then outputs the frequency offset estimation value to the NCO 1114. The NCO 1114 generates a complex signal corresponding to the frequency offset held by the holder 1113 and outputs the generated complex signal to the multiplier 1115. The multiplier 1115 multiplies the complex signal outputted from the NCO 1114 to the data being delayed by a set period of time in the buffer 1111, thereby compensating the phase change included in the delayed data. The data having the phase change compensated by the multiplier 1115 pass through the decimator 1500 so as to be inputted to the equalizer 903. At this point, since the frequency offset estimated by the frequency offset estimator 1112 of the phase compensator 1110 does not pass through the loop filter, the estimated frequency offset indicates the phase difference between the known data sequences. In other words, the estimated frequency offset indicates a phase offset.

As described above, when the demodulator 902 performs a demodulating process on the received data, the data being inputted to the equalizer 903 has the data structure shown in FIG. 6A. The equalizer 903 may perform channel equalization by using a plurality of methods. An example of estimating a channel impulse response (CIR) so as to perform channel equalization will be given in the description of the present invention. Most particularly, an example of estimating the CIR in accordance with each region within the data group, which is hierarchically divided and transmitted from the transmitting system, and applying each CIR differently will also be described herein. Furthermore, by using the known data, the place and contents of which is known in accordance with an agreement between the transmitting system and the receiving system, and the field synchronization data, so as to estimate the CIR, the present invention may be able to perform channel equalization with more stability.

Herein, the data group that is inputted for the equalization process is divided into regions A to C, as shown in FIG. 6A. More specifically, in the example of the present invention, each region A, B, and C are further divided into regions A1 to A5, regions B1 and B2, and regions C1 to C3, respectively. Referring to FIG. 6A, the CIR that is estimated from the field synchronization data in the data structure is referred to as CIR_FS. Alternatively, the CIRs that are estimated from each of the S known data sequences existing in region A are sequentially referred to as CIR_N0, CIR_N1, CIR_N2, CIR_N3, and CIR_N4.

As described above, the present invention uses the CIR estimated from the field synchronization data and the known data sequences in order to perform channel equalization on data within the data group. At this point, each of the estimated CIRs may be directly used in accordance with the characteristics of each region within the data group. Alternatively, a plurality of the estimated CIRs may also be either interpolated or extrapolated so as to create a new CIR, which is then used for the channel equalization process.

Herein, when a value F(A) of a function F(x) at a particular point A and a value F(B) of the function F(x) at another particular point B are known, interpolation refers to estimating a function value of a point within the section between points A and B. Linear interpolation corresponds to the simplest form among a wide range of interpolation operations. The linear interpolation described herein is merely exemplary among a wide range of possible interpolation methods. And, therefore, the present invention is not limited only to the examples set forth herein.

Alternatively, when a value F(A) of a function F(x) at a particular point A and a value F(B) of the function F(x) at another particular point B are known, extrapolation refers to estimating a function value of a point outside of the section between points A and B. Linear extrapolation is the simplest form among a wide range of extrapolation operations. Similarly, the linear extrapolation described herein is merely exemplary among a wide range of possible extrapolation methods. And, therefore, the present invention is not limited only to the examples set forth herein.

More specifically, in case of region C1, any one of the CIR_N4 estimated from a previous data group, the CIR_FS estimated from the current data group that is to be processed with channel equalization, and a new CIR generated by extrapolating the CIR_FS of the current data group and the CIR_N0 may be used to perform channel equalization. Alternatively, in case of region B1, a variety of methods may be applied as described in the case for region C1. For example, a new CIR created by linearly extrapolating the CIR_FS estimated from the current data group and the CIR_N0 may be used to perform channel equalization. Also, the CIR_FS estimated from the current data group may also be used to perform channel equalization. Finally, in case of region A1, a new CIR may be created by interpolating the CIR_FS estimated from the current data group and CIR_N0, which is then used to perform channel equalization. Furthermore, any one of the CIR_FS estimated from the current data group and CIR_N0 may be used to perform channel equalization.

In case of regions A2 to A5, CIR_N(i−1) estimated from the current data group and CIR_N(i) may be interpolated to create a new CIR and use the newly created CIR to perform channel equalization. Also, any one of the CIR_N(i−1) estimated from the current data group and the CIR_N(i) may be used to perform channel equalization. Alternatively, in case of regions B2, C2, and C3, CIR_N3 and CIR_N4 both estimated from the current data group may be extrapolated to create a new CIR, which is then used to perform the channel equalization process. Furthermore, the CIR_N4 estimated from the current data group may be used to perform the channel equalization process. Accordingly, an optimum performance may be obtained when performing channel equalization on the data inserted in the data group. The methods of obtaining the CIRs required for performing the channel equalization process in each region within the data group, as described above, are merely examples given to facilitate the understanding of the present invention. A wider range of methods may also be used herein. And, therefore, the present invention will not only be limited to the examples given in the description set forth herein.

Meanwhile, if the data being inputted to the block decoder 905 after being channel equalized from the equalizer 903 correspond to the mobile service data having additional encoding and trellis encoding performed thereon by the transmitting system, trellis decoding and additional decoding processes are performed on the inputted data as inverse processes of the transmitting system. Alternatively, if the data being inputted to the block decoder 905 correspond to the main service data having only trellis encoding performed thereon, and not the additional encoding, only the trellis decoding process is performed on the inputted data as the inverse process of the transmitting system. The data group decoded by the block decoder 905 is inputted to the data deformatter 906, and the main service data packet is inputted to the data deinterleaver 909.

More specifically, if the inputted data correspond to the main service data, the block decoder 905 performs Viterbi decoding on the inputted data so as to output a hard decision value or to perform a hard-decision on a soft decision value, thereby outputting the result. Meanwhile, if the inputted data correspond to the mobile service data, the block decoder 905 outputs a hard decision value or a soft decision value with respect to the inputted mobile service data. In other words, if the inputted data correspond to the mobile service data, the block decoder 905 performs a decoding process on the data encoded by the block processor and trellis encoding module of the transmitting system.

At this point, the RS frame encoder of the pre-processor included in the transmitting system may be viewed as an external code. And, the block processor and the trellis encoder may be viewed as an internal code. In order to maximize the performance of the external code when decoding such concatenated codes, the decoder of the internal code should output a soft decision value. Therefore, the block decoder 905 may output a hard decision value on the mobile service data.

However, when required, it may be more preferable for the block decoder 905 to output a soft decision value.

Meanwhile, the data deinterleaver 909, the RS decoder 910, and the derandomizer 911 are blocks required for receiving the main service data. Therefore, the above-mentioned blocks may not be required in the structure of a digital broadcast receiving system that only receives the mobile service data. The data deinterleaver 909 performs an inverse process of the data interleaver included in the transmitting system. In other words, the data deinterleaver 909 deinterleaves the main service data outputted from the block decoder 905 and outputs the deinterleaved main service data to the RS decoder 910. The RS decoder 910 performs a systematic RS decoding process on the deinterleaved data and outputs the processed data to the derandomizer 911. The derandomizer 911 receives the output of the RS decoder 910 and generates a pseudo random data byte identical to that of the randomizer included in the digital broadcast transmitting system, Thereafter, the derandomizer 911 performs a bitwise exclusive OR (XOR) operation on the generated pseudo random data byte, thereby inserting the MPEG synchronization bytes to the beginning of each packet so as to output the data in 188-byte main service data packet units.

Meanwhile, the data being outputted from the block decoder 905 to the data deformatter 906 are inputted in the form of a data group. At this point, the data deformatter 906 already knows the structure of the data that are to be inputted and is, therefore, capable of identifying the signaling information, which includes the system information, and the mobile service data from the data group. Thereafter, the data deformatter 906 outputs the identified signaling information to a block for system information and outputs the identified mobile service data to the RS frame decoder 907. At this point, the data deformatter 906 removes the known data, trellis initialization data, and MPEG header that were inserted in the main service data and data group. The data deformatter 906 also removes the RS parity that was added by the RS encoder/non-systematic RS encoder or the non-systematic RS encoder of the transmitting system. Thereafter, the processed data are outputted to the RS frame decoder 907. More specifically, the RS frame decoder 907 receives only the RS encoded and CRC encoded mobile service data that are transmitted from the data deformatter 906.

The RS frame encoder 907 performs an inverse process of the RS frame encoder included in the transmitting system so as to correct the error within the RS frame. Then, the RS frame decoder 907 adds the 1-byte MPEG synchronization service data packet, which had been removed during the RS frame encoding process, to the error-corrected mobile service data packet. Thereafter, the processed data packet is outputted to the derandomizer 908. The operation of the RS frame decoder 907 will be described in detail in a later process. The derandomizer 908 performs a derandomizing process, which corresponds to the inverse process of the randomizer included in the transmitting system, on the received mobile service data. Thereafter, the derandomized data are outputted, thereby obtaining the mobile service data transmitted from the transmitting system.

FIG. 32 illustrates a series of exemplary step of an error correction decoding process of the RS frame decoder 907 according to the present invention. More specifically, the RS frame decoder 907 groups mobile service data bytes received from the data deformatter 906 so as to configure an RS frame. The mobile service data correspond to data RS encoded and CRC encoded from the transmitting system. FIG. 32(*a*) illustrates an example of configuring the RS frame. More specifically, the transmitting system divided the RS frame having the size of (N+2)*235 to 30*235 byte blocks. When it is assumed that each of the divided mobile service data byte blocks is inserted in each data group and then transmitted, the receiving system also groups the 30*235 mobile service data byte blocks respectively inserted in each data group, thereby configuring an RS frame having the size of (N+2)*235. For example, when it is assumed that an RS frame is divided into 18 30*235 byte blocks and transmitted from a burst section, the receiving system also groups the mobile service data bytes of 18 data groups within the corresponding burst section, so as to configure the RS frame. Furthermore, when it is assumed that N is equal to 538 (i.e., N=538), the RS frame decoder 907 may group the mobile service data bytes within the 18 data groups included in a burst so as to configure a RS frame having the size of 540*235 bytes.

Herein, when it is assumed that the block decoder 905 outputs a soft decision value for the decoding result, the RS frame decoder 907 may decide the '0' and '1' of the corresponding bit by using the codes of the soft decision value. 8 bits that are each decided as described above are grouped to create 1 data byte. If the above-described process is performed on all soft decision values of the 18 data groups included in a single burst, the RS frame having the size of 540*235 bytes may be configured. Additionally, the present invention uses the soft decision value not only to configure the RS frame but also to configure a reliability map. Herein, the reliability map indicates the reliability of the corresponding data byte, which is configured by grouping 8 bits, the 8 bits being decided by the codes of the soft decision value.

For example, when the absolute value of the soft decision value exceeds a pre-determined threshold value, the value of the corresponding bit, which is decided by the code of the corresponding soft decision value, is determined to be reliable. Conversely, when the absolute value of the soft decision value does not exceed the pre-determined threshold value, the value of the corresponding bit is determined to be unreliable. Thereafter, if even a single bit among the 8 bits, which are decided by the codes of the soft decision value and group to configure 1 data byte, is determined to be unreliable, the corresponding data byte is marked on the reliability map as an unreliable data byte.

Herein, determining the reliability of 1 data byte is only exemplary. More specifically, when a plurality of data bytes (e.g., at least 4 data bytes) are determined to be unreliable, the corresponding data bytes may also be marked as unreliable data bytes within the reliability map. Conversely, when all of the data bits within the 1 data byte are determined to be reliable (i.e., when the absolute value of the soft decision values of all 8 bits included in the 1 data byte exceed the predetermined threshold value), the corresponding data byte is marked to be a reliable data byte on the reliability map. Similarly, when a plurality of data bytes (e.g., at least 4 data bytes) are determined to be reliable, the corresponding data bytes may also be marked as reliable data bytes within the reliability map. The numbers proposed in the above-described example are merely exemplary and, therefore, do not limit the scope or spirit of the present invention.

The process of configuring the RS frame and the process of configuring the reliability map both using the soft decision value may be performed at the same time. Herein, the reliability information within the reliability map is in a one-to-one correspondence with each byte within the RS frame. For example, if a RS frame has the size of 540*235 bytes, the reliability map is also configured to have the size of 540*235 bytes. FIG. 32(*a'*) illustrates the process steps of configuring the reliability map according to the present invention. Meanwhile, if a RS frame is configured to have the size of (N+2)*235 bytes, the RS frame decoder 907 performs a CRC syndrome checking process on the corresponding RS frame, thereby verifying whether any error has occurred in each row. Subsequently, as shown in FIG. 32(*b*), a 2-byte checksum is removed to configure an RS frame having the size of N*235 bytes. Herein, the presence (or existence) of an error is indicated on an error flag corresponding to each row. Similarly, since the portion of the reliability map corresponding to the CRC checksum has hardly any applicability, this portion is removed so that only N*235 number of the reliability information bytes remain, as shown in FIG. 32(*b'*).

After performing the CRC syndrome checking process, the RS frame decoder 907 performs RS decoding in a column direction. Herein, a RS erasure correction process may be performed in accordance with the number of CRC error flags. More specifically, as shown in FIG. 32(*c*), the CRC error flag corresponding to each row within the RS frame is verified. Thereafter, the RS frame decoder 907 determines whether the number of rows having a CRC error occurring therein is equal to or smaller than the maximum number of errors on which the RS erasure correction may be performed, when performing the RS decoding process in a column direction. The maximum number of errors corresponds to a number of parity bytes inserted when performing the RS encoding process. In the embodiment of the present invention, it is assumed that 48 parity bytes have been added to each column.

If the number of rows having the CRC errors occurring therein is smaller than or equal to the maximum number of errors (i.e., 48 errors according to this embodiment) that can be corrected by the RS erasure decoding process, a (235,187)-RS erasure decoding process is performed in a column direction on the RS frame having 235 N-byte rows, as shown in FIG. 32(*d*). Thereafter, as shown in FIG. 32(*f*), the 48-byte parity data that have been added at the end of each column are removed. Conversely, however, if the number of rows having the CRC errors occurring therein is greater than the maximum number of errors (i.e., 48 errors) that can be corrected by the RS erasure decoding process, the RS erasure decoding process cannot be performed. In this case, the error may be corrected by performing a general RS decoding process. In addition, the reliability map, which has been created based upon the soft decision value along with the RS frame, may be used to further enhance the error correction ability (or performance) of the present invention.

More specifically, the RS frame decoder 907 compares the absolute value of the soft decision value of the block decoder 905 with the pre-determined threshold value, so as to determine the reliability of the bit value decided by the code of the corresponding soft decision value. Also, 8 bits, each being determined by the code of the soft decision value, are grouped to form 1 data byte. Accordingly, the reliability information on this 1 data byte is indicated on the reliability map. Therefore, as shown in FIG. 32(*e*), even though a particular row is determined to have an error occurring therein based upon a CRC syndrome checking process on the particular row, the present invention does not assume that all bytes included in the row have errors occurring therein. The present invention refers to the reliability information of the reliability map and sets only the bytes that have been determined to be unreliable as erroneous bytes. In other words, with disregard to whether or not a CRC error exists within the corresponding row, only the bytes that are determined to be unreliable based upon the reliability map are set as erasure points.

According to another method, when it is determined that CRC errors are included in the corresponding row, based upon the result of the CRC syndrome checking result, only the bytes that are determined by the reliability map to be unreliable are set as errors. More specifically, only the bytes corresponding to the row that is determined to have errors included therein and being determined to be unreliable based upon the reliability information, are set as the erasure points. Thereafter, if the number of error points for each column is smaller than or equal to the maximum number of errors (i.e., 48 errors) that can be corrected by the RS erasure decoding process, an RS erasure decoding process is performed on the corresponding column. Conversely, if the number of error points for each column is greater than the maximum number of errors (i.e., 48 errors) that can be corrected by the RS erasure decoding process, a general decoding process is performed on the corresponding column.

More specifically, if the number of rows having CRC errors included therein is greater than the maximum number of errors (i.e., 48 errors) that can be corrected by the RS erasure decoding process, either an RS erasure decoding process or a general RS decoding process is performed on a column that is decided based upon the reliability information of the reliability map, in accordance with the number of erasure points within the corresponding column. For example, it is assumed that the number of rows having CRC errors included therein within the RS frame is greater than 48. And, it is also assumed that the number of erasure points decided based upon the reliability information of the reliability map is indicated as 40 erasure points in the first column and as 50 erasure points in the second column. In this case, a (235,187)-RS erasure decoding process is performed on the first column. Alternatively, a (235,187)-RS decoding process is performed on the second column. When error correction decoding is performed on all column directions within the RS frame by using the above-described process, the 48-byte parity data which were added at the end of each column are removed, as shown in FIG. 32(*f*).

As described above, even though the total number of CRC errors corresponding to each row within the RS frame is greater than the maximum number of errors that can be corrected by the RS erasure decoding process, when the number of bytes determined to have a low reliability level, based upon the reliability information on the reliability map within a particular column, while performing error correction decoding on the particular column. Herein, the difference between the general RS decoding process and the RS erasure decoding process is the number of errors that can be corrected. More specifically, when performing the general RS decoding process, the number of errors corresponding to half of the number of parity bytes (i.e., (number of parity bytes)/2) that are inserted during the RS encoding process may be error corrected (e.g., 24 errors may be corrected). Alternatively, when performing the RS erasure decoding process, the number of errors corresponding to the number of parity bytes that are inserted during the RS encoding process may be error corrected (e.g., 48 errors may be corrected).

After performing the error correction decoding process, as described above, a RS frame configured of 187 N-byte rows (or packets) may be obtained, as shown in FIG. 32(*f*). Furthermore, the RS frame having the size of N*187 bytes is sequentially outputted in N number of 187-byte units. Herein, as shown in FIG. 32(*g*), the 1-byte MPEG synchronization byte that was removed by the transmitting system is added at the end of each 187-byte packet, thereby outputting 188-byte mobile service data packets.

As described above, the digital broadcasting system and the data processing method according to the present invention have the following advantages. More specifically, the digital broadcasting receiving system and method according to the present invention is highly protected against (or resistant to)

any error that may occur when transmitting mobile service data through a channel. And, the present invention is also highly compatible to the conventional receiving system. Moreover, the present invention may also receive the mobile service data without any error even in channels having severe ghost effect and noise.

Additionally, by inserting known data in a particular position (or place) within a data region and transmitting the processed data, the receiving performance of the receiving system may be enhanced even in a channel environment that is liable to frequent changes. Also, by multiplexing mobile service data with main service data into a burst structure, the power consumption of the receiving system may be reduced. Further, by having the transmitting system periodically or non-periodically transmit known data having a pattern pre-decided in accordance with an agreement between the transmitting system and the receiving system, and by having the receiving system use the known data for performing carrier recovery and timing recovery, and for compensating a phase change between repeating known data sequences, the receiving performance of the receiving system may be enhanced in a situation undergoing severe and frequent channel changes. Finally, the present invention is even more effective when applied to mobile and portable receivers, which are also liable to a frequent change in channel and which require protection (or resistance) against intense noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A digital broadcast receiving system, comprising:
    a tuner receiving a DTV signal comprising main service data and mobile service data multiplexed with the main service data, wherein the DTV signal results from generating a second data by de-interleaving a first data group by a DTV transmitter, the first data group including a plurality of segments in a plurality of regions, an Nth segment in a first region having place holders for main service data and K mobile service data bytes, an (N+1)th segment in the first region having place holders for main service data and L mobile service data bytes, an (N+2)th segment in the first region having place holders for main service data and M mobile service data bytes, an Oth segment in a second region having X mobile service data bytes, an (O+1)th segment in the second region having Y mobile service data bytes, and an (O+2)th segment in the second region having Z mobile service data bytes, wherein the variables K, L, M, N , O, X, Y, Z are integers greater than 0, K<L<M, X=Y=Z, and N<O, each packet in the second data group having a length of 207 bytes;
    a known data detector detecting known data information inserted and transmitted from a digital broadcast transmitting system and using the known data information to estimate an initial frequency offset;
    a carrier recovery unit obtaining initial synchronization by using the initial frequency offset, and detecting a frequency offset from the received signal by using the known data information so as to perform carrier recovery; and
    a timing recovery unit detecting timing error information from the received signal by using the known data information so as to perform timing recovery.

2. The digital broadcast receiving system of claim 1, further comprising:
    a phase compensator using the known data information to estimate a phase offset from the received data processed with the timing recovery unit and the carrier recovery unit, thereby compensating the phase offset from the received data.

3. The digital broadcast receiving system of claim 1, wherein the carrier recovery unit comprises:
    a frequency offset estimator estimating a frequency offset from the received data based upon the known data information processed with the timing recovering unit and the carrier recovery unit;
    a loop filter low pass filtering the frequency offset estimated by the frequency offset estimator;
    an adder adding the initial frequency offset outputted from the known data detector and initial frequency offset estimator to the frequency offset outputted from the loop filter, thereby outputting the added result; and
    a numerically controlled oscillator (NCO) generating a complex signal corresponding to a frequency offset outputted from the adder, thereby outputting the generated complex signal.

4. The digital broadcast receiving system of claim 3, wherein the frequency offset estimator comprises:
    a first P symbol buffer temporarily storing an input symbol;
    a Q symbol delay delaying the input symbol by Q number of symbols, wherein the variables P and Q are integers greater than 0;
    a second P symbol buffer temporarily storing an output of the Q symbol delay;
    a conjugator performing complex conjugate multiplication of data outputted from the first P symbol buffer and the second P symbol buffer;
    a phase detector accumulating the output of the conjugator for a period of P number of symbols so as to extract phase information, and outputting the extracted phase information as the fine frequency offset; and
    a frequency offset output dividing the phase information by Q and outputting the divided result as the estimated frequency offset.

5. The digital broadcast receiving system of claim 4, wherein the frequency offset estimator further comprises:
    a multiplexer selecting and outputting one of the frequency offset of the frequency offset output and a constant '0' based upon the known data information.

6. The digital broadcast receiving system of claim 4, wherein values P and Q are diversely decided, and wherein, when a plurality of known data sequences having identical patterns is repeated in one known data section, P corresponds to B/2 and Q corresponds to B/2, wherein B represents a number of known data symbols.

7. The digital broadcast receiving system of claim 3, further comprising:
    a phase splitter separating pass band data being received and digitalized into a real number element (or in-phase data) and an imaginary number element (or quadrature data);
    a first multiplier multiplying the in-phase data and quadrature data of the phase splitter with a complex signal corresponding to a pre-determined constant, thereby changing the in-phase data and quadrature data to baseband data;
    a resampler multiplying the baseband data outputted from the first multiplier with a complex signal corresponding to a timing error information outputted from the timing recovery unit, thereby interpolating the baseband data;

a second multiplier performing a complex multiplication on the output of the resampler and the output of the carrier recovery unit, thereby compensating a frequency offset included in the output data of the resampler;

a matched filter matched-filtering the output data of the second multiplier; and a DC offset remover receiving data prior to or after being processed with matched-filtering so as to estimate a DC offset, thereby removing the DC offset included in the processed data.

8. The digital broadcast receiving system of claim 7, wherein the DC offset remover comprises:

a first DC offset estimator and remover estimating a DC offset from in-phase data of the matched-filtered data, and removing the DC offset included in the in-phase data; and a second DC offset estimator and remover estimating a DC offset from quadrature data of the matched-filtered data, and removing the DC included in the quadrature data.

9. The digital broadcast receiving system of claim 1, wherein the known data detector comprises:

a plurality of partial correlators decimating inputted over-sampled data at a rate of 1/P for each sampling phase, the data being oversampled to P times, and performing partial correlation in each partial correlator, wherein the variable P is an integer greater than 0;

a known data place detector and frequency offset decider storing each correlation value of the plurality of partial correlators during a decided period, determining a place corresponding to the highest correlation value as a receiving place of the known data, and deciding an estimated value of a frequency offset corresponding to highest correlation value point as a coarse frequency offset value;

a frequency offset estimator extracting known data from the received data based upon the known data information so as to compensate coarse frequency offset, and estimating fine frequency offset; and an adder adding the coarse frequency offset outputted from the known data place detector and the fine frequency offset estimated by the frequency offset estimator, thereby outputting the added result as an initial frequency offset value.

10. The digital broadcast receiving system of claim 9, wherein each partial correlator divides the known data, which are already known in accordance with an agreement between a transmitting system and a receiving system, to Q number of parts each having an R symbol length, thereby correlating each divided part with the corresponding part of the received data, thereby estimating size information of a correlation value of a corresponding sampling phase and the coarse frequency offset value from the correlation result, wherein the variables Q and R are integers greater than 0.

11. A digital broadcast transmitter, comprising:

a pre-processor configured to pre-process mobile service data, the mobile service data being included in a first data group, wherein the pre-processor further configured to de-interleave the first data group to output a second data group, the first data group including a plurality of segments in a plurality of regions, an Nth segment in a first region having place holders for main service data and K mobile service data bytes, an (N+1)th segment in the first region having place holders for main service data and L mobile service data bytes, an (N+2)th segment in the first region having place holders for main service data and M mobile service data bytes, an Oth segment in a second region having X mobile service data bytes, an (O+1)th segment in the second region having Y mobile service data bytes, and an (O+2)th segment in the second region having Z mobile service data bytes, wherein the variables K, L, M, N , O, X, Y, Z are integers greater than 0, K<L<M, X=Y=Z, and N<O, each packet in the second data group having a length of 207 bytes; and a multiplexer configured to multiplex packets comprising the mobile service data with packets comprising the main service data.

12. A digital broadcast receiver, comprising:

a tuner receiving a DTV signal comprising main service data and mobile service data multiplexed with the main service data, wherein the DTV signal results from generating a second data group by de-interleaving a first data group by a DTV transmitter, the first data group including a plurality of segments in a plurality of regions, an Nth segment in a first region having place holders for main service data and K mobile service data bytes, an (N+1)th segment in the first region having place holders for main service data and L mobile service data bytes, an (N+2)th segment in the first region having place holders for main service data and M mobile service data bytes, an Oth segment in a second region having X mobile service data bytes, an (O+1)th segment in the second region having Y mobile service data bytes, and an (O+2)th segment in the second region having Z mobile service data bytes, wherein the variables K, L, M, N , O, X, Y, Z are integers greater than 0, K<L<M, X=Y=Z, and N<O, each packet in the second data group having a length of 207 bytes;

a demodulator configured to demodulate the DTV signal; and a decoder configured to decode the demodulated DTV signal.

13. A method of processing a DTV signal in a digital broadcast transmitter, comprising:

pre-processing mobile service data, the mobile service data being included in a first data group, wherein a second data group is generated from de-indeterleaving the first data group, the first data group including a plurality of segments in a plurality of regions, an Nth segment in a first region having place holders for main service data and K mobile service data bytes, an (N+1)th segment in the first region having place holders for main service data and L mobile service data bytes, an (N+2)th segment in the first region having place holders for main service data and M mobile service data bytes, an Oth segment in a second region having X mobile service data bytes, an (O+1)th segment in the second region having Y mobile service data bytes, and an (O+2)th segment in the second region having Z mobile service data bytes, wherein the variables K, L, M, N , O, X, Y, Z are integers greater than 0, K<L<M, X=Y=Z, and N<O, each packet in the second data group having a length of 207 bytes; and multiplexing packets comprising the mobile service data with packets comprising the main service data.

14. A method of processing a DTV signal in a digital broadcast receiver, comprising:

receiving a DTV signal comprising main service data and mobile service data multiplexed with the main service data, wherein the DTV signal results from generating a second data group by de-interleaving a first data group by a DTV transmitter, the first data group including a plurality of segments in a plurality of regions, an Nth segment in a first region having place holders for main service data and K mobile service data bytes, an (N+1)th segment in the first region having place holders for main service data and L mobile service data bytes, an (N+2)th segment in the first region having place holders for main service data and M mobile service data bytes, an Oth segment in a second region having X mobile service data bytes, an (O+1)th segment in the second region having Y mobile service data bytes, and an (O+2)th segment in the second region having Z mobile service data bytes, wherein the variables K, L, M, N , O, X, Y, Z are integers greater than 0, K<L<M, X=Y=Z, and N<O, each packet in the second data group having a length of 207 bytes;

demodulating the DTV signal; and decoding the demodulated DTV signal.

* * * * *